(12) United States Patent
Reardon et al.

(10) Patent No.: US 7,138,016 B2
(45) Date of Patent: *Nov. 21, 2006

(54) SEMICONDUCTOR PROCESSING APPARATUS

(75) Inventors: Timothy J. Reardon, Walla Walla, WA (US); Thomas H. Oberlitner, Kalispell, MT (US); Craig P. Meuchel, Kalispell, MT (US); Aleksander Owczarz, San Jose, CA (US); Raymon F. Thompson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 727 days.

This patent is subject to a terminal disclaimer.

(21) Appl. No.: 09/893,315

(22) Filed: Jun. 26, 2001

(65) Prior Publication Data

US 2002/0038629 A1  Apr. 4, 2002

Related U.S. Application Data

(60) Continuation of application No. 09/575,965, filed on May 23, 2000, now Pat. No. 6,375,741, which is a continuation of application No. 08/883,393, filed on Jun. 26, 1997, now Pat. No. 6,066,575, which is a division of application No. 08/422,485, filed on Apr. 12, 1995, now Pat. No. 5,658,387, which is a continuation-in-part of application No. 07/855,767, filed on Mar. 18, 1992, now Pat. No. 5,431,421, which is a continuation-in-part of application No. 07/665,942, filed on Mar. 6, 1991, now Pat. No. 5,235,995, which is a continuation-in-part of application No. 07/526,243, filed on May 18, 1990, now Pat. No. 5,168,887.

(51) Int. Cl.
*B05C 11/00* (2006.01)
*B05B 12/00* (2006.01)
*B05B 15/00* (2006.01)

(52) U.S. Cl. ............ 118/313; 118/300; 118/315
(58) Field of Classification Search ........ 118/313, 118/300, 315, 52, 302, 323, 21, 683, 667, 118/320; 427/240, 421, 423, 425, 72, 96, 427/372.2; 438/760, 758, 762; 134/33, 134/149, 153, 157, 902, 182, 200, 183

See application file for complete search history.

(56) References Cited

U.S. PATENT DOCUMENTS 2,774,364 A  12/1956  Brobeil (Continued)

FOREIGN PATENT DOCUMENTS

EP  0184279  6/1986

(Continued)

OTHER PUBLICATIONS

Patton, Evan E., "Automated Gold Plate-Up Bath Scope Document and Machine Specifications," Tektronix, Aug. 4, 1989; pp. 1-13.

(Continued)

*Primary Examiner*—George Koch
(74) *Attorney, Agent, or Firm*—Perkins Coie LLP

(57) ABSTRACT

A semiconductor processor for spray coating wafers or other semiconductor articles. The processor has a compartment in which are mounted a wafer transfer, coating station and thermal treatment station. The coating station has a spray processing vessel in which a movable spray-head and rotatable wafer holder. The spray station has coating viscosity control features. An ultrasonic resonating spray-head is precisely supplied with coating from a metering pump. The heat treatment station heat cures the coating and then cools the wafer. The system allows coatings to be applied in relatively uniform conformational layers upon irregular surfaces.

109 Claims, 29 Drawing Sheets

U.S. PATENT DOCUMENTS

| | | |
|---|---|---|
| 3,107,034 A | 10/1963 | Dunnous |
| 3,148,085 A | 9/1964 | Wiegmann |
| 3,313,266 A | 4/1967 | Kelson |
| 3,326,717 A | 6/1967 | Gregor et al. |
| 3,339,297 A | 9/1967 | Stinn et al. |
| 3,489,608 A | 1/1970 | Jacobs et al. |
| 3,585,668 A | 6/1971 | Jaccodine et al. |
| 3,601,627 A | 8/1971 | Booher |
| 3,641,973 A | 2/1972 | Shrader |
| 3,727,620 A | 4/1973 | Orr |
| 3,770,598 A | 11/1973 | Creutz |
| 3,773,578 A | 11/1973 | Glendinning et al. |
| 3,798,056 A | 3/1974 | Okinaka et al. |
| 3,950,184 A | 4/1976 | Adams et al. |
| 3,962,047 A | 6/1976 | Wagner |
| 3,978,578 A | 9/1976 | Murphy |
| 4,027,686 A | 6/1977 | Shortes et al. |
| 4,056,462 A | 11/1977 | Li et al. |
| 4,065,692 A | 12/1977 | Osterhout |
| 4,078,935 A | 3/1978 | Nakagiri et al. |
| 4,085,560 A | 4/1978 | McClosky |
| 4,092,176 A | 5/1978 | Kozai et al. |
| 4,094,884 A | 6/1978 | Kelly |
| 4,110,176 A | 8/1978 | Creutz et al. |
| 4,113,492 A | 9/1978 | Sato et al. |
| 4,118,303 A | 10/1978 | Gibbs |
| 4,127,362 A | 11/1978 | Fladby |
| 4,137,867 A | 2/1979 | Aigo |
| 4,139,333 A | 2/1979 | Sipos |
| 4,159,917 A | 7/1979 | Gluck |
| 4,161,356 A | 7/1979 | Giffin et al. |
| 4,168,886 A | 9/1979 | Grigaliunas |
| 4,168,887 A | 9/1979 | Yevick |
| 4,170,959 A | 10/1979 | Aigo |
| 4,183,508 A | 1/1980 | Michelet et al. |
| 4,192,087 A | 3/1980 | Salomon |
| 4,222,345 A | 9/1980 | Bergfelt et al. |
| 4,224,503 A | 9/1980 | Gijzel et al. |
| 4,226,208 A | 10/1980 | Nishida et al. |
| 4,232,328 A | 11/1980 | Hartman et al. |
| 4,246,088 A | 1/1981 | Murphy et al. |
| 4,252,137 A | 2/1981 | Cohen |
| 4,259,166 A | 3/1981 | Whitehurst |
| 4,264,374 A | 4/1981 | Beyer et al. |
| 4,267,212 A | 5/1981 | Sakawaki |
| 4,270,248 A | 6/1981 | Akashi |
| 4,280,882 A | 7/1981 | Hovey |
| 4,282,825 A * | 8/1981 | Nagatomo et al. ............ 118/58 |
| 4,290,384 A | 9/1981 | Ausschnitt et al. |
| 4,304,641 A | 12/1981 | Grandia et al. |
| 4,313,266 A | 2/1982 | Tam |
| 4,315,059 A | 2/1982 | Raistrick et al. |
| 4,336,114 A | 6/1982 | Mayer et al. |
| 4,339,297 A | 7/1982 | Aigo |
| 4,339,313 A | 7/1982 | Rechlicz |
| 4,339,319 A | 7/1982 | Aigo |
| 4,341,613 A | 7/1982 | Prusak et al. |
| 4,344,743 A | 8/1982 | Bessman et al. |
| 4,351,266 A | 9/1982 | Ando et al. |
| 4,373,988 A | 2/1983 | Bauser et al. |
| 4,376,685 A | 3/1983 | Watson |
| 4,378,511 A | 3/1983 | Simovits, Jr. |
| 4,403,617 A | 9/1983 | Tretinyak |
| 4,405,416 A | 9/1983 | Raistrick et al. |
| 4,416,213 A | 11/1983 | Sakiya |
| 4,428,815 A | 1/1984 | Powell et al. |
| 4,429,912 A | 2/1984 | Smith, Jr. |
| 4,429,983 A | 2/1984 | Cortellino et al. |
| 4,435,266 A | 3/1984 | Johnston |
| 4,437,812 A | 3/1984 | Abu-Shumays et al. |
| 4,457,259 A | 7/1984 | Samuels |
| 4,457,419 A | 7/1984 | Ogami et al. |
| 4,466,864 A | 8/1984 | Bacon et al. |
| 4,469,566 A | 9/1984 | Wray |
| 4,475,665 A | 10/1984 | Norton |
| 4,483,665 A | 11/1984 | Hauser |
| 4,489,740 A | 12/1984 | Rattan et al. |
| 4,510,176 A | 4/1985 | Cuthbert et al. |
| 4,514,266 A | 4/1985 | Cole et al. |
| 4,518,678 A | 5/1985 | Allen |
| 4,519,846 A | 5/1985 | Aigo |
| 4,534,832 A | 8/1985 | Doiron, Jr. |
| 4,542,038 A | 9/1985 | Odaka et al. |
| 4,565,607 A | 1/1986 | Hanak et al. |
| 4,580,699 A | 4/1986 | Black et al. |
| 4,588,185 A | 5/1986 | Shoda et al. |
| 4,590,094 A * | 5/1986 | Ringer, Jr. .................. 438/780 |
| 4,597,836 A | 7/1986 | Schaer et al. |
| 4,601,627 A | 7/1986 | Oka et al. |
| 4,605,479 A | 8/1986 | Faith, Jr. |
| 4,624,749 A | 11/1986 | Black et al. |
| 4,651,440 A * | 3/1987 | Karl .............................. 34/58 |
| 4,668,334 A | 5/1987 | Doornveld |
| 4,675,096 A | 6/1987 | Tateishi et al. |
| 4,687,542 A | 8/1987 | Davis et al. |
| 4,688,918 A | 8/1987 | Suzuki et al. |
| 4,693,777 A | 9/1987 | Hazano et al. |
| 4,693,805 A | 9/1987 | Quazi |
| 4,696,729 A | 9/1987 | Santini |
| 4,709,858 A | 12/1987 | Stern et al. |
| 4,724,317 A | 2/1988 | Brown et al. |
| 4,732,785 A | 3/1988 | Brewer |
| 4,736,758 A | 4/1988 | Kusuhara |
| 4,745,422 A | 5/1988 | Matsuoka et al. |
| 4,749,440 A | 6/1988 | Blackwood et al. |
| 4,750,505 A | 6/1988 | Inuta et al. |
| 4,778,559 A | 10/1988 | McNeilly |
| 4,788,994 A | 12/1988 | Shinbara |
| 4,793,282 A | 12/1988 | Greenberg et al. |
| 4,797,316 A | 1/1989 | Hecq et al. |
| 4,804,560 A | 2/1989 | Shioya et al. |
| 4,827,867 A | 5/1989 | Takei et al. |
| 4,828,654 A | 5/1989 | Reed |
| 4,830,882 A | 5/1989 | Ichinose et al. |
| 4,832,580 A | 5/1989 | Tsuyoshi et al. |
| 4,838,978 A | 6/1989 | Sekine et al. |
| 4,838,979 A | 6/1989 | Nishida et al. |
| 4,856,456 A | 8/1989 | Hillman et al. |
| 4,856,641 A | 8/1989 | Matsumura et al. |
| 4,857,142 A | 8/1989 | Syverson |
| 4,861,452 A | 8/1989 | Stierman et al. |
| 4,861,563 A | 8/1989 | Shekerjian et al. |
| 4,863,066 A | 9/1989 | Uffenheimer et al. |
| 4,865,641 A | 9/1989 | Sasse et al. |
| 4,871,417 A | 10/1989 | Nishizawa et al. |
| 4,875,824 A | 10/1989 | Moe et al. |
| 4,879,007 A | 11/1989 | Wong |
| 4,885,047 A | 12/1989 | Ury et al. |
| 4,895,099 A | 1/1990 | D'Amato |
| 4,900,395 A | 2/1990 | Syverson et al. |
| 4,906,346 A | 3/1990 | Hadersbeck et al. |
| 4,923,054 A | 5/1990 | Ohtani et al. |
| 4,924,800 A | 5/1990 | Tanaka |
| 4,924,890 A | 5/1990 | Giles et al. |
| 4,931,149 A | 6/1990 | Stierman et al. |
| 4,932,353 A | 6/1990 | Kawata et al. |
| 4,936,940 A | 6/1990 | Kawasumi et al. |
| 4,938,691 A | 7/1990 | Ohkase et al. |
| 4,944,837 A | 7/1990 | Nishikawa et al. |
| 4,960,406 A | 10/1990 | Gorodissky et al. |
| 4,977,688 A | 12/1990 | Roberson, Jr. et al. |
| 4,987,854 A | 1/1991 | Hall |
| 4,996,080 A | 2/1991 | Daraktchiev |
| 5,000,827 A | 3/1991 | Schuster et al. |

| | | |
|---|---|---|
| 5,002,008 A | 3/1991 | Ushijima et al. |
| 5,024,746 A | 6/1991 | Stierman et al. |
| 5,039,381 A | 8/1991 | Mullarkey |
| 5,055,425 A | 10/1991 | Leibovitz et al. |
| 5,056,462 A | 10/1991 | Perkins et al. |
| 5,065,692 A | 11/1991 | Hollesen et al. |
| 5,069,760 A | 12/1991 | Tsukamoto et al. |
| 5,078,852 A | 1/1992 | Yee et al. |
| 5,085,560 A | 2/1992 | Thompson et al. |
| 5,092,975 A | 3/1992 | Yamamura et al. |
| 5,094,884 A | 3/1992 | Hillman et al. |
| 5,096,550 A | 3/1992 | Mayer et al. |
| 5,100,502 A | 3/1992 | Murdoch et al. |
| 5,100,516 A | 3/1992 | Nishimura et al. |
| 5,127,362 A | 7/1992 | Iwatsu et al. |
| 5,155,336 A | 10/1992 | Gronet et al. |
| 5,156,174 A * | 10/1992 | Thompson et al. ......... 134/153 |
| 5,158,100 A | 10/1992 | Tanaka et al. |
| 5,162,260 A | 11/1992 | Leibovitz et al. |
| 5,168,886 A | 12/1992 | Thompson et al. |
| 5,168,887 A | 12/1992 | Thompson et al. |
| 5,169,408 A | 12/1992 | Biggerstaff et al. |
| 5,183,508 A | 2/1993 | Cholinski |
| 5,192,087 A | 3/1993 | Kawashima et al. |
| 5,222,310 A | 6/1993 | Thompson et al. |
| 5,224,503 A | 7/1993 | Thompson et al. |
| 5,224,504 A | 7/1993 | Thompson et al. |
| 5,227,041 A | 7/1993 | Brogden et al. |
| 5,228,966 A | 7/1993 | Murata |
| 5,230,743 A | 7/1993 | Thompson et al. |
| 5,232,328 A | 8/1993 | Owczarz et al. |
| 5,235,995 A * | 8/1993 | Bergman et al. ............ 134/105 |
| 5,238,500 A | 8/1993 | Bergman |
| 5,252,137 A | 10/1993 | Tateyama et al. |
| 5,252,807 A | 10/1993 | Chizinsky |
| 5,256,274 A | 10/1993 | Poris |
| 5,259,407 A | 11/1993 | Tuchida et al. |
| 5,270,248 A | 12/1993 | Rosenblum et al. |
| 5,275,976 A | 1/1994 | Moslehi |
| 5,290,361 A | 3/1994 | Hayashida et al. |
| 5,294,257 A | 3/1994 | Kelly et al. |
| 5,312,487 A | 5/1994 | Akimoto et al. |
| 5,316,974 A | 5/1994 | Crank |
| 5,328,589 A | 7/1994 | Martin |
| 5,332,487 A | 7/1994 | Young, Jr. et al. |
| 5,340,437 A | 8/1994 | Erk et al. |
| 5,349,978 A | 9/1994 | Sago et al. |
| 5,358,740 A | 10/1994 | Bornside et al. |
| 5,368,711 A | 11/1994 | Poris |
| 5,372,699 A | 12/1994 | Rischke et al. |
| 5,377,708 A | 1/1995 | Bergman et al. |
| 5,378,511 A | 1/1995 | Cardinali et al. |
| 5,391,285 A | 2/1995 | Lytle et al. |
| 5,395,803 A | 3/1995 | Adams |
| 5,403,617 A | 4/1995 | Haaland |
| 5,405,518 A | 4/1995 | Hsieh et al. |
| 5,415,890 A | 5/1995 | Kloiber et al. |
| 5,421,987 A | 6/1995 | Tzanavaras et al. |
| 5,429,733 A | 7/1995 | Ishida |
| 5,429,912 A | 7/1995 | Neoh |
| 5,431,421 A * | 7/1995 | Thompson et al. ......... 279/139 |
| 5,658,387 A * | 8/1997 | Reardon et al. ............ 118/323 |
| 6,375,741 B1 * | 4/2002 | Reardon et al. ............ 118/313 |

FOREIGN PATENT DOCUMENTS

| | | |
|---|---|---|
| EP | 0290218 | 11/1988 |
| EP | 0360678 | 3/1990 |
| JP | 45-40458 | 12/1970 |
| JP | 54-71991 | 6/1979 |
| JP | 3010-974 | 8/1979 |
| JP | 54-161275 | 12/1979 |
| JP | 55-069817 | 5/1980 |
| JP | 56-88320 | 7/1981 |
| JP | 58-19475 | 2/1983 |
| JP | 55-174652 | 3/1983 |
| JP | 58-182823 | 10/1983 |
| JP | 59-166675 | 9/1984 |
| JP | 59-208067 | 11/1984 |
| JP | 231330 | 11/1985 |
| JP | 61-148820 | 7/1986 |
| JP | 61-139314 | 12/1987 |
| JP | 63-118093 | 5/1988 |
| JP | 63-153839 | 6/1988 |
| JP | 62-36974 | 9/1988 |
| JP | 62-66262 | 9/1988 |
| JP | 62-194881 | 2/1989 |
| JP | 01-129156 | 5/1989 |
| JP | 62-278528 | 5/1989 |
| JP | 1-204427 | 8/1989 |
| JP | 63-165764 | 1/1990 |
| JP | 04131395 | 5/1992 |
| JP | 04280993 | 10/1992 |
| JP | 6017291 | 1/1994 |
| JP | 1-304732 | 11/1998 |
| WO | WO 97/12079 | 4/1997 |

OTHER PUBLICATIONS

Moreau et al., "Wafer Cleaner System", IBM Technical Disclosure Bulletin, vol. 19, No. 10, pp. 2905-2906 (Mar. 1972).
Beyer et al., "IBM Tech. Disc. Bull.", Etching of SiO$_2$ in Gaseous HF/H$_2$O, vol. 19, No. 7, Dec. 1976, p. 2513.
Van der Heide, P.A. M., et al., "Etching of Thin SiO$_2$ Layers Using Wet HF Gas", J. Vac. Sci. Technol., A7(3), pp. 1719-1723, (May/Jun. 1989).
Burggraaf, Pieter, "Vapor-Phase Cleaning at Reduced Pressure", Semiconductor International, p. 36, (Dec. 1989).
Product Brochure, "Preliminary Product Information-EDGE 2000", Advantage, Production Technology Incorporated (1989).
"A Mechanism of Particle Generation and a Method to Suppress Particles in Vapor HF/H$_2$O System" in Shigeo Onishi, et al., Extended abstracts of the 22$^{nd}$ (1990 International) Conference on Solid State Devices and Materials, Sendai, 1990, pp. 1127-1139.
IBM Technical Disclosure Bulletin vol. 19, No. 7, p. 2574, Dec. 1976 "Process for Reducing Gold or Copper Wafer Contamination During Oxide Removal" by M. Briska, et al.
IBM Technical Disclosure Bulletin, vol. 32, No. 1, Jun. 1989, "Upside-Down Resist Coating of Semiconductor Wafers".
Evan E. Patton, et al., "Automated Gold Plate-Up Bath Scope Document and Machine Specifications", Tektronix Confidential, dated Aug. 4, 1989, pp. 1-13.
Tektronix Invention Disclosure Form (Company Confidential), not dated, 4 pages.

* cited by examiner

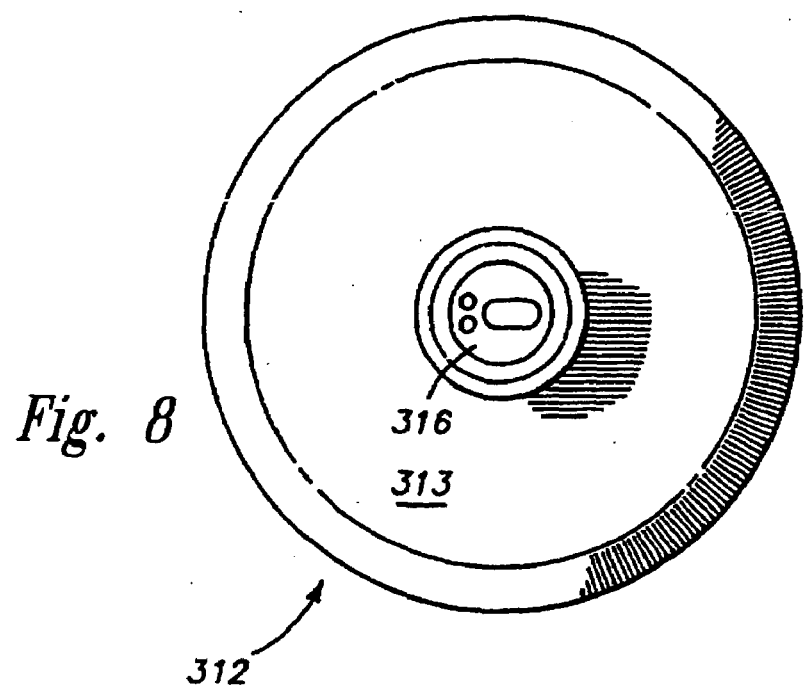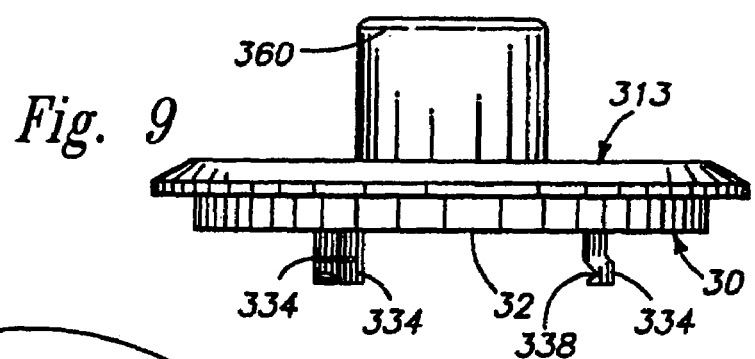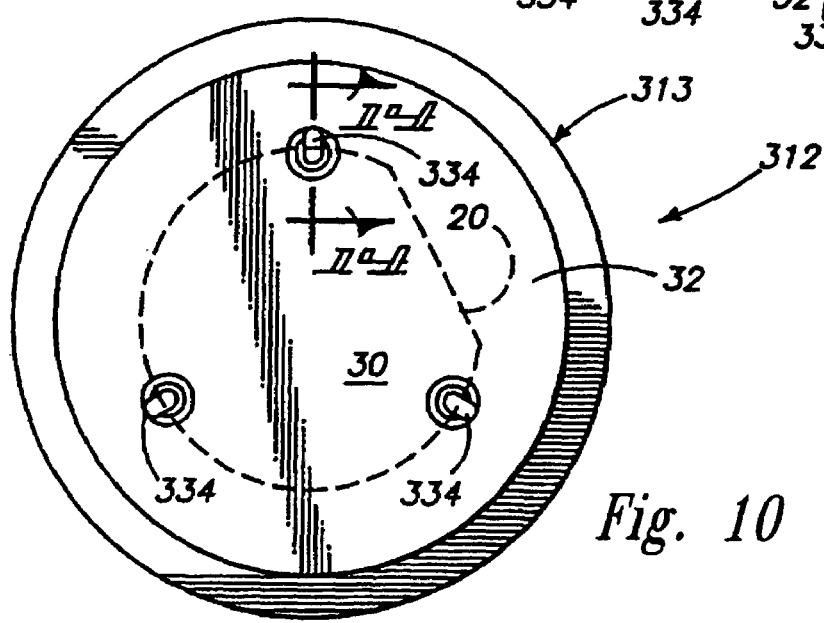

SEMICONDUCTOR PROCESSING APPARATUS

CROSS-REFERENCE TO RELATED APPLICATIONS

This application is a continuation of U.S. patent application Ser. No. 09/575,965 filed May 23, 2000 now U.S. Pat. No. 6,375,741; which is a continuation of U.S. patent application Ser. No. 08/883,393 filed Jun. 26, 1997 (now U.S. Pat. No. 6,066,575); which is a division of U.S. patent application Ser. No. 08/422,485 filed Apr. 12, 1995 (now U.S. Pat. No. 5,658,387); which is a continuation-in-part of U.S. patent application Ser. No. 07/855,767 filed Mar. 18, 1992 (now U.S. Pat. No. 5,431,421); which is a continuation-in-part of U.S. patent application Ser. No. 07/665,942 filed Mar. 6, 1991 (now U.S. Pat. No. 5,235,995); which is a continuation-in-part of U.S. patent application Ser. No. 07/526,243 filed May 18, 1990 (now U.S. Pat. No. 5,168,887).

Priority under 35 U.S.C. §120 is claimed based upon the above applications and U.S. patent application Ser. Nos. 07/855,767 and 07/665,942 are also hereby incorporated by reference.

TECHNICAL FIELD

This invention relates to apparatus and methods for coating semiconductor wafers, flat panel displays, data disks, microelectronic components, thin film heads for hard disk drives, and other microelectronic or semiconductor articles that must be coated with a relatively uniform confirmation coating layer over irregular surfaces.

BACKGROUND OF THE INVENTION

The production of semiconductor devices, such as semiconductor wafers, semiconductor substrates, flat panel displays, data discs and other similar articles, generally requires at least one step in which a coating must be applied in a uniform layer across a surface of the device. For instance, the production of integrated circuits frequently involves the application of a uniform coating of photoresist on a silicon wafer or substrate.

The small feature size and variety of micro-devices being produced need highly uniform coating layers to be produced. The production of micro-devices is significantly affected by current limitations associated with non-uniformity in coating layers, particularly when coating over irregular surfaces. Such irregular surfaces occur due to the micro-devices having one or more features such as vias, channels, and peaks. These features produce irregularities in the height of the surface over which the coating is being applied. These surface irregularities cause problems and limit the overall production performance and effectiveness of conventional coating apparatus and methods because the coatings cannot be applied in a sufficiently uniform manner. The coatings often fill channels, run off the peaks, and in some instances are unable to adequately fill vias. As a result, the coating layer is thickened in the channels, and thinned on the peaks. Vias can either be underfilled or overfilled depending upon viscosity and feature geometry.

A common prior art technique for applying photoresist coatings involves spraying the wafer with a photoresist and then spinning the wafer. The spinning action of the wafer produces centrifugal forces which spread the liquid photoresist. However, these spin application techniques have difficulties in providing layers having good uniformity. Striations are a common problem. These striations can be initiated by surface features, contaminants, or fluid properties of the coating being applied. These and other irregularities have derogatory effects on the production of microcircuits and other micro-devices.

Prior art semiconductor coating techniques have not been able to provide thin, uniform coating layers which conform to irregularities present on the wafer or other semiconductor surface being coated. Spin coating techniques produce coating layers which tend to have an approximately level or planar surface even though surface features of varying heights are contained beneath the coating. The surfaces of wafers can contain topographical height variations of 10–40 microns with associated horizontal increments of 100–500 microns. Coatings thicknesses can thus vary in the range of 5–30 microns. This creates variations in the width of lines or other critical dimensions. These variations can in turn cause significant process yield losses. Thus, there is a need for improved coating apparatus and methods which can produce a coating layer onto semiconductor surfaces which is conformational to provide more uniform coating thickness, even when applied over surfaces having features of varying heights and shapes.

Prior art coating techniques have also been troubled by difficulties which arise during lithographic processes performed upon coating layers. These difficulties arise when coating thicknesses vary to a degree sufficient to cause focusing variations in the lithographic beams used to define features of a device. These problems are in particular significant when complex topographical configurations are used. This increased difficulty occurs due to the greater difficulty in producing uniform coating thicknesses on complex topographical configurations.

Prior art semiconductor equipment and techniques have also been deficient in not providing uniform application of relatively viscous coating materials. The exact mechanism causing the difficulties are not fully understood. This problem of coating with viscous coatings is further exacerbated when the surface being coated is irregular, such as discussed above.

The application of coatings to semiconductor article surfaces is further complicated by the extraordinarily low levels of contamination which must be maintained when processing semiconductor materials. Contaminating particles will cause defects to exist in the resulting products and will typically decrease device yields and profitability. Thus there is a strong need to produce uniform coating layers free from contaminants or congealed particulate accumulations which may form from the coating materials themselves.

Another problem associated with present equipment and methods for coating semiconductor wafers and similar devices is that a relatively large volume of coating material is used. This occurs in some instances because the coating is applied and the wafer is spun to provide centrifugal dispersion of the coating across the wafer surface. This leads to coating material being spun off and wasted. In other equipment the coating spray is not efficiently applied and is wasted in part as an aerosol of coating particles which do not adhere to the surface being coated.

A further problem associated with current techniques is inefficient coating application equipment and techniques. The excess coating material is either wasted, or else time and money are expended to dispose of, reformulate, or recycle the spent coating material. Thus there is a continuing need for methods and apparatus which can more precisely coat such articles using a relatively smaller amount of coating material and with reduced waste.

For these and other reasons, there is a strong need for improved methods and apparatus which can provide a uniform coating layer on irregular semiconductor article surfaces using reduced amounts of the coating materials.

BRIEF DESCRIPTION OF THE DRAWINGS

Preferred embodiments of the invention are described below with reference to the accompanying drawings, which are briefly described below.

FIG. 8 is a top view of the wafer holding processing head of FIG. 7 shown in isolation.

FIG. 9 is a side elevational view of the wafer holding processing head of FIG. 8.

FIG. 10 is a bottom view of the wafer holding processing head of FIG. 8.

DETAILED DESCRIPTION OF THE PREFERRED EMBODIMENTS

Figure 1:
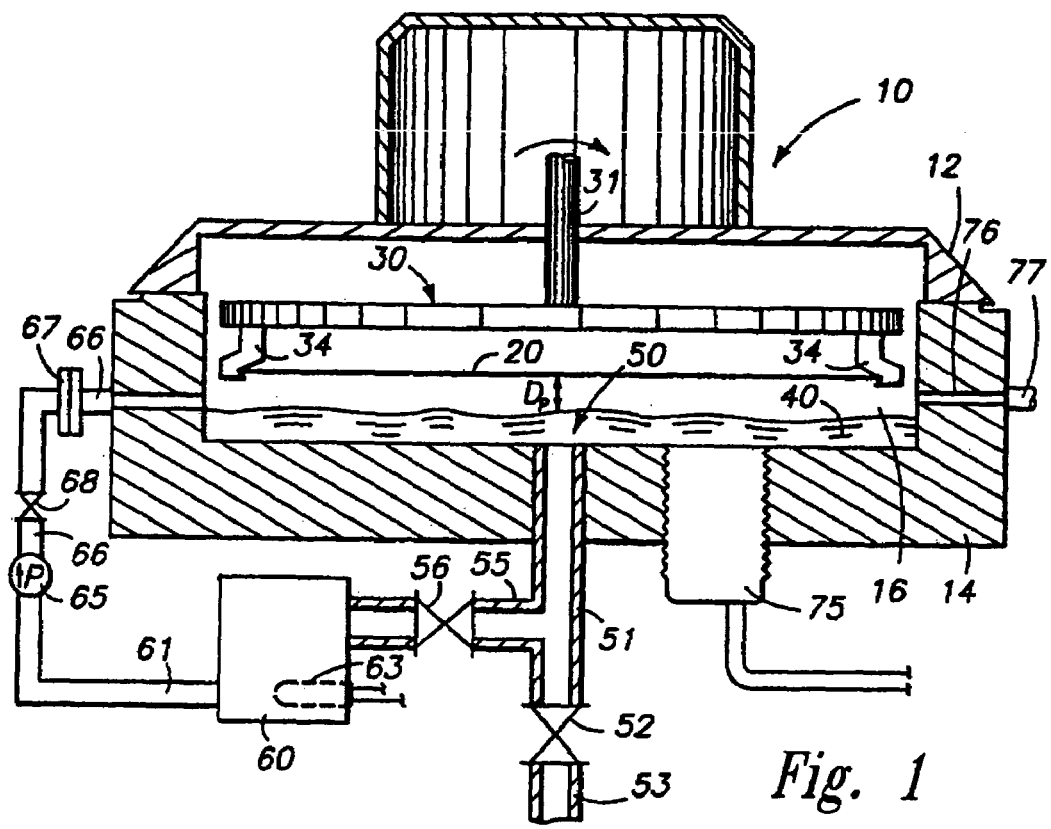
FIG. 1 is a side sectional view showing a preferred configuration for vapor processing wafers according to this invention.

This disclosure of the invention is submitted in furtherance of the constitutional purposes of the U.S. Patent Laws "to promote the progress of science and useful arts" (Article 1, Section 8).

Vapor Phase Processing

The novel processes according to this invention involve the production of a vapor mixture or solution which is used as an etching or reactant gas. The etchant used in the process includes an active ingredient or ingredients which are preferably one or more acids, preferably a hydrogen-halide acid, most preferably hydrogen fluoride. The most preferred etching vapor mixture includes hydrofluoric acid vapor and water vapor. The water vapor acts as a diluent and is important in inducing the reactivity of the hydrofluoric acid.

The manner of producing and presenting the vapor mixture to the semiconductor wafer or similar article being etched is of great significance in the achievement of a commercially viable process of suitable benefits to warrant use in the semiconductor chip manufacturing industry. The vapor mixture is preferably produced in a manner which generates a nearly homogeneous vapor mixture of the active etchant and diluent which acts as an etchant or other reactant gas. The vapor mixture is most preferably in equilibrium with a liquid phase source which supplies the reactant vapors. The liquid phase source is also preferably homogeneously mixed or in solution.

The typical utilization of the novel processes is in the removal of oxide and nitride layers, such as silicon dioxide layers from silicon wafers. The processes are also potentially applicable to the processing of other wafer and substrate materials, such as gallium arsenide and indium containing semiconductors. Still other types of semiconductor disks, displays, magnetic disks or other articles of this type needing etching or other chemical processing may also potentially be suitable for treatment using the novel processes described herein.

The etchant gas is preferably produced from a homogeneous liquid mixture or solution of hydrofluoric acid and water which forms a liquid source from which a homogeneous equilibrium vapor etchant is preferably produced. Other etchant and diluent sources or other multichemical systems having at least a first chemical and a second chemical may alternatively be possible.

The preferred liquid phase source is advantageously comprised of hydrofluoric acid and water in sufficient amounts to provide relative molar concentrations in the approximate range of 1:100 to 1:1 (hydrofluoric acid:water). More preferably, the liquid source of the etchant vapor includes amounts sufficient to provide relative molar concentrations in the approximate range of 1:50 to 1:5 (hydrofluoric acid:water).

The hydrofluoric acid and water used in preparing the liquid processing fluid or etchant source are preferably of very high purity without contaminating particles of organic or inorganic materials. Purity levels of the highest or nearly highest degree obtainable with chemical purification techniques now available are most appropriate.

The processing liquid mixture is advantageously maintained at a temperature suitable for producing vapor pressures of the constituents which cause good evolution of vapor to speed processing. Liquid processing fluid temperatures in the approximate range of 10°–100° C. are appropriate for aqueous hydrofluoric etchants. Temperatures in the range of 20°–40° C. are more preferred, with ambient temperatures of 20°–25° C. most typical.

The vapor processing is preferably done within an enclosed or confined processing chamber at pressures which are sufficiently high to prevent boiling of the liquid processing fluid. Processing pressures in the approximate range 100–2000 torr are operable dependent upon temperature of the liquid mixture. Pressures in the range of 500–1500 torr are more preferable with atmospheric pressures in the range of 600–900 torr most preferable.

The liquid phase processing mixture can advantageously be assisted into vapor formation by a suitable vaporization enhancer. The vaporizing of the liquid phase can be enhanced by a suitable agitating, such as by circulating and mixing through a recycle system, such as described below, or otherwise agitating and mixing the processing liquid. It is alternatively, or additionally possible to use ultrasonic agitation to enhance vapor formation. Enhanced vapor formation can serve to increase processing throughput and availability of the vapor phase mixture to the wafer or other unit being processed.

The homogeneous etchant or other reactant gases used in the novel processes of this invention are preferably presented to a wafer being processed so as to uniformly contact the surface or surfaces being etched or otherwise chemically processed. The use of carrier gas is specifically not employed because of the inventor's identification of substantial complicating and derogatory effects of such an approach. Carrier gases tend not only to dilute the vapor and reduce etch rates, but also to represent substantial additional problems in maintaining homogeneity and effective etching upon the surface of the wafer being processed.

The preferred etchant gases are contacted against the processed surface of the wafer in a manner specifically designed to minimize the potential for nonhomogeneity and variations in the microscopic localized concentrations of the etchant and diluent or other constituent chemicals, such as the typical hydrofluoric acid and water. The etching rates of aqueous hydrofluoric acid mixtures vary dramatically as a function of differing relative concentrations of these constituents. Such variations have plagued the semiconductor industry resulting in uneven etch rates which are increasingly troublesome in chips having smaller and smaller feature sizes.

A preferred manner of presenting the reactant vapors is to generate the vapors from a pool of homogeneous liquid mixture. The homogeneous liquid mixture is most preferably in close physical proximity to the wafer surface being processed. This is advantageously accomplished by forming a pool of the liquid source which is maintained in a homogeneous condition by suitable mixing. The wafer is then processed by closely positioning the wafer to the source pool or otherwise effectively transferring the reactant gas mixture from the liquid source to the unit being processed. The manner of transfer must provide a homogeneous etchant or reactant gas at the wafer surface being processed.

The preferred manner of presentation of the etchant vapors to the processed wafer surface or surfaces is also to orient the processed surface to face downwardly. This presents the treated surface in a manner which resists particle migration to the surface by the force of gravity. Downward orientation can also be advantageously employed to bring the processed surface of the wafer into closer proximity and juxtaposition to a liquid source of the vapor and improves the mass transfer between the source and surface to maintain high etch rates. The wafer surface being processed is preferably in the approximate range of 2–100 millimeters from the surface of the liquid etchant source to facilitate circulation and mass transfer.

The novel processes of this invention also include rotating or otherwise appropriately moving the wafer during the presentation of the etching vapors to provide uniform dispersion of the reactant gas over the entire processed surface of the wafer. The rotation or other relative motion of the wafer being processed is also significant in creating circulation which provides adequate mass transfer between the source, vapor and surface being treated. At sufficient rotational speeds a vortex action develops which can be significant in providing the desired mass transfer and circulation. These dynamic flows in the circulating etchant vapors also are significant in maintaining homogeneity and equilibrium in the vapor phase so that etch rates are uniform across the wafer and repeatable from wafer to wafer.

The dynamic action of the wafer is preferably at rotational speeds of at least 20 revolutions per minute (rpm). Speeds less than 20 rpm have been found inadequate to fulfill the processing needs of the system. More advantageously, the relative wafer rotational speeds are in the approximate range of 20–1000 rpm because excessive speeds are believed to cause a substantial derogatory effect in particle counts on the wafer. Although the specific mechanism is not known with precision, it is believed that the high rotational speeds cause such extensive turbulence that particles are agitated to a point causing migration onto the wafer surface from either the liquid source or the processing equipment. High rotational speeds may also cause electrical charge (static electricity) to develop which may aggravate the potential, otherwise raised by the turbulence, for particle migration to the surface of the wafer being treated.

Although rotational speeds in the range of 20–1000 rpm are operable, experimentation has indicated that rotational speeds in the range of approximately 30–800 rpm are improved in maintaining low particle counts as compared to rotational speeds outside this range. Still further significant improvement has been shown when the rotational speeds are in the range of approximately 50–400 rpm. Still further preferred are rotational speeds in the approximate range of 50–250 rpm. The indicated speeds apply to wafers of approximately 8 inches (~200 millimeters) diameter or less. Wafers of even large sizes may be appropriately processed at such speeds with additional precaution due to the increased centrifugal forces developed.

The novel processes of this invention further advantageously include drying the wafer after the vapor phase chemical processing, such as the etching described above. The vapor processing can lead to condensation of the vapors onto the surface of the wafers. The drying advantageously includes a post-acid-processing spin cycle immediately after the vapor phase processing described above. The wafer is rotated as during the vapor phase processing or with increased rotational speeds, such as greater than 1000 rpm. Spinning speeds in the approximate range 1000–3000 rpm are suitable, with speeds of 1000–2000 most preferred.

The spin dry processing can be assisted by also passing a flow of suitable drying gas through the processing chamber to further supplement or finalize the drying process. The drying gas is preferably a non-reactive gas, such as nitrogen or an inert gas. The drying gas can be heated or supplied at ambient temperatures. Drying gas having temperatures in the range of 0–200° C. are appropriate, with temperatures in the range 20°–100° C. more preferred. The drying gas can be supplied so as to impinge upon the processed surface or surfaces being dried.

Processing Apparatuses

FIG. 1 shows relevant portions of a preferred semiconductor processing machine adapted for carrying out the novel processes of this invention. Processing machine 10 includes a movable head 12 which mates with a processing bowl 14 to confine a processing chamber 16. Processing head 12 includes a suitable wafer holder 30 for holding a disk-shaped wafer 20 using fingers 34 in a desired orientation with the processed surface facing downwardly. The wafer holder 30 is provided with a motor or other drive (not shown) which is connected to the drive shaft 31 to rotate the wafer in the desired rotational processing described above.

The arrangement shown in FIG. 1 includes the wafer 20 in superposition above a subjacent pool 40 of the liquid source used for producing the gaseous etchant. The proximity distance $D_p$ defines the amount of separation between the upper level of the liquid etchant source and the nearest wafer surface being processed. The preferred range of $D_p$ is the indicated 2–100 millimeters. The processed surface of wafer 20 is in directly opposite juxtaposition to the subjacent pool 40.

The processing machine 10 is also advantageously provided with a means for maintaining a homogeneous mixture of the liquid phase constituents. This is suitably provided in the form of a central drain 50 which has a system outflow line 51 through which liquid is drained through drain valve 52 to a disposal line 53. The outflow line 51 is advantageously branched to form a recycle line 55 which empties into a reservoir 60. Reservoir 60 can advantageously be provided with a suitable temperature affecting or control unit, such as a thermostatically controlled electric resistance heating coil 63 for maintaining or providing the processing liquid at a desired temperature. Coil 63 can alternatively be a fluid heat exchanger used to cool or heat the contents of reservoir 60. When HF and water etchants are used temperatures in the approximate range 10°–100° C. are most appropriate. Alternative processing temperatures may be used or needed if different etchant or other processing fluids are used.

Reservoir 60 is provided with an outflow in the form of pump feed line 61 which communicates fluid to the inflow side of a suitable mixing pump 65. Pump 65 and outlet valve 68 are controlled to deliver a supply of the processing liquid to form pool 40 in the lower portions of processing chamber 16. Filter 67 is provided in the pump outflow line 66 to remove particles from the recirculating liquid source. A reservoir recycle control valve 56 is provided to assist in the control of the level of pool 40.

The processor 10 also advantageously is provided with an ultrasonic agitator 75 of suitable design which are commercially available. Agitator 75 can be activated during the acid processing to agitate and enhance vapor formation.

FIG. 1 also shows that the processing chamber 16 is further fitted with a drying gas introduction port 76 which receives nitrogen or other drying gas from drying gas supply line 77. The drying gas can be input into the processing chamber via a plurality of circumferentially spaced ports which are at approximately the same elevation as the wafer or slightly below and oriented to direct the flow of drying gas across the processed wafer surface.

Operation of Apparatus

Processor 10 is operated to carry out the processes described herein. Prior to etching, the wafer 20 is otherwise suitably processed in a variety of related processing steps dependent on the particular integrated circuit product being produced. The head 12 is loaded with wafer 20 which is held in position by the wafer holder. The head is then positioned in sealing relationship with the bowl 14 or otherwise suitably adjusted to confine the processing chamber against drafts and other substantial leakages which might affect the homogeneous vapor phase which is being presented for contacting and etching the processed surface of wafer 20.

The bowl is thereafter filled with the source liquid for producing the etchant vapor using pump 65, supply line 66 and suitable control of valves 52, 56 and 68. The wafer is preferably rotated at a suitable speed, as indicated, during the filling operation and maintained briefly to better establish an equilibrium condition between the liquid etchant source and the vapor phase etchant gas within the processing chamber adjacent the wafer surface. This equilibrium can typically be established within 10 seconds to 1 minute depending on the size and proximity spacing of the system. The agitator 75 or recycle loop through reservoir 60 can be used to agitate the liquid phase source of the etchant to assist in the production of vapor therefrom. Rotation of the wafer at the desired speed is continued to perform the etching. Etchinq times are commonly in the approximate range 30 seconds to 3 minutes, with 1 minute etching times most typical. Pump 65 and valves 56 and 68 can be suitably controlled to recycle the source liquid to maintain homogeneity and to filter the liquid through recycle filter 67 which is preferably a 0.1 micron or smaller filter to remove particles from the liquid during recycle.

After the etching has been suitably completed then the valve 56 is opened and the pool of etchant source liquid is drained to reservoir 60 for reuse. Alternatively, it can be drained through valve 52 when it is expanded. After the pool 40 has been drained the wafer rotational speed can advantageously be increased to speeds typically in the range of approximately 1000–2000 rpm to assist in the removal of any condensed vapor and to minimize the potential for residue. Such post-etching spin processing is typically done for periods of 30 seconds to 2 minutes, or as appropriate. The post-treatment spin can be performed while also passing a flow of drying gas through the chamber using inlet port 76. After the post-etching spin, the head is moved upwardly and the wafer removed in any suitable manner for subsequent processing.

Figure 2:
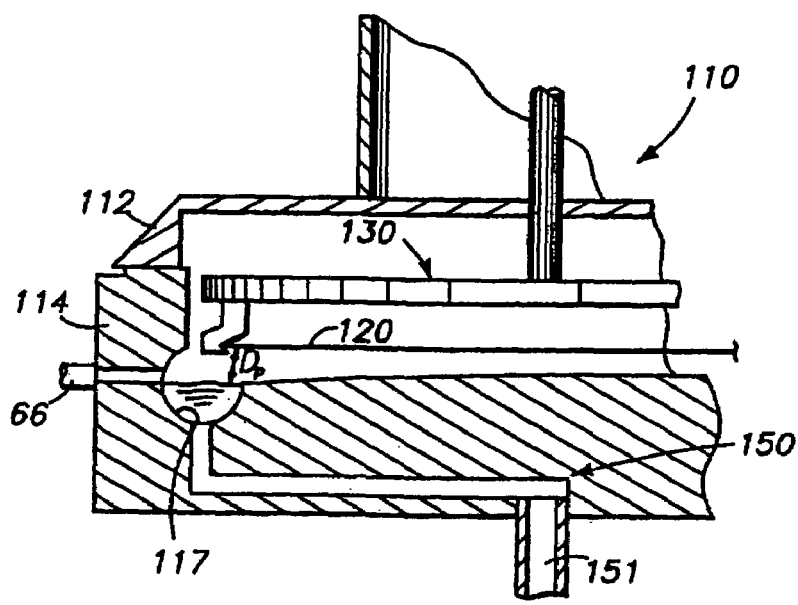
FIG. 2 is a further side sectional view showing another preferred configuration for vapor processing wafers according to this invention.
Figure 3:
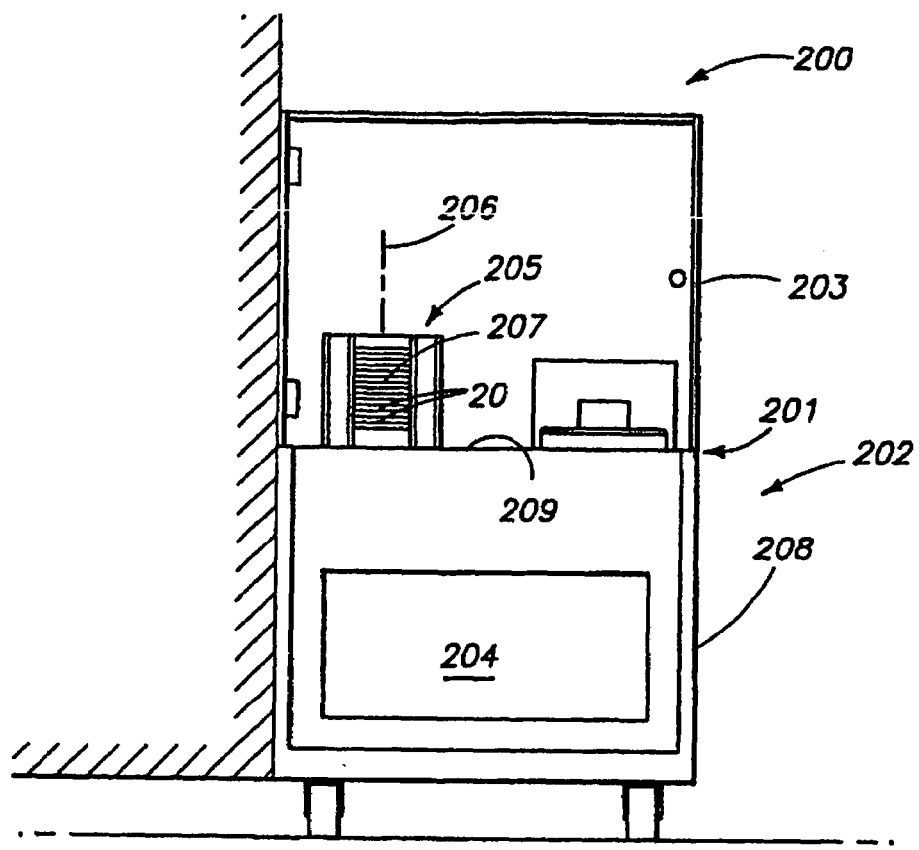
FIG. 3 is a front elevational view of a processing unit useful for carrying out processes of this invention.

FIG. 2 shows portions of an alternative processing machine 110 similar to machine 10 described above. The notable difference is in the provision of a perimeter trench 117 in processing bowl 114 for confining the etchant or other processing fluid pool 140 therein about the periphery of the wafer 120. The wafer and supporting wafer holders preferably extend in close proximity to create vapor circulation between the toroid-shaped pool and the processed lower surface of wafer 120. Drain 150 and outflow line 151 are similarly connected to a recycle and drain system such as described above with reference to FIG. 1. The system shown in FIG. 2 is operated using processes the same or similar to that described above.

EXAMPLE

Liquid etchant was prepared by mixing hydrofluoric acid and water in amounts sufficient to provide a molar ratio of approximately 1:20 (hydrofluoric acid:water). The liquid was then charged into a processing apparatus similar to that described and shown in FIG. 1. The water and acid mixture was then circulated to help assure homogeneity and drained to the reservoir. The liquid mixture was used at room temperature. The wafer was installed in the head of the processor and the head and wafer were positioned for processing. The wafer was spun at approximately 150 rpm while etchant mixture was filled into the processing bowl beneath the spinning wafer. The wafer was spaced approximately 5.7 millimeters from the pool of etchant. After the mixture was sufficiently filled into the bowl, the wafer was processed for approximately 60 seconds. Thereafter the processing chamber was supplied with a flow of nitrogen at ambient conditions and approximately 2 psig pressure for approximately 1 minute to aid in evaporating any residual etchant vapors from the surface of the wafer. The resulting wafers were examined and found to have good etch uniformity and etch rates suitable for commercial processing.

Radiative Volatilization Processing

Novel processes according to this invention can further advantageously incorporate a heat volatilization step or steps to remove condensed fluorosilicates or other particles produced as by-products during the etching processes described above. The production of condensed fluorosilicates or other etching by-products particles may or may not be of significance in any particular process. However, where etching conditions or chemicals cause such particles to be formed on the processed side or sides of the wafer, then their removal is typically desired.

The volatilization of etching by-products is preferably accomplished by suitably heating the wafer or other unit being processed. This can advantageously be done by exposing the wafer to heat, such as in a heated chamber, or more preferably, by exposing the wafer to sufficient amounts of infrared radiation to cause heating of the wafer and volatilization of the etching by-products being removed. The radiative heating process preferably employed to cause volatilization can be performed to either processed or unprocessed surfaces of the wafer, or both. Most preferably the radiation is exposed to the back or unprocessed surface.

The radiant heating processes preferably used in volatilization of the etching by-products are performed for sufficient periods to cause volatilization of the particular by-products present. The heating steps will usually be performed for periods in the approximate range of 30 seconds to 5 minutes, more preferably 30 seconds to 2 minutes.

The radiation flux desired for volatilization is primarily a function of the desired speed of heating and the size of the unit being processed. Utilization of three (3) quartz-halogen lamps of 500 watts each has been found desirably fast for the processing of wafers of 6–8 inches (~150–200 millimeters) at a distance of approximately 0.5–4 inches (~13–100 millimeters).

The wafers being processed are typically heated to temperatures in the range of 100°–300° C. during the volatilization processing. When employing the aqueous hydrofluoric acid processing described above the volatilization processing is preferably in the range 100°–200° C., even more preferably 100°–150° C., most preferably about 130° C. The desired volatilization processing temperature may depend upon the particular by-product(s) being removed from the surface of the wafer and the size and material of the wafer.

Automated Wafer Processing Apparatus

FIGS. 3–6 show a preferred semiconductor processing apparatus 200 according to this invention which incorporates both chemical processing and radiative volatilization processing in an automated production machine. Processing unit 200 includes a framework 201 having a base portion 202 and a protective superstructure 203. Base portion 202 advantageously includes an access door for allowing inspection and maintenance of various system components including the control system described in FIGS. 24 and 25 and the fluids handling system described in connection with FIG. 26. The base also includes an upper deck surface 209 which supports various components as described below. The base is advantageously made of polypropylene or other suitable material.

Superstructure or cover 203 extends over most of base 202 of the processing unit. Cover 203 allows the area within to be purged with nitrogen or other suitable non-reactive gas to prevent or reduce oxidation or other reaction of the wafers during waiting and processing. The front or other appropriate side wall is advantageously adapted to function as an access door to the components mounted upon upper deck 209. Cover 203 can also be totally removed for complete access to the covered components mounted upon the upper deck surface 209. Cover 209 also provides a safety shield against processing accidents and restricts human access or exposure to operation of the robotic transfer system 210 described below. A suitable acid-resistant transparent material, such as plexiglass or polycarbonate, is advantageously used for cover 209 to allow observation during operation of unit 200.

Processing unit 200 further includes a wafer inventory structure 205 for inventory of wafers being processed; a chemical processing or etching subsystem 300 for performing chemical processes as taught herein; a radiative volatilization processing subsystem 400 for heat processing as described herein; and a robotic transfer unit 210 for moving wafers between the other subsystems.

The inventory subsystem of processing unit 200 includes one or more inventory structures such as wafer receiver 205. Wafer receiver 205 can be selected from a number of suitable commercially available wafer carrier designs. As shown, wafer receiver 205 includes a wafer support structure having a plurality of partially enclosed wafer inventory receptacles 207 which are oriented to receive and hold wafers 20 in flat horizontal positions stacked vertically with the circle-defining central axes of the wafers aligned along a common vertical line 206. Wafer receiver 205 is advantageously used to inventory wafers which are awaiting processing and to also inventory those which have already been processed by remaining subsystems of processing unit 200. As shown, cover 203 has been adapted by providing a cover inventory receptacle 208 in the front door which allows mounting of wafer receiver 205 therein.

Processing machine 200 preferably includes a wafer transport subsystem which is preferably a robotic transfer unit 210. The robotic transfer unit is used to handle wafers or other units being processed. As shown, robotic transfer unit 210 inserts and removes wafers from the inventory unit 205. The wafers are also transferred from inventory unit 205 to a chemical processing or etching subsystem 300. The transfer unit 210 also removes the wafers from the etching subsystem 300 and relocates them to a radiative treatment subsystem 400. After wafers are processed by the radiative treatment subsystem 400, the transfer unit is used to inventory the finished wafers in the inventory unit 205.

The robotic transfer unit 210 can be selected from a variety of suitable robotic systems capable of gentle but relatively quick movement between the various subsystems of processing unit 200, as described. A PUMA brand model 260CR has been found acceptable. The preferred robotic transfer unit 210 includes two arms 211 and 212 which are mounted on a swivel base. The unit also includes a movable distal end which swivels to achieved desired orientations. The arms adjustably support a wafer engagement head 213 which is suitably adapted to engage and hold the wafers 20 or other units being processed. Engagement head 213 is preferably a commercially available wafer vacuum head which extends along the back surface of the wafer and holds the wafer using applied suction.

Figure 4:
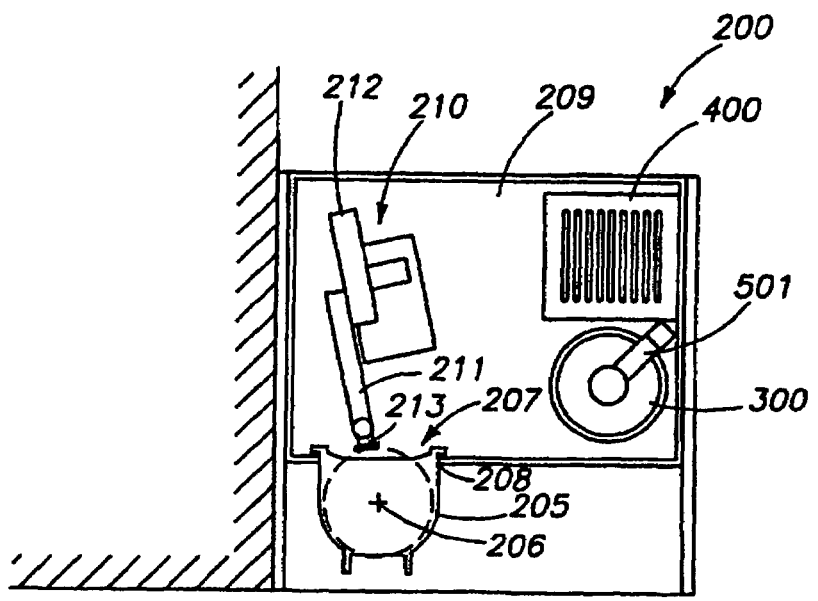
FIG. 4 is a top view of the processing unit shown in FIG. 3 with a robotic transfer unit in a first position for loading and unloading disks from an inventory.
Figure 5:
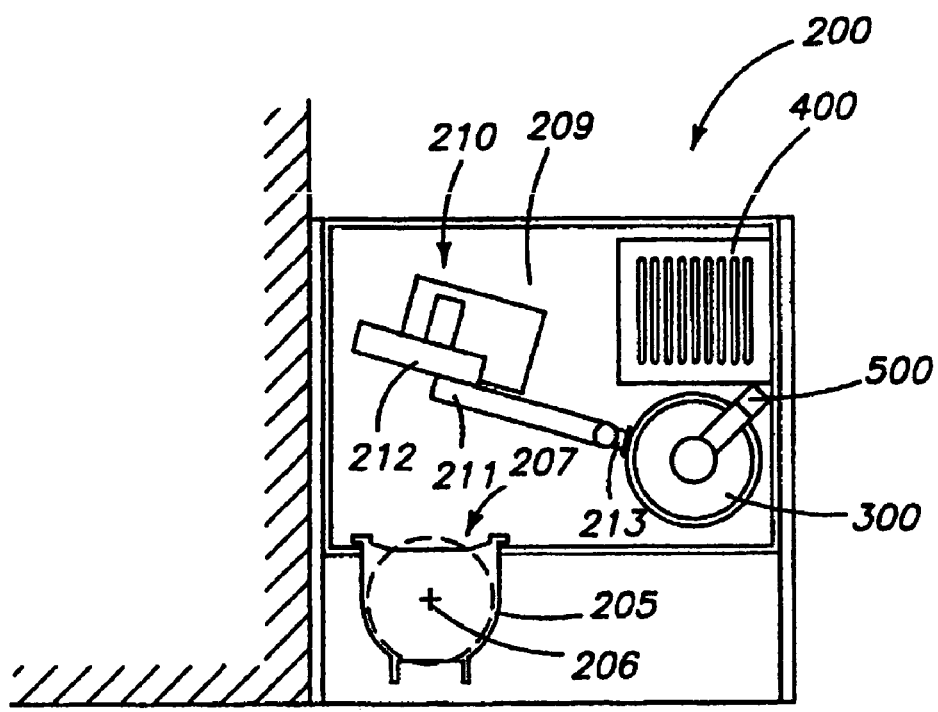
FIG. 5 is a top view of the processing unit shown in FIG. 3 with the robotic transfer unit in a second position wherein disks are loaded and unloaded from a chemical processing chamber.
Figure 6:
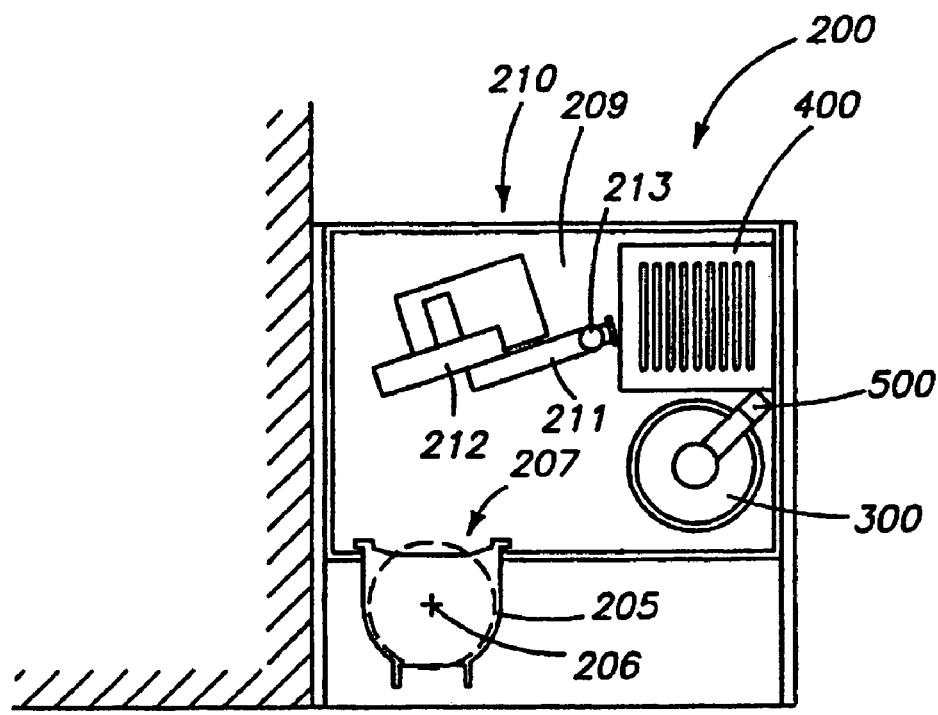
FIG. 6 is a top view of the processing unit shown in FIG. 3 with the robotic transfer unit in a third position wherein disks are loaded and unloaded from a radiative volatilization processing unit.

FIGS. 4, 5 and 6 show the robotic transfer unit 210 in three different operative positions. FIG. 4 shows transfer unit 210 in a first or inventory position wherein wafers are loaded and unloaded from the wafer receiver 205. FIG. 5 shows the transfer unit 210 in a second or chemical processor loading and unloading position wherein wafers are loaded or unloaded from the chemical processor subsystem 300. FIG. 6 shows the transfer unit 210 in a third or radiative processor loading and unloading position wherein wafers are loaded or unloaded from radiative processor subsystem 400.

Figure 7:
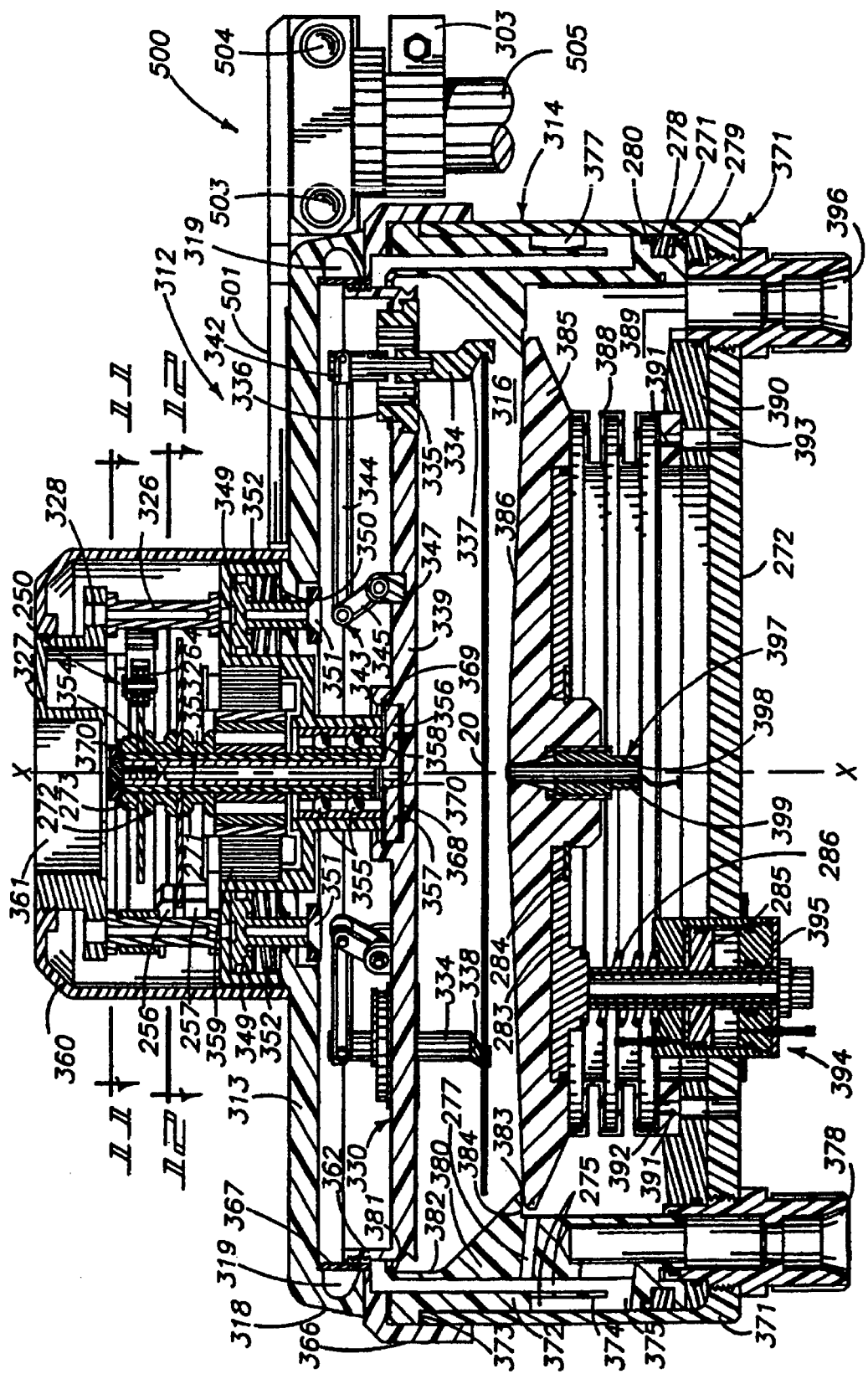
FIG. 7 is a cross-sectional view of a wafer holding processing head and associated base forming the chemical processing subunit of the processing unit shown in FIG. 3.

FIGS. 7–18 show the chemical processing subsystem or etcher 300. FIG. 7 shows that etcher 300 includes a movable wafer support head 312 which mates with a processing bowl assembly 314. An upper processing chamber 316 is defined within upper portions of the bowl assembly and below processing head 312 when positioned together. The wafer support head 312 is movably mounted to the framework 201 using a movable head mounting structure 500 which will be described in greater detail below.

The wafer support head 312 generally comprises a main cover piece or shroud 313 which is generally disk-shaped and constitutes the main structural piece of the head. The outer edge of cover 313 is down-turned to form a rim 318. Rim 318 has an inwardly directed annular recess 319 through which nitrogen or other purge gas can advantageously be supplied. A ring-shaped band piece 367 extends along and covers the inside of recess 319 to define a conduit therewith. A series of small purge nozzles pass the purge gas from recess 319 inwardly toward flange 362 described below. Cover 313 is also provided with a central opening through which motor support 358 is received. The cover is advantageously made of polyvinylidene fluoride or other suitable acid-resistant material.

The processor head assembly 312 also includes a cap 360 which covers a drive assembly which will be described more fully below. The upper end of cap 360 is threadably mounted by a cap mount 327 which is supported by spacers 326 upon the motor support 358. Spacers 326 have interior bores which receive fasteners (not shown) which extend through apertures 328 formed through the cap mount 327. Within the top of cap 360 is a tool connection receptacle 361 formed by the cap mount 327 which is a convenience feature utilized for lifting and supporting the head assembly, such as in maintenance or in other processing equipment applications.

Processor head 312 also includes a wafer holder or support 330. Wafer support 330 is movably mounted to remaining parts of the head assembly to provide rotation or other appropriate relative motion between the wafer being processed and the processing vapors. The wafer support includes a disk-shaped wafer support plate 339 having an exposed downwardly directed front face and a upwardly directed back face removed from the wafer 20 being processed. The wafer support plate 339 is advantageously constructed of polyvinylidene fluoride with an upturned lip 362 about the periphery thereof. Lip or flange 362 can advantageously be provided with outwardly facing parallel grooves 363 to help restrict gas flow between lip 362 and the adjacent piece 367 forming the interior surface of the cover assembly.

Wafer support plate 339 mounts a plurality of wafer support fingers 334, such as the triad shown, or more. The wafer support fingers 334 have distal ends 337 which are formed to provide gripping notches 338 in which the peripheral edge of wafer 20 is held. The distal ends of support fingers 334 are spatially contracted toward one another to hold wafer 20, or expanded outwardly to release the wafer.

Figure 14:
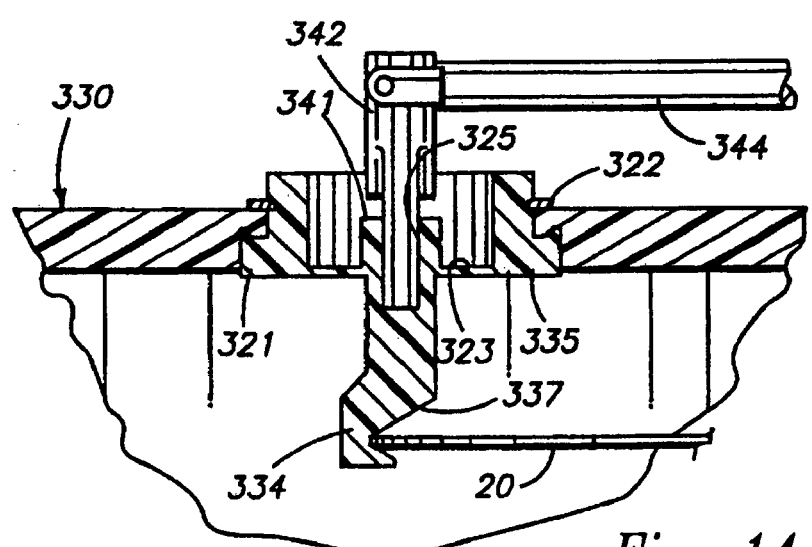
FIG. 14 is an enlarged sectional view showing a wafer support finger construction forming a part of the processing head of FIG. 7.

FIGS. 7 and 14 show that wafer support fingers 334 are flexibly mounted by finger bushings 335 to allow deflection thereof and the relative expansion and contraction needed for controlled gripping and release of wafer 20. Finger bushings 335 are preferably integrally formed with fingers 334 as shown best in FIG. 14. The finger bushings have an enlarged diameter exposed surface flange 321 which faces downwardly toward wafer 20. The finger bushings are held in position by a retaining ring 322 mounted to engage the back or upper surface of wafer support plate 339. The exposed, lower face also in part defines an annular web of diaphragm 323 which provides the flexibility needed to allow fingers 334 to pivotally deflect between expanded and contracted positions. The finger bushings 335 are made of a flexible material, such as TEFLON or other material suitable for service in the corrosive or other chemical environment which exists within processing chamber 316.

The wafer support fingers 334 also have upper or proximate ends 341 which are provided with connection receptacles 325. The connection receptacles receive end pieces 342 therein to form a mechanical coupling. End pieces 342 are displaced laterally by connection rods 344 to tilt the end pieces and attached wafer support fingers. The tilting action causes the relative expansion and contraction of the distal ends of the support fingers in the triad-arrangement.

Actuation of the support fingers is advantageously accomplished using finger actuators 343 as shown in FIG. 7. The finger actuators 343 each include a connecting rod 344 which is pivotally connected at a first or outer end to an end piece 342. The inner or second ends of connecting rods 344 are pivotally connected to a remote end of a positioning link 345. The opposite or mounted ends of positioning links 345 are pivotally connected to the wafer support plate 339 using positioning link brackets 347. The positioning links 345 are oriented at oblique angles extending inwardly from the pivotal connections with the mounting brackets 347 toward the remote ends and the pivotal connections with connecting rods 344. The mounting brackets 347 can be provided with biasing springs (not shown) which urge links 345 upwardly and the associated wafer fingers 334 into contracted positions tending to grip the wafer.

The wafer support fingers are moved into expanded positions to release the wafer by displacing the pivotal joints between connecting rods 344 and positioning links 345 downwardly and inwardly. This causes the connecting rods to move inwardly in a radial direction to displace the proximate ends of the wafer fingers inwardly and the opposite distal ends outwardly to release the wafer. The connecting rods are displaced downwardly and inwardly by an annular contact ring 351. Contact ring 351 is operated by a pair of small pneumatic pistons 349. Pistons 349 are slidable within cylindrical piston cylinders 350 formed in motor support 358. Pressurized fluid is supplied to the upper sides of pistons 349, as shown in FIG. 7, to force them downwardly and cause contact between annular contact ring 351 and connecting rods 344. The pistons are returned by return springs 352 mounted within the piston cylinders.

The wafer support drive assembly includes a motor 359 which is mounted upon motor support 358. Motor 359 is preferably a brushless DC motor. Motor 359 has a hollow motor shaft 353 supported by a set of ball bearings 355. The hollow motor shaft 353 receives a detachable shaft 354 therethrough. The detachable shaft 354 is axially splined to the motor shaft using a spine pin 370 captured between a flanged shaft head 356 and the end of the motor shaft 353. The upper end of the detachable shaft is adapted for receiving a small screw 370 which pulls the two shafts into a tightened and anti-rotationally splined assembly. The flanged head is received within a shaft head receptacle 368 formed in the back surface of wafer support plate 339. Spaced, axially oriented, anti-rotation pins 357 are engaged between the lower face of the flanged shaft head 356 and corresponding holes formed in receptacle 368. A snap-ring retainer 369 holds the flanged head 356 axially within receptacle 368.

The angular positions of fingers 334 about the rotating assembly rotational axis X-X are preferably controlled to assume desired positions when the rotatable wafer support 330 stops. This indexing of the stationary positions of fingers 334 is needed when the processing head is opened to provide proper engagement of the wafer by the robotic transfer unit engagement head 213.

Figure 11:
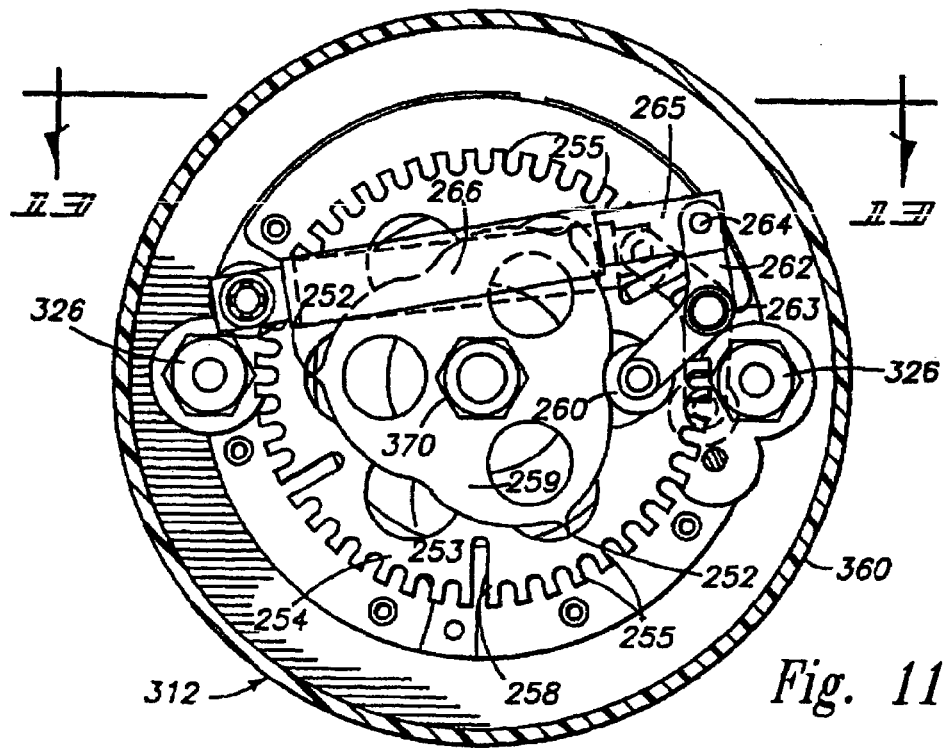
FIG. 11 is a sectional view taken along line 11—11 of FIG. 7.
Figure 12:
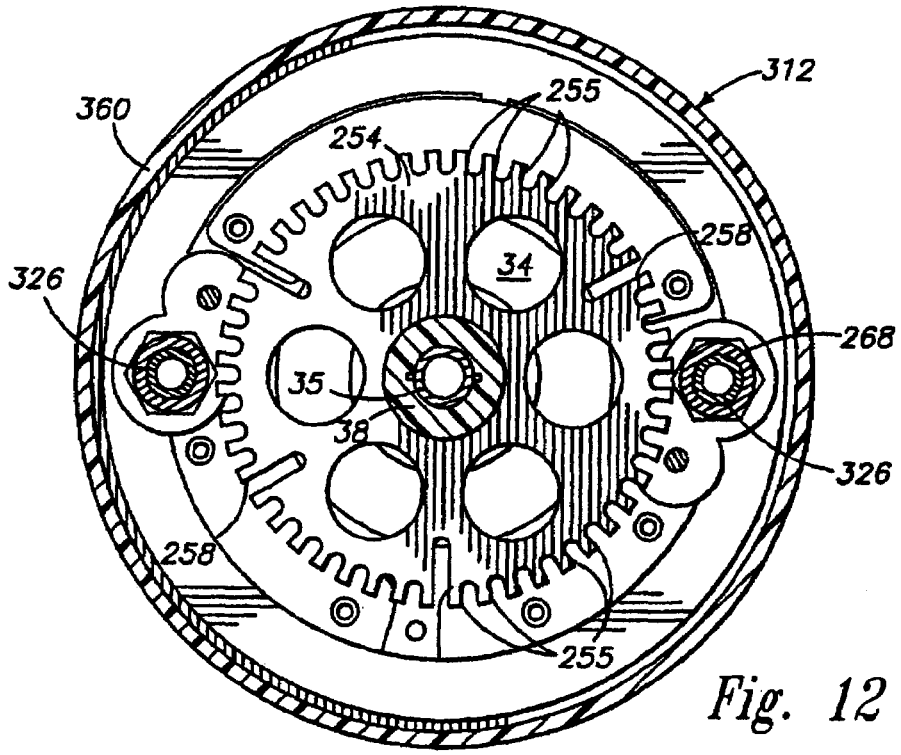
FIG. 12 is a sectional view taken along line 12—12 of FIG. 7.
Figure 13:
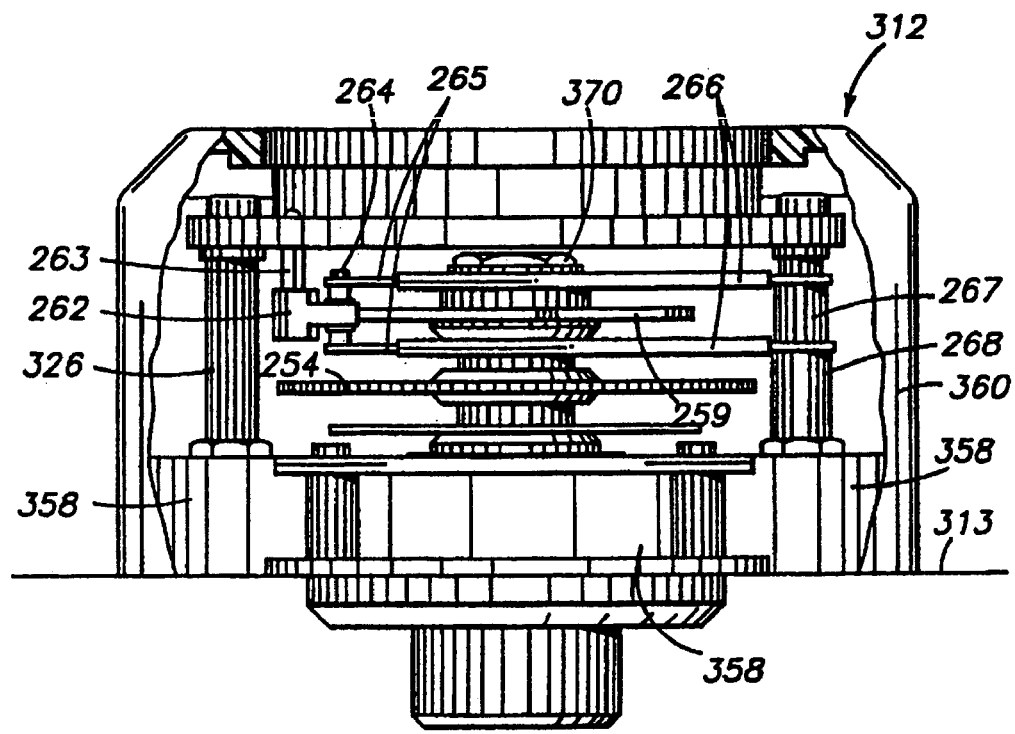
FIG. 13 is a sectional view taken along line 13—13 of FIG. 11.

FIGS. 7 and 11 show a preferred indexing means 250 used to position the wafer support, motor and other rotatable parts forming the rotating assembly of the processing head drive. Rotor positioning or indexing mechanism 250 includes a multi-sided cammed rotor plate 259 mounted to rotate with motor shaft 353 using shaft spacers 271, 272 and 273 held between the motor and end nut 370. The cam plate 259 has a plurality of sides equal in number to the number of fingers 334. Each side of rotor plate 259 has a curved edge configuration (shown in FIG. 11). The curved configurations of each of the three side segments are sloped relative to a circle defined by axis X-X. The curves slope from high points 252 at the adjoining ends of the side segments toward central low points 253. The central low points serve as a detent when engaged by an edge engagement roller 260 which is controllably forced inward. When motor 359 is inoperative and drive shaft 38 is freely rotatable, the inward force of roller 260 causes rotor plate 259 to pivot to bring the rotating assembly into an angular position which centers roller 260 within a low point 253 of the cammed rotor plate, as shown in FIG. 11.

Roller 260 is mounted at one end of a crank arm 262. Crank arm 262 is pivotally supported on a supporting shaft 263 depending from the cap mount 327 (see FIG. 13). The opposite end of crank arm 262 includes a pivotal connection 264 at which are joined the outer ends of two parallel pneumatic piston rods 265 that are part of two parallel pneumatic ram assemblies 266. The remaining ends of the rams 266 are pivotally mounted in parallel using spacers 267 and 268 which extend over spacer shaft 326.

The pneumatic rams 266 are normally spring biased into retracted positions wherein roller 260 is radially clear of the cammed rotor plate 259. When the rotor assembly stops rotation and indexing of the wafer plate 30 is desired, the small pneumatic rams 266 are extended to force roller 260 radially inward against the edge of rotor plate 259 to thereby position the rotor as shown in FIG. 11. The detent assures that the fingers 40 are angularly indexed when stationary to thereby meet operational requirements of the associated robotic wafer transfer unit 210.

A motion monitoring assembly is also advantageously provided within processing head 312 for measuring the speed and direction of rotation of the wafer plate 330 about the rotational axis X-X. The motion monitoring assembly includes a rotor indicating element, such as rotor indicator disk 254. Indicator disk 254 is provided with a series of peripheral notches 255 which intermittently pass and interrupt two radially spaced optical beams. FIG. 7 shows optical emitter 256 and optical detector 257 between which the optical beams pass. The large notches 258 are utilized to provide confirmation of the proper stationary positioning of the rotating assembly. The inclusion of one asymmetric large notch also allows direction of rotation to be determined. The small notches 255 interrupt the radially outward optical beam to provide an indication of angular speed.

FIG. 7 shows that the processing bowl assembly 314 is advantageously constructed using a first or outer processing bowl piece 371 which forms the basic structure of the bowl assembly. Outer processing bowl piece 371 is advantageously made of polyvinyl chloride plastic or other suitable materials. The outer processing bowl piece 371 is cylindrical in basic shape with a side wall 271 and bottom wall 272. An angularly shaped second or inner bowl piece 372 is mounted within the outer bowl piece and forms an annular liner along the side wall of processing bowl assembly 314. The inside bottom of the outer processing bowl is also preferably lined with a third bowl piece or bottom wall liner 390. The inner bowl piece and bottom wall liner are made from materials suitable for direct contact with the HF or other processing chemicals used in the processing chamber 316, preferably TEFLON or other suitable fluoropolymer.

The top edge and outer periphery of the processing bowl assembly can advantageously be provide with a fourth piece or bowl lip piece 366 which forms an outer ring covering the upper edge of the processing bowl. The bowl lip piece provides a seat upon which the processing head cover 313 rests when assembled with the processing bowl. The processing head ring 367 fits along the inner diameter of lip piece 366 and serves to more precisely locate the parts relative to one another.

The second bowl piece has a shoulder 373 which bears upon the upper surface of the outer bowl piece 371. The outside surface of second bowl piece 373 has an exhaust distribution chamber channel 376 formed therein extending around portions of the piece. A web 374 is formed by an annular extension of the second bowl piece to aid in diffusing an exhausting vacuum which is connected to enter at port 377 between the web 374 and the interior surface of main bowl piece 371. A convoluted exhaust chamber 375 is formed between the interior wall of the outer piece 371, about web 374 and within an axially extending groove 275. Groove 275 extends upwardly and applies a controlled exhausting vacuum pressure along the periphery of wafer support plate 339. A drain port is provided from the exhaust chamber 375 at fitting 378 to allow removal of any vapors which condense within chamber 375. Exhaust chamber drain fitting 378 also serves as an overflow drain for chemical chamber 389 via overflow passage 277.

The second processing bowl piece also has an inner portion 380 which has an upper lip 381 formed along a septum 382. Lip 381 extends inwardly to form a constricted passage with flange 362 of the rotatable wafer support plate 339. This serves to help distribute the controlled exhausting vacuum about the periphery of the upper processing chamber 316. Below septum 382 the interior surface of the inner portion 380 extends downwardly and inwardly to form a lower sealing lip 383 along an intersection with an intermediate interior shoulder 384. The sealing lip 383 is directed inwardly and downwardly to seal against a movable processing bowl plug 385 which forms the bottom of the upper processing chamber 316.

The second processing bowl piece 372 is also advantageously provided with a circumferential groove 278 which receives an annular mounting ring or ring pieces 279. Ring 279 receives fasteners (not shown) which extend upwardly through the bottom wall 272 and bottom liner 390 to securely hold the second bowl piece, bottom liner, and outer bowl piece together in an assembly. Groove 278 can also advantageously be adapted to receive an O-ring 280 for sealing between the outer bowl and second bowl piece.

The processing bowl plug 385 is disk-shaped and extends across the processing chamber immediately below the wafer 20 supported by wafer support plate 339. An upper surface 386 of the plug 385 is domed, such as from a central point outwardly, to facilitate drainage of fluids toward the periphery. The plug is advantageously mounted for upward and downward relative motion to controllably form a fluid-tight seal between peripheral regions of the upper surface 386 and the sealing lip 383 on the processing bowl liner 380. Plug 385 works relative to the sealing lip 383 of the second bowl piece 372 to form a vapor phase control valve which controls the communication of processing vapor between the subjacent chemical chamber 389 and wafer processing chamber 316.

Plug 385 is preferably mounted atop a flexible bellows 388 which is advantageously in an integral formation with the plug to minimize sealing problems. The plug and bellows is preferably made from TEFLON. The bellows allows controlled upward and downward motion while providing resistance to significant lateral motion. Plug 385 and connected bellows 388 are moved upwardly and downwardly by three angularly spaced valve plug actuators 394 which are preferably pneumatically operated. Each plug actuator has a throw rod 395 which is connected at its upper end to an enlarged boss which is welded to a retaining ring 283. Pressurized gas is controllably and alternatively supplied to each side of an internal piston 285 to drive the throw rod upwardly and downwardly. Mounting ring 283 mounts beneath the plug using a bayonet or other suitable mechanical connection. A snap ring or other retainer 284 can also be used to connect the mounting ring to the chemical chamber valve plug. A spring 286 biases the plug closed in case pneumatic pressure is lost.

As shown, plug 385 is also provided with a sensor fitting such as thermocouple compression fitting 397 for allowing monitoring of the temperature within the processing chamber adjacent to the wafer 20. A thermocouple or other temperature sensor 399 is mounted within passage 398 of the fitting.

The bottom of bellows 388 is connected to the bottom of the processing bowl assembly using fasteners (not shown) which extend through holes 393 formed in the bottom wall of the outer processing bowl 371. Such fasteners also extend through corresponding holes formed in the bottom liner 390 and bottom flange 391 of the bellows, and are secured to a stainless steel backup ring 392. The bottom flange of the bellows rests in an annular shoulder formed along the upper inside surface of the ring-shaped bottom liner 390.

An annular liquid phase chemical trench or chamber 389 is defined between the outside of the bellows, the inside of the second processing bowl piece 372 beneath shoulder 384 thereof, and above portions of the bottom liner 390. The upper surface of the bottom bowl liner 390 is sloped to provide drainage from the annular chemical trench toward an chemical trench drain 396. Drain 396 is connected to a reservoir and recycle system the same or similar to that connected to drain 50 of FIG. 1. Etchant or other liquid phase chemicals are supplied to chemical trench 389 via a chemical trench supply port 549 shown in FIG. 26) which is constructed the same or very similar to drain 396 and positioned approximately 180° of arc therefrom on the opposite side of the chemical trench. FIG. 7 has been modified to show the construction of fitting 378 instead. Liquid phase chemical flows in the inlet and divides into two opposing semicircular flows to drain through drain 396.

Figure 15:
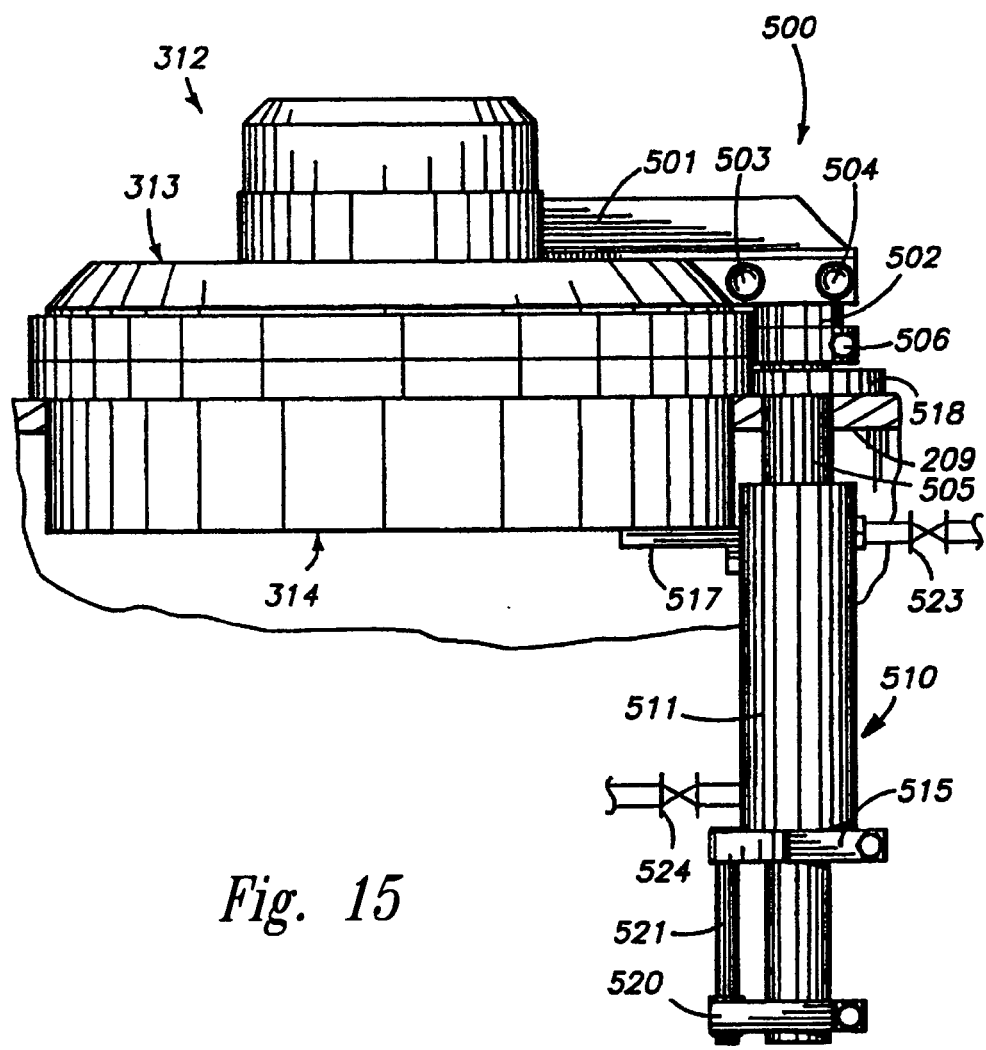
FIG. 15 is an elevational view showing the processing head and base of FIG. 7 with associated head movement mechanisms.

FIG. 15 shows processing head 312 is supported in a cantilevered arrangement using a processing head support 500. Processing head support 500 includes an upper arm 501 which is substantially horizontal and connected to the processing head cover 313. The outer end of arm 501 is pinned to a support bracket 502 using pins 503 and 504. Bracket 502 is mounted to a vertical support shaft 505 using a detachable bolt 506 or other suitable faster.

Vertical support shaft 505 is hollow and cylindrical although other forms are also possible. Shaft 505 is mounted for vertical movement to raise and lower the wafer support head assembly 312 up and down to allow access for loading and unloading wafers and to close the processing chamber for use. The vertical movement of shaft 505 can be accomplished using several different configurations. As shown, shaft 505 is mounted within and forms a part of a vertical operator 510 which allows controlled axial movement of the shaft.

Figure 16:
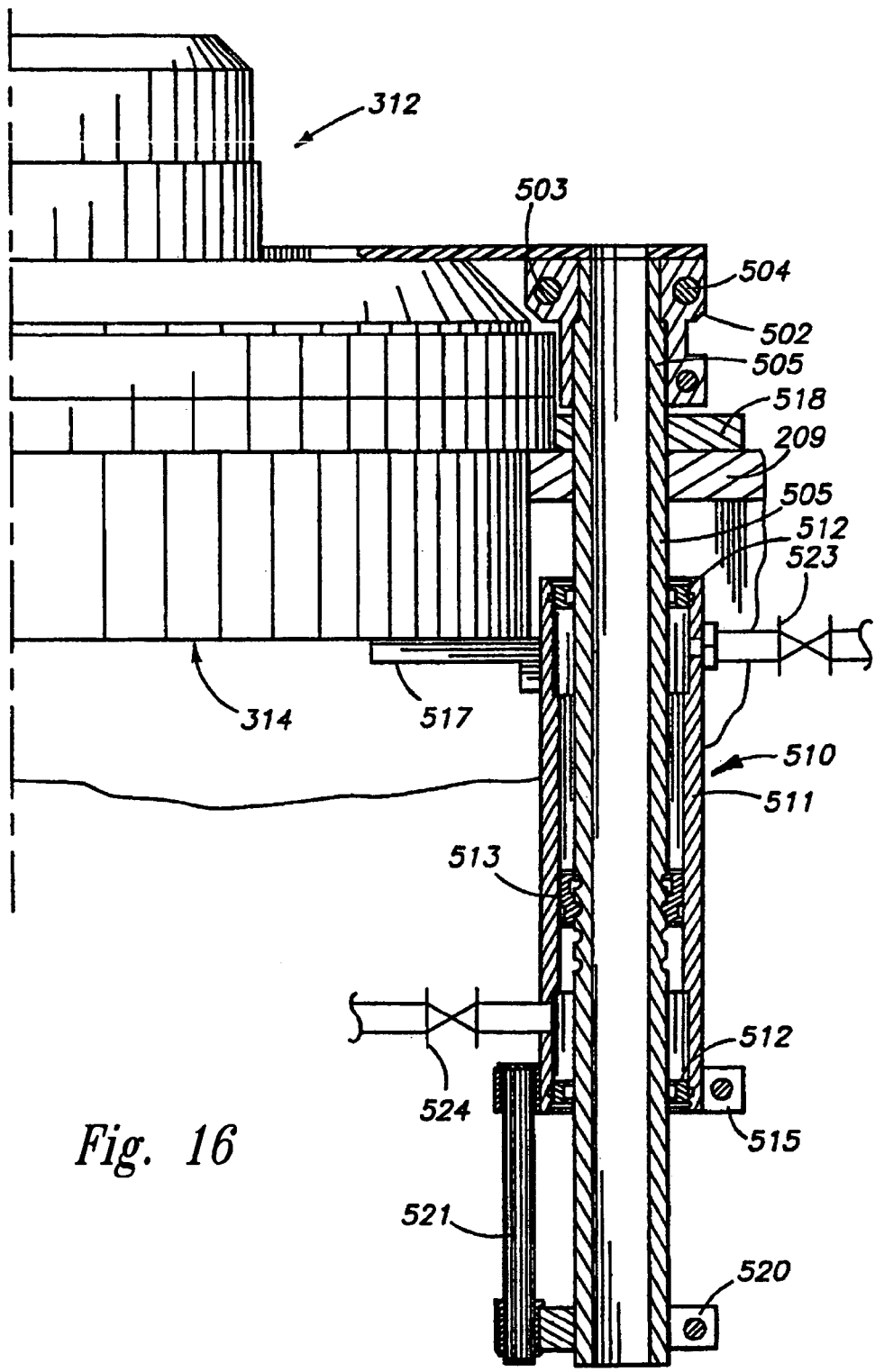
FIG. 16 is an enlarged partial sectional view of the mechanisms shown in FIG. 15 with the processing head in a lowered position.

Operator 510 includes an outer operator tube 511 which receives the shaft 505 therethrough. The upper end of operator tube 511 is mounted to the bowl assembly 314 using bracket 517 to aid proper alignment. The lower end of tube 511 is mounted using bracket 515 to the framework base 202. Operator 510 also includes end seals 512 which seal between shaft 505 and tube 511 to allow pressurization within the tube interior about the exterior of shaft 505. Shaft 505 is fitted with an annular piston element 513 which is received within grooves formed on the shaft at a central location. The piston element slides within the bore of operator tube 511 in response to controlled gas pressure applied via valves 523 or 524 and associated upper and lower pressurization ports in tube 511. This provides a double acting pneumatic ram with shaft 505 and attached piston element 513 acting as the moving element. FIG. 16 shows the processing head in a lowered processing position and FIG. 17 shows the processing head in a raised position used for loading and unloading wafers.

Figure 17:
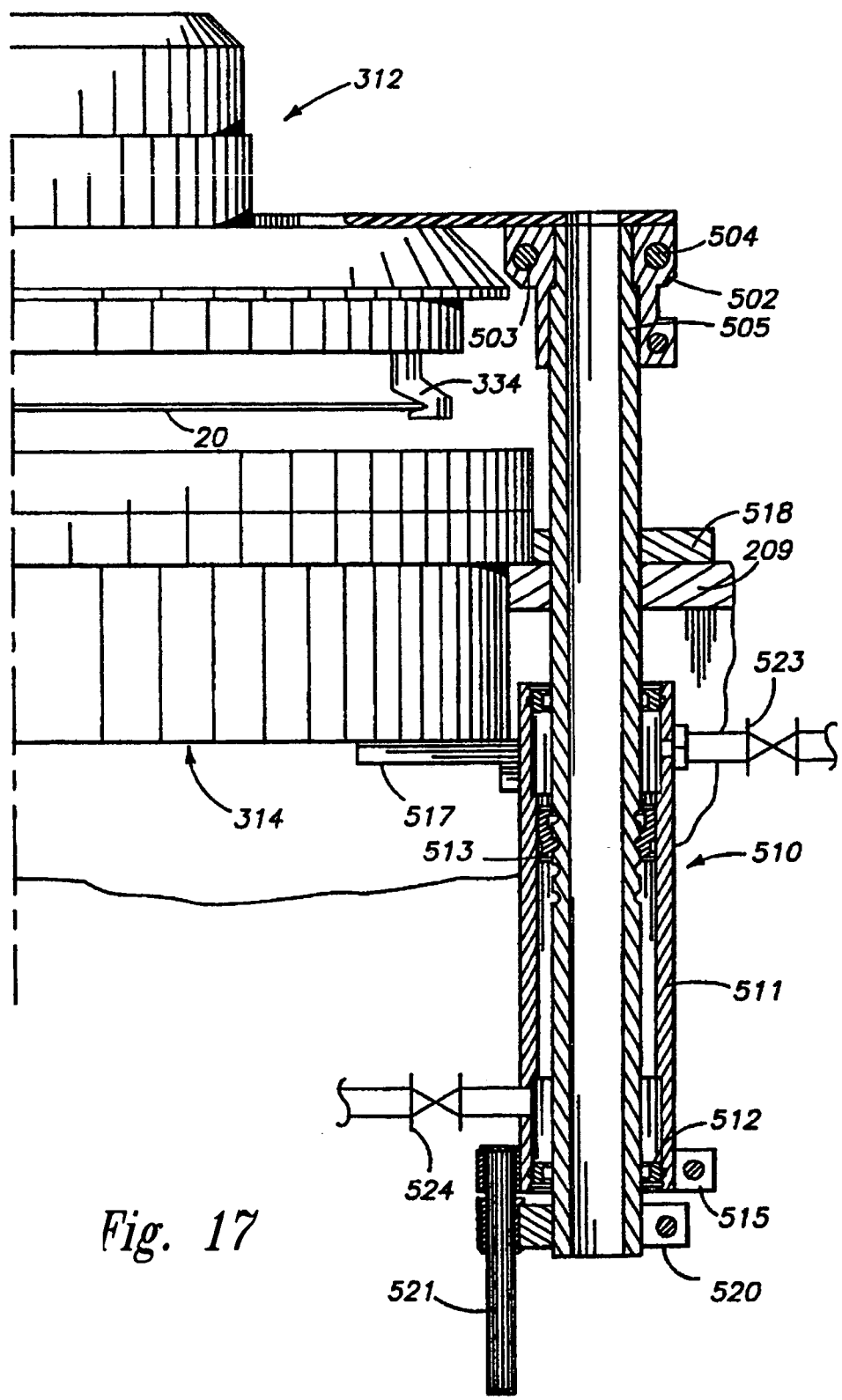
FIG. 17 is an enlarged partial sectional view of the mechanisms shown in FIG. 15 with the processing head in a raised position.

FIGS. 15–17 show that the lower end of shaft 505 is advantageously fitted with a bracket 520 which moves with the shaft. A stationary bracket 515 is mounted to the framework base 202 and supports the lower end of operator 510. Bracket 515 also supports a stationary guide rod 521. The moving bracket 520 on the end of shaft 505 slides along guide rod 521 as shaft 505 moves upwardly and downwardly in controlled response to fluid pressure supplied to operator 510. This guide rod arrangement serves as an anti-rotation device preventing rotation of shaft 505 within tube 511 to thereby maintain the processing head 312 in proper alignment with the processing bowl assembly 314. A guide bearing 518 on the framework base also surrounds and slidably receives shaft 505 to help stabilize the shaft.

Figure 18:
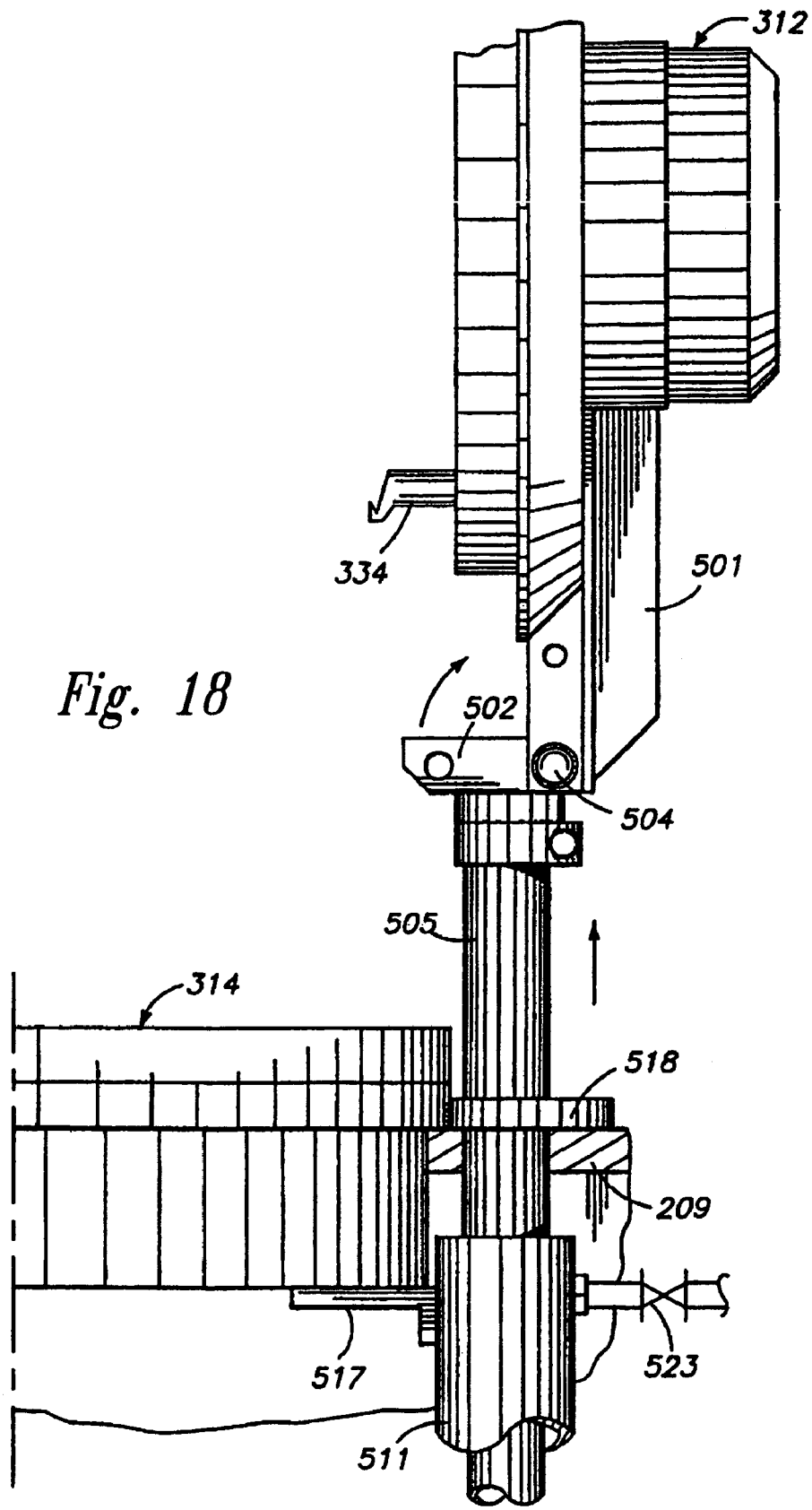
FIG. 18 is an elevational view of the mechanisms shown in FIG. 15 in a further raised position with the processing head tilted backwardly.

In addition to the vertical movement that can be imparted to processing head 312 by operation of the pneumatic cylinder assembly 510, processing head 312 can also be pivoted about a movable horizontal axis to tilted positions such as shown in FIG. 18. This is accomplished manually by first removing inner pin 503 which connects upper arm 501 to bracket 502. Removal of pin 503 frees the processing head 312 for movement about the horizontal pivot formed by the remaining pin 504. Processing head 312 can be pivoted into the position shown in FIG. 18 to permit substitution or repair of the wafer plate 330 and associated equipment described above.

Removal of the second pin 504 permits replacement of the entire processing head 312 on the upper end of shaft 505 when such substitution is desired. The electrical and fluid lines (not shown) between the processing head 312 and the interior of processing machine framework 202 are flexible and provided with conventional detachable connectors (not shown) to facilitate replacement and repair. Such lines are preferably extended through the hollow support shaft 505.

Figure 19:
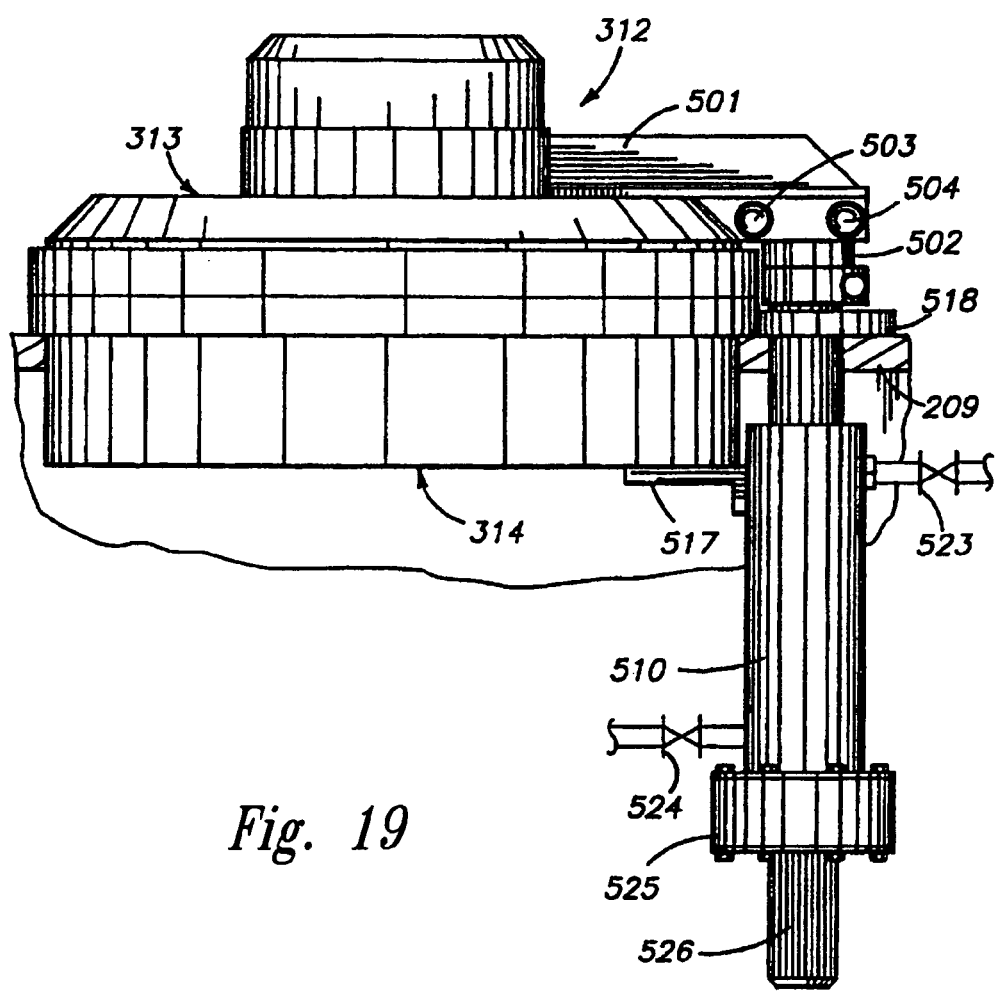
FIG. 19 is an elevational view similar to FIG. 15 with an alternative type of processing head mounting mechanism.

In some applications it may be desired to swivel the processing head above the vertical axis of shaft 505. Such pivotal movement can be accomplished using a structure such as illustrated in FIG. 19, wherein a rotary actuator 525 has been substituted for the vertical guide rod 521 and mounting 515. Rotary actuator 525 can be a pneumatic, hydraulic or electric motor designed to turn processing head 312 about the axis of shaft 505 to any desired angular position. The rotary actuator is mechanically connected to shaft 505 using interconnecting splines 526 formed on the shaft. The splines accommodate vertical movement of the shaft in response to actuation of operator 510.

Radiative Particle Volatilization Subsystem

FIGS. 20–23 show in greater detail the radiative particle volatilization subsystem 400 which can advantageously be employed to further process wafer 20. Volatilization subsystem 400 beams a diffuse blanket of relatively intense infrared radiation to uniformly heat wafer 20. The volatilization processing unit is advantageously used to eliminate fine particulate by-products which can result under certain processing conditions. The by-product particulates are of uncertain chemical composition but are suspected to be one or more compounds formed of hydrogen, silicon and fluorine which results from competing side reactions to the basic etching process of the silicon dioxide by hydrofluoric acid. One possible compound which may form a part or all of the indicated particulate is $H_2S_1F_6$. Alternatively, the particles may be wholly or partly formed by other compounds. Nonetheless, it is desirable to further process wafers under some processing systems to eliminate such particle formation or assure that any particles have been removed before sending the processed wafers onto other processing.

The volatilization processing according to this invention is advantageously done by heating the wafer or other particulate bearing surface of the wafer to a suitable volatilization temperature. The inventor's research indicates that current forms of particulate haze need post-etching wafer temperatures greater than 100° C. for effective and efficient removal. The particulate removal heat volatilization processing is time and temperature dependent. At lower heat processing temperatures the processing time is increased. At higher heat processing temperatures the processing time is decreased. Wafer post-etching heat processing temperatures are preferably in the range of 100°–300° C., more preferably 100°–200° C., most preferably about 130° C. for the HF etching by products. At a volatilization temperature of 100° C. approximately 2 minutes are needed to remove HF etching by-products. At 130° C. approximately 1 minute is needed.

The post-etching heat processing of this invention is advantageously done by heating in a non-contacting manner to minimize the risks of applying contaminants to the wafer or other semiconductor device being processed. A preferred method for performing the post-etching heating is by exposure of the wafer or other semiconductor device to heat generating radiation. This is advantageously done by exposing the device being processed to an adequate intensity of infrared or visible radiation. The radiation is preferably beamed onto the wafer in a relatively uniform manner to prevent localized temperature variations and maintain relatively uniform temperature rise across the wafer.

Figure 20:
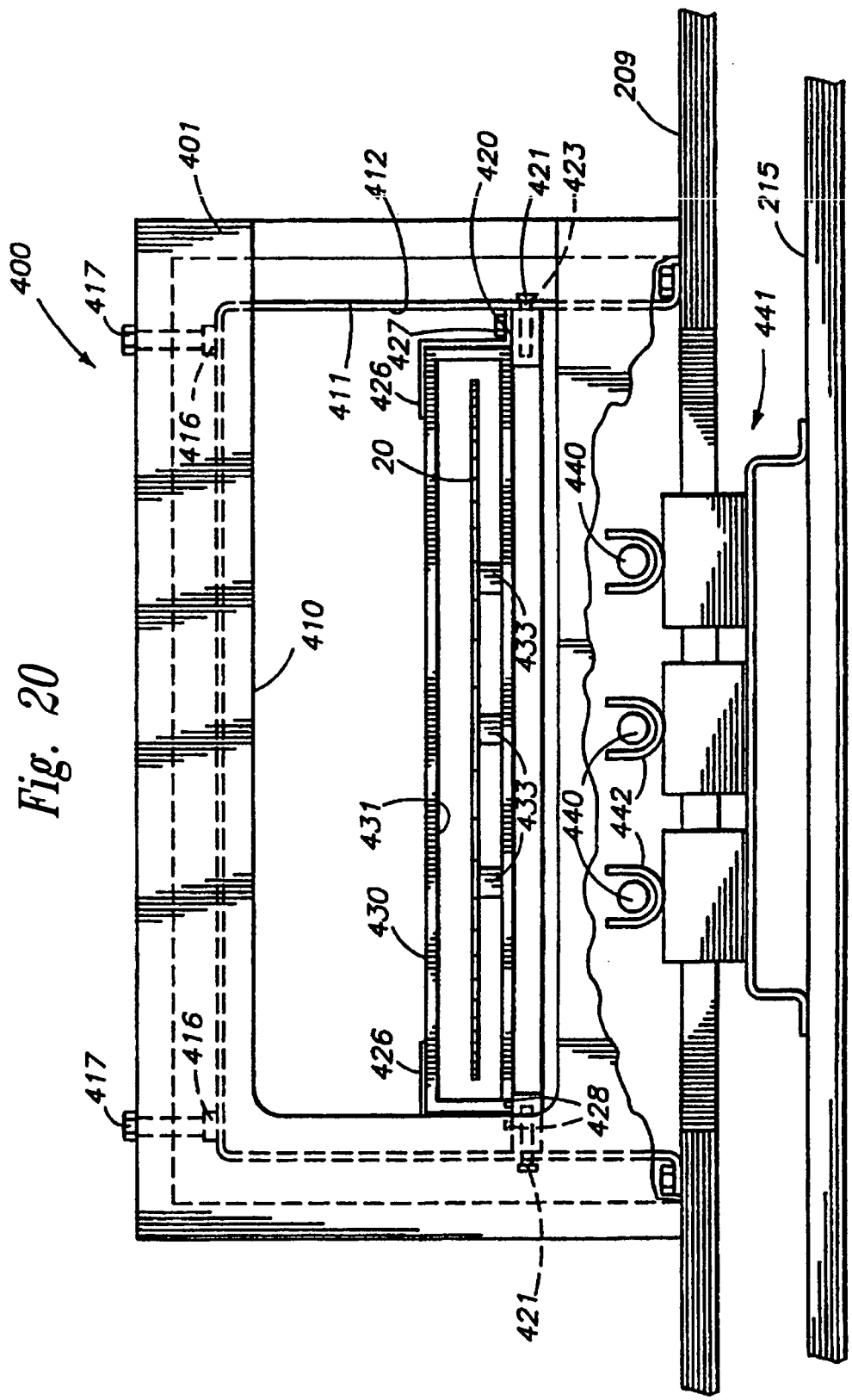
FIG. 20 is an enlarged elevational view showing the entry side of a heat processing subunit forming a part of the processing unit of FIG. 3. A portion of FIG. 20 has been shown broken away to reveal internal components.
Figure 21:
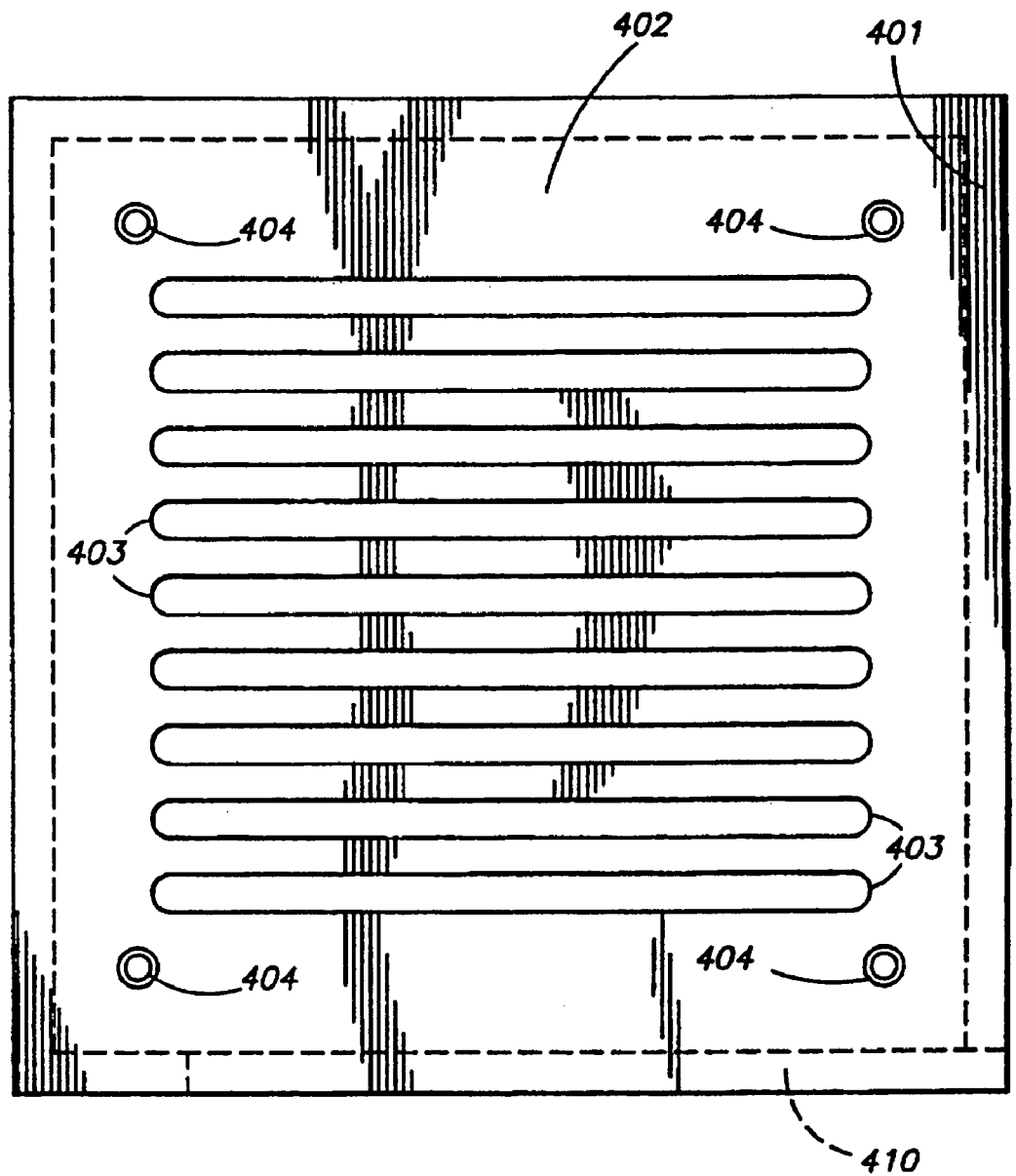
FIG. 21 is a top view of the heat processing unit shown in FIG. 20.

The radiative volatilization processing subsystem 400 includes a protective cover 401 which can be formed from polypropylene or other suitable materials in a variety of configurations. As shown, cover 401 is substantially a box with an open bottom and a side access opening 410 (see FIG. 20). Side access opening 410 allows wafer 20 to be positioned within the radiative volatilization processing unit 400 for appropriate treatment as explained elsewhere herein. FIG. 21 shows that top wall 402 advantageously includes a plurality of heat escape openings 403. Heat escape openings can be formed in a variety of configurations including the elongated slots shown. FIG. 21 also shows that top wall 402 is preferably provided with a suitable number of connection apertures 404. Apertures 404 receive bolts 417 or similar fasteners therethrough for holding the cover 401 in place.

Figure 22:
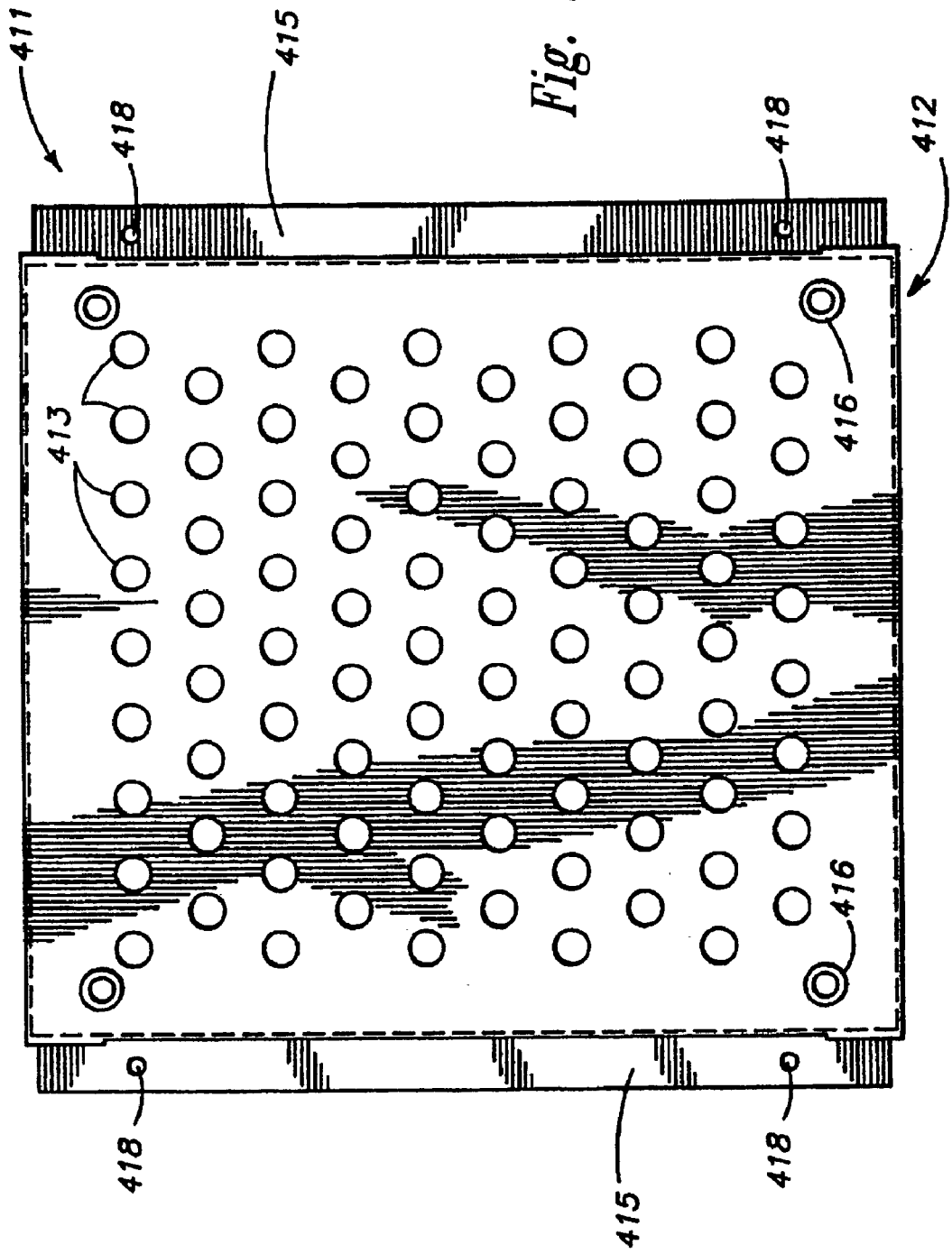
FIG. 22 is a top view in isolation of a radiant heat shield which forms a part of the heat processing unit of FIG. 20.
Figure 23:
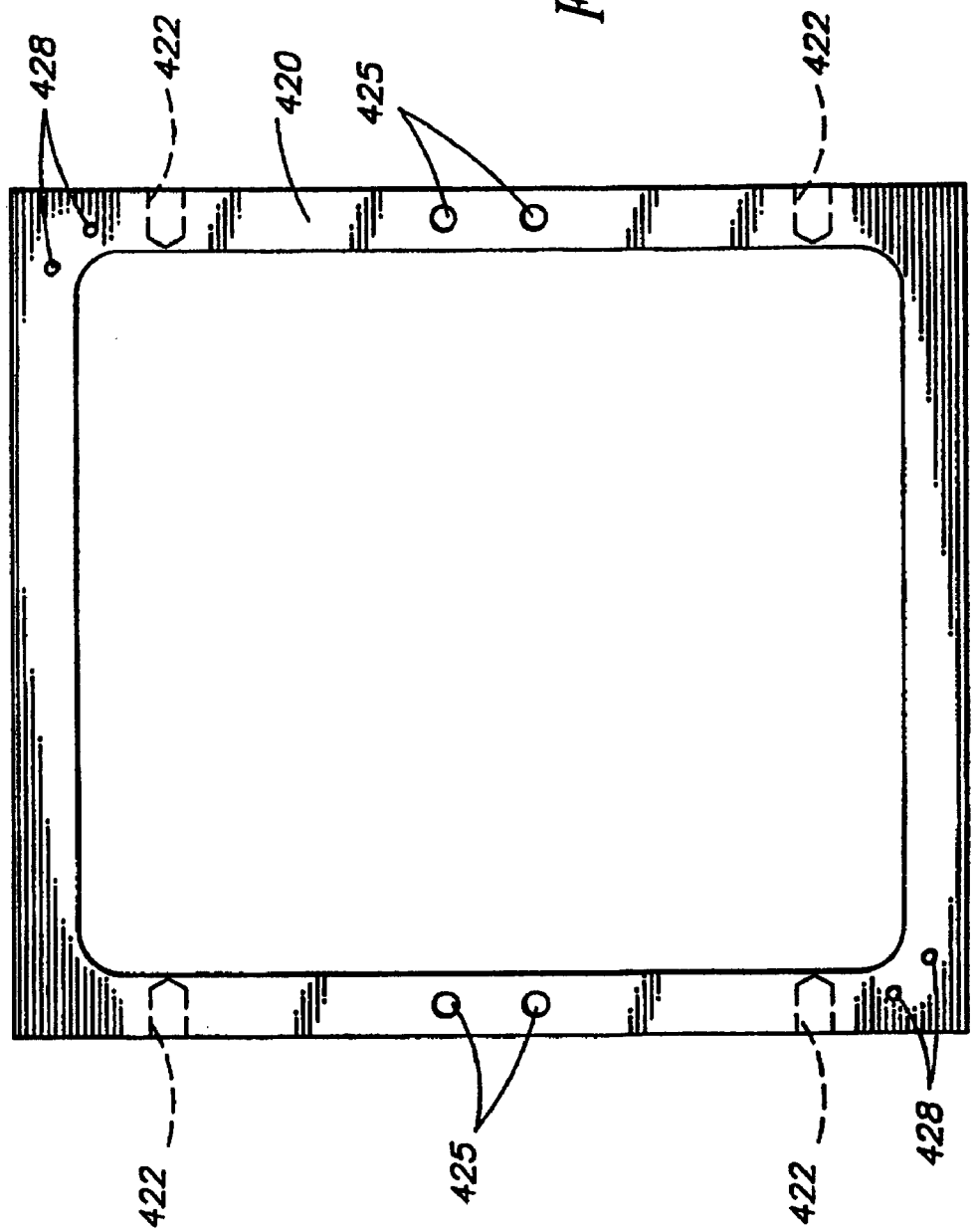
FIG. 23 is a top view in isolation of a support ring which forms a part of the heat processing unit of FIG. 20.

Volatilization processing subsystem 400 also advantageously includes an internal heat dissipation and radiation shield 411. FIG. 22 shows shield 411 in isolation. Shield 411 also serves as a frame to adjustably mount a ring-shaped support platform 420 which is shown in isolation in FIG. 22. The heat dissipation shield and frame 411 is substantially formed as a box with an open bottom and an access opening 412 in the side wall to allow positioning of wafer 20 into the unit. The internal combined heat dissipation shield and frame is preferably made from a heat conductive metal, such as aluminum. A plurality of heat escape holes 413 are formed through the top wall of shield 411 to more uniformly release heat which builds up within the shield during operation. The heat dissipation shield and frame 411 is also advantageously provided with side flanges 415 at the bottom edges along two sides to facilitate mounting of the unit to the top deck 209 using suitable fasteners which extend through holes 418 in the flanges and into deck 209. The top of the heat dissipation shield is provided with weld nuts 416 which receive fasteners 417 to mount the cover thereto.

The support ring 420 is mounted within the heat dissipation shield and frame 411 using a plurality of pins 421 which extend through a series of vertically spaced platform mounting holes 423 formed in the side walls of shield 411. The pins 421 extend through the side walls of shield 411 and into mounting pin receptacles 422 (see FIG. 22) formed in the edges of the ring-shaped platform 420. This construction allows the height of the platform to be adjusted for varying needs and processing parameters. The platform is advantageously made of aluminum.

The volatilization subsystem 400 also advantageously includes a wafer protection vessel 430 which is supported upon the adjustable ring-shaped platform 420. Vessel 430 is relatively transparent to the wavelength of radiation used to treat wafer 20. In the preferred embodiment the vessel is made of quartz which is relatively transparent to infrared radiation. The vessel is open along the side wall to form a wafer vessel access opening 431. The access opening 431 is positioned and oriented to be coincident with access openings 410 and 412. Vessel 430 is otherwise closed. A set of wafer support stands 433 are advantageously included within the wafer chamber defined within vessel 430 to provide limited contact support to preferably the back or unprocessed side of wafer 20. As shown, the stands 433 are also made of quartz. They can be provided in various numbers and configurations to provide adequate support for wafer 20. Vessel 430 is also preferably provided with a fitting (not shown) which allows a nitrogen or other suitable gas to be supplied to the interior wafer chamber. Such gas purging is most advantageous for impeding migration of contaminants into the wafer chamber, but may also be desired for other purposes such as preventing oxidation or performing chemical treatment.

The ring-shaped platform 420 is also advantageously provided with apertures 425 which receive fasteners 427. Fasteners 427 secure vessel hold-down brackets 426 used along both sides of vessel 430. The upper surface of platform 420 is further provided with corner locating pins 428 which extend upwardly to receive the corners of vessel 430 therebetween and maintain the location of the vessel relative to platform 420.

Volatilization subsystem 400 further includes a source of suitable radiation used to treat wafer 20. FIG. 20 shows a series of 3 spaced infrared lamps serving as the treating radiation emitters. The lamps are preferably quartz halogen type having power in the range of approximately 100–1000 watts, more preferably 500 watts each. The exact power requirements will vary dependent upon the particulates being volatilized and the size and relative spacing distance of the wafer being treated. The lamps are held within a fixture 441 which serves as the radiation emitter support. The lamp support fixture is advantageously mounted on a framework subdeck 215 which is mounted to base 202. The lamp fixture preferably includes reflectors 442 for directing the infrared or other radiation toward the wafer held in vessel 430. The lamp fixture is also preferably purged with nitrogen or other suitable gas to help dissipate heat.

Electrical and Fluid Handling Subsystems

Figure 24:
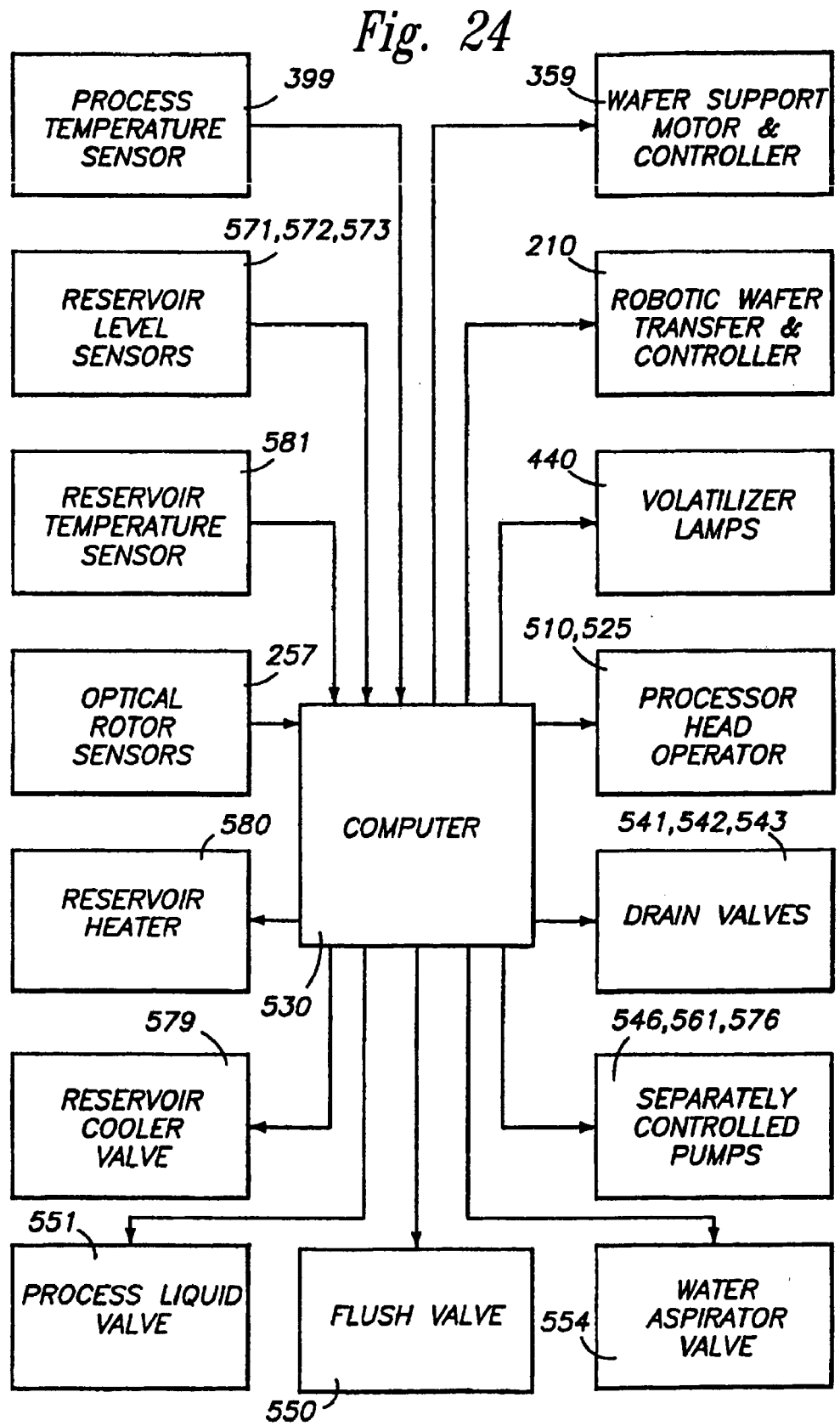
FIG. 24 is an electrical schematic diagram showing portions of a preferred control system used in the processing machine of FIG. 3.
Figure 25:
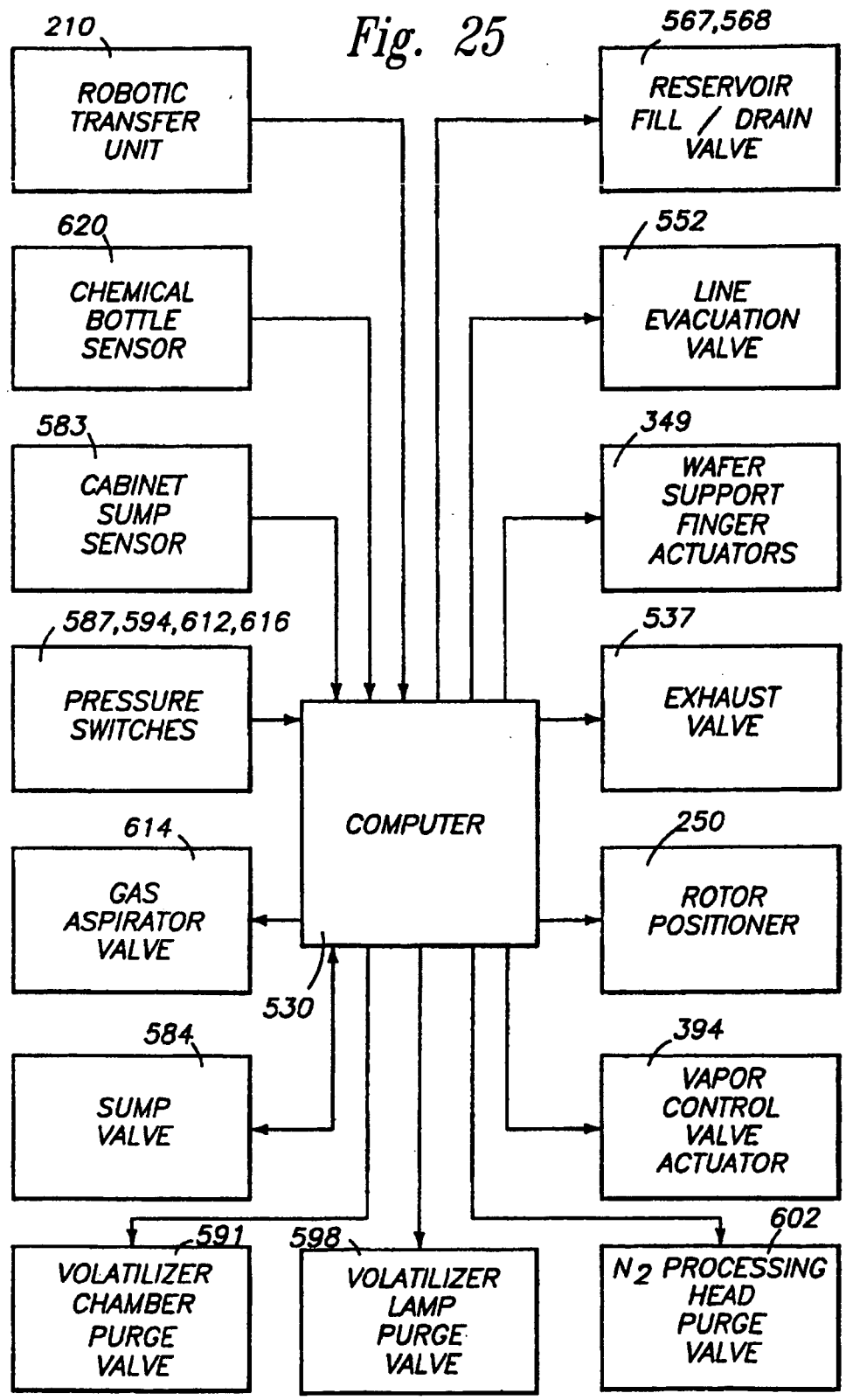
FIG. 25 is an electrical schematic diagram showing additional portions of a preferred control system used in the processing machine of FIG. 3.

FIGS. 24 and 25 show block diagrams indicating the basic control system used to operate automated processor 200. The system is operated with a system controller which is preferably a PC-type computer 530 or other suitable controller. Various system inputs and outputs are communicated to and from the computer as indicated. In general the output signals are translated via electrical solenoids which control a pneumatic solenoid which operates a valve or other system component. Alternatively, the operation of electrical components is accomplished using an electrical solenoid controlled switch without the need for a pneumatically operated solenoid. The operation and control of the various components has been integrated into the description otherwise given herein and will not be repeated.

Figure 26:
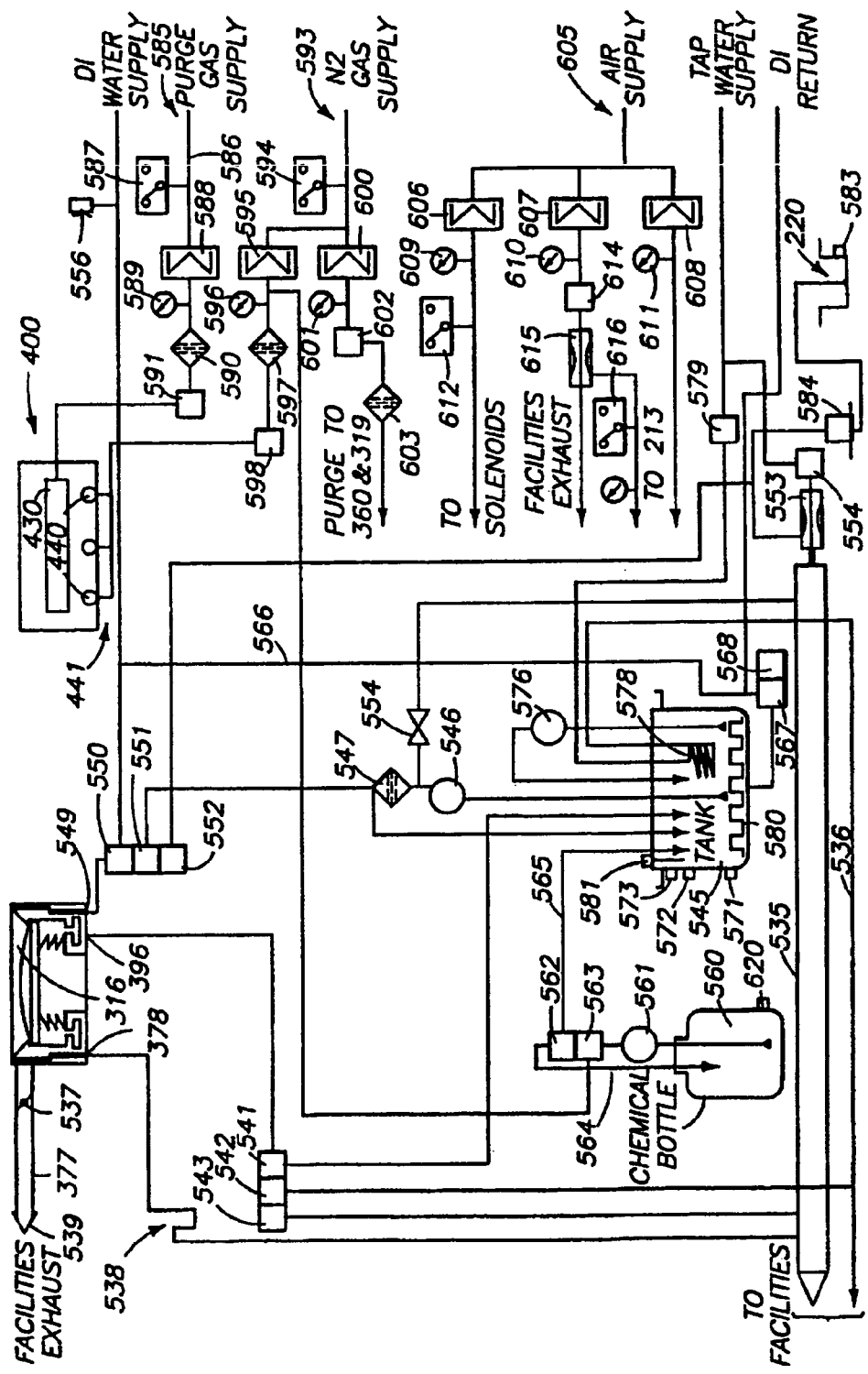
FIG. 26 is a schematic diagram showing fluid handling aspects of the processing unit of FIG. 3.

FIG. 26 shows a preferred form of fluids handling subsystem which is used in processor 200. The chemical processor subsystem 300 is shown in schematic form. Vacuum distribution chamber drain 378 is connected via a gas trap 538 to a chemical drain 535 which is appropriate for handling the HF or other processing chemical used in the chemical processor subsystem 300. The chemical chamber 389 is drained through drain fitting 396 to a valve manifold assembly including valves 541–543. Valve 541 serves to controllably direct liquid from drain 396 to a tank or reservoir 545 for drain-down and recycle purposes. Valve 542 serves to controllably direct liquid from drain 396 to an industrial waste drain line 536, to allow disposal of non-corrosive rinse water or similar waste streams. Valve 543 directs the outflow from chemical chamber 389 to the chemical drain line 535 for disposing of spent processing chemical.

Processing chemical is supplied from reservoir 545 via a reservoir outflow pump 546 which passes the processing chemicals through filter 547. The lower, upstream side of filter 547 is advantageously provided with a drain line 548 having a manual stopcock or other suitable drain control valve 554 which outflows to the chemical drain line 535. The upper, downstream side of filter 547 is preferably provided with a vent line 558 which returns to the tank 545. Pump 546 is made with TEFLON or other parts suitable to the corrosive service. Pump 546 is preferably like the pump described in U.S. patent application Ser. No. 464,101 which is incorporated by reference hereinto. The filtered chemicals pass into a manifold including valves 550–552. Valve 551 controls the flow of processing chemical delivered by pump 546 to the chemical chamber 389 via an inlet 549 (not shown in FIG. 7). Valve 550 controls the flow of deionized water (DI) from facilities services for purposes of rinsing the chemical chamber and processing bowl for maintenance and the like. A washdown gun 556 is also plumbed to the DI water line to allow manual maintenance washing of various system components. Valve 552 controls application of vacuum pressure to the manifold and associated conduits to assist in removing fluids therefrom for maintenance. The vacuum is generated using an aspirator 553 which operates using tap water which is passed through the aspirator and into the chemical drain line 535. The operation of aspirator 553 is controlled by a tap water aspirator valve 554 which controls the flow of water through the aspirator. Aspirator 553 also is connected to suck liquids from the bottom of the cabinet base at a cabinet sump 220. A sump liquid sensor 583 indicates the presence of liquids in the sump and the controller activates the sump valve 584.

Reservoir 545 is supplied with chemical or chemicals, such as HF, through one or more chemical supply lines. As shown, HF is supplied from an HF chemical supply bottle 560. Bottle 560 is monitored by a low level sensor 620 which indicates the need for replacement of the bottle. Chemical is pumped from chemical bottle 560 using a metering pump 561 made with parts made of TEFLON or other suitable materials for the corrosive service. Pump 561 is preferably substantially like the pump described in U.S. patent application Ser. No. 464,101 which is incorporated by reference hereinto. The outflow from pump 561 is directed to a valve manifold including valves 562 and 563. Valve 562 controls chemical delivery to reservoir 545 via line 565. Valve 563 controls the flow of nitrogen to clear valve 562 and lines 564 and 565. A recycle line 564 returns any chemical not delivered through valves 562 and 563 back to chemical bottle 560.

Reservoir 545 is also supplied with deionized water via line 566 which is connected to the facility DI water supply. Valve 567 controls the flow of DI water to a manifold connected to the drain of reservoir 545. Valve 568 controls whether the reservoir 545 is allowed to drain into the chemical drain line 535. Reservoir 545 is preferably provided with three level sensors 571–573 which indicate whether fluid exists at the particular level at which the sensor is mounted. Sensor 571 indicates low level, sensor 572 indicates that water filling should be stopped, and sensor 573 indicates an over-full condition.

Reservoir 545 is also advantageously provided with a stirring or mixing pump 576 which mixes the contents of the reservoir at all times to maintain homogeneity. Pump 576 is advantageously a diaphragm pump having TEFLON construction.

Reservoir 545 is further provided with a first heat exchanger 578 which is a coiled tube connected to a supply of typically cooling tap water controlled by coolant loop control valve 579. The expended coolant passed through the heat exchanger is suitably handled, such as by disposal in industrial waste line 536. The reservoir is also provided with a second heat exchanger which is preferably in the form of an electric resistance heating coil 580 which controllably heats the reservoir and its processing chemical contents. A tank temperature sensor 581 is included to sense tank temperature and provide temperature information to computer 530 for purposes of controlling heating and cooling operations in the reservoir.

FIG. 26 also shows a first purge gas distribution subsystem 593 which is used to distribute nitrogen or other suitable purge gas having relatively non-reactive or inert properties. Facilities nitrogen or other supplied purge gas is monitored using pressure switch 594. Purge gas going to a first branch of this subsystem is regulated through a first purge gas regulator 595 and the pressure is advantageously measured using pressure gauge 596. The pressure regulated purge gas is then filtered in filter 597 and controlled by valve 598. The outflow from valve 598 is supplied to the lamp fixture 441 powering volatilization chamber lamps 440 to dissipate heat therefrom.

The first purge gas distribution subsystem 593 also includes a second branch which utilizes a second purge gas regulator 600 and associated pressure gauge 601. The outflow from regulator 600 is controlled by valve 602 and filtered through filter 603. The regulated filtered nitrogen is supplied nitrogen purges for the processor head chamber 319 and within cap 360 to reduce or prevent processing vapor migration into the upper portions of the processing head which contains various corrosion susceptible components.

FIG. 26 further shows a second or volatilization chamber gas purge subsystem 585 having a gas inflow line 586 connected to a supply of nitrogen or other gas desired for protecting or treating wafers within the wafer chamber of vessel 430. Line 586 includes a connected pressure switch 587 which detects the pressure in the line and communicates information indicating the line pressure to the controller 530. A pressure regulator 588, downstream pressure gauge 589, and filter 590 are connected between the incoming line 586 and a purge control valve 591 which controllably supplies the regulated and filtered purge gas to the interior of vessel 430.

Processor 200 is also preferably provided with a clean dry air subsystem 605 which is connected to a facilities supply of such gas, or other appropriate gas. The compressed air is divided into three branches each of which is provided with a pressure regulator 606–608 and associated gauge 609–611. The compressed air from regulator 606 is monitored by pressure sensor or switch 612 for low pressure conditions. The outflow from regulator 606 is supplied to a number of electrically controlled, pneumatically operated solenoids which control various control valves as described herein. The flow from regulator 606 is also used to power pumps 561 and 546.

The second branch of the compressed air subsystem utilizes air from regulator 607 which is controlled by valve 614 and passed with an air operated aspirator 615. Air passed through aspirator 615 is preferably connected to a facilities exhaust system to minimize risk of particle contamination within the cleanroom or other processing facility in which processor 200 is employed. Aspirator 615 generates a vacuum which is monitored by pressure switch 616 and pressure gauge 617. The vacuum from aspirator 615 is supplied to the wafer engagement head 213 to provide suction used to hold wafers thereon during transport by the robotic transfer subsystem 210.

The third branch of the compressed air subsystem 605 supplies regulated air to pump 576 which is advantageously pneumatically operated.

Operation of Automated Processor

The operation and associated processing provided by wafer processor 200 will now be described. Incoming wafers 20 are inventoried in the wafer receiver 205 by manual installation of the receiver into receptacle 208 in the cover. The robotic transfer unit removes a desired wafer from the inventory contained in receiver 205 and transfers the wafer into position within head 312 of the chemical processing unit 300. The chemical processor head 312 is raised to allow installation of the wafer adjacent to the wafer support plate 339 using wafer support fingers 334. The wafer support fingers 334 are spread apart to receive wafer 20. After the wafer is positioned within fingers 334, the fingers are contracted inwardly to hold the wafer. The wafer head is then lowered into the substantially sealed relationship illustrated in FIG. 7.

The vapor control valve plug 385 is initially sealed against lip 383. Hydrofluoric acid and water, or other desired processing fluids, are preferably continuously recirculated through the annular chemical chamber 389 using pump 546 and associated recycle subsystem to maintain homogeneity. The desire temperature of the liquid phase reactants is maintained by the controller as sensed by sensor 581 and affected by heat exchangers 578 or 580. Exhaust port valve 537 is normally opened to exhaust any fumes from the processing chamber except while processing vapors are supplied to processing chamber 316. Wafer 20 is rotated in preparation for processing.

Vapor phase chemical processing is initiated by activating plug actuator 394 which retracts plug 385 downwardly to allow vapor phase reactants to move into processing chamber 316 and react with the surface of wafer 20 to thereby etch or otherwise process the wafer. The processing time, temperature, pressure and other parameters are according to the description given hereinabove, or as otherwise desired.

After the wafer has been sufficiently processed with the gas phase reactants then plug actuator 394 is deactivated and the vapor control valve is returned to seating relationship with sealing lip 383. Closure of the vapor control valve isolates the processing chamber from the annular chemical trench. The vacuum exhaust 377 is again activated to remove etchant fumes from the processing chamber 316 to effectively arrest etching of wafer 20. The wafer is then spun for the desired time needed to dry the unit.

After etching or other chemical processing as described above, the processor head 312 is opened using operator 510 and the wafer is removed by transfer unit 210. This is accomplished by lifting the head 312 and then moving the robotic transfer unit to engage the wafer using the engagement head 213. After the wafer is engaged by the transfer unit, the head is operated to release the wafer by operating the wafer support fingers 334 into expanded positions, as explained more fully above. The wafer is then removed from the chemical processor unit 300 and transferred to the radiative volatilization processing unit 400.

The wafer is inserted by the transfer unit into a treatment position within the protective vessel 430 resting upon stands 433. The wafer engagement tool is then retracted and the infrared or other desired radiation emitting lamps 440 are turned on to beam upon the surface of the wafer for times as indicated hereinabove. After the wafer has been sufficiently treated by the radiative treatment subsystem 400, then the robotic transfer unit 210 is used to remove the wafer from vessel 430 and relocate it to the wafer inventory 205 or on to another piece of processing equipment (not shown).

Spray Coating Processing System Generally

Figure 27:
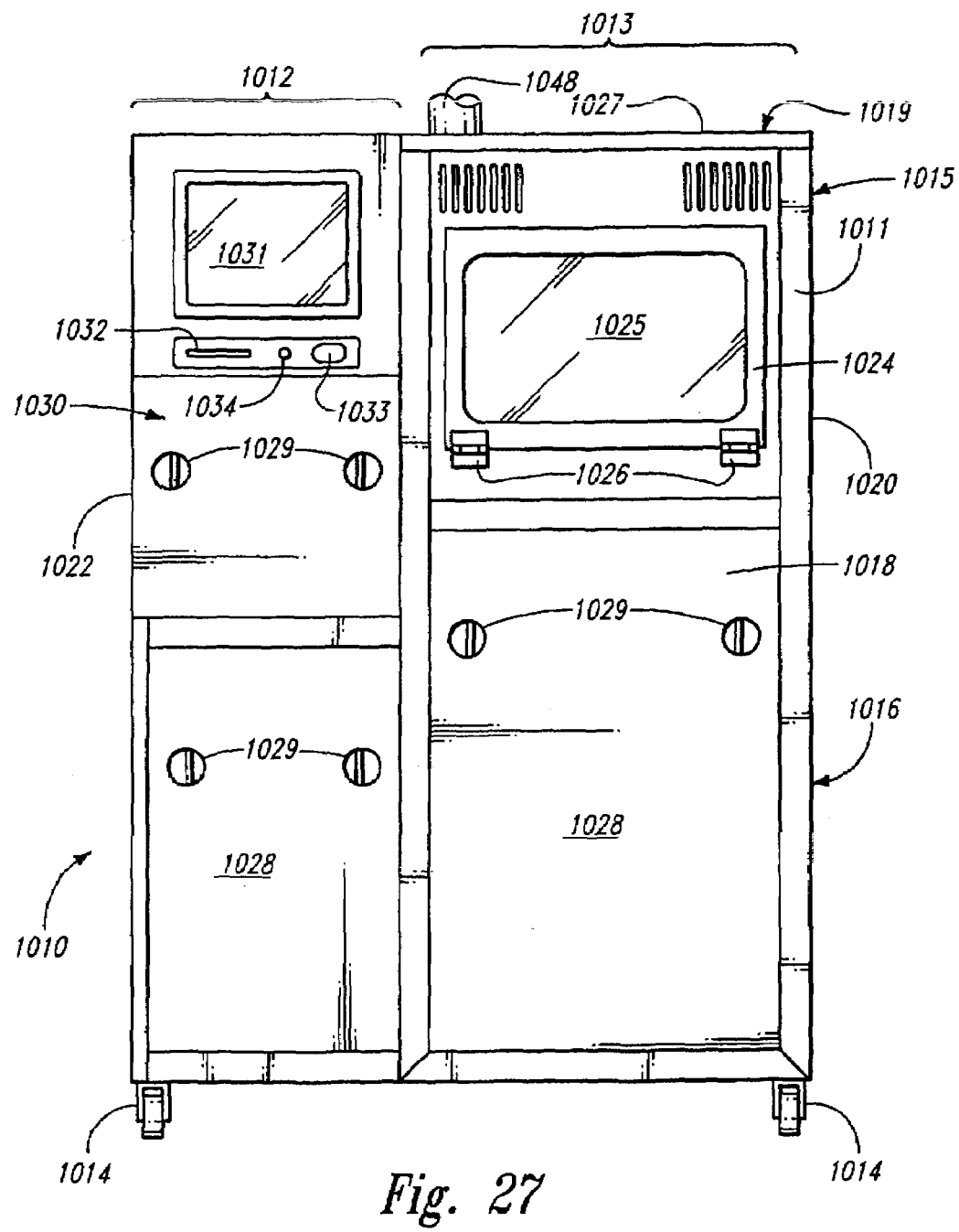
FIG. 27 is a front elevational view showing a preferred wafer spray coating and processing system made in accordance with the concepts of this invention.

FIG. 27 shows a preferred semiconductor spray coating processing system 1010 built in accordance with the novel concepts of this invention. Processing system 1010 includes a frame or framework 1011 upon which other components are mounted. Framework 1011 and remaining portions of the processor are advantageously supported on rollable casters 1014.

Framework 1011 is advantageously constructed so as to provide a control side or section 1012 and a wafer processing side or section 1013. The processing side has a processing compartment 1015 which encloses a work space. Processing compartment 1015 includes several system stations which receive and process semiconductor substrates, semiconductor wafers, flat panel displays, data disks, and other semiconductor products or articles requiring ultra-low contamination processing. The processing accomplished by processing system 1010 includes spraying a desired coating upon the articles. Below the processing compartment 1015 is an equipment storage compartment 1016 wherein various components of the system and consumable supplies, such as liquid coating materials are stored.

Processor 1010 includes a front 1018 which has several removable access panels 1028 which are detachable from frame 1011 by opening catches 1029. Similar panels are used on the sides 1020 and 1022, and back 1021 of the processor. Processor 1010 also includes a top 1019. The top processing side has been removed in the view shown in FIG. 28. This top panel preferably has a window (not shown) for viewing into the processing compartment.

FIG. 27 shows that the processing side 1013 further has an access door 1024 which is pivotally connected to a front panel of the processing compartment using hinges 1026. Door 1024 preferably has a view window 1025 for operator observation of the processes being performed within processing compartment 1015 during operation.

Figure 37:
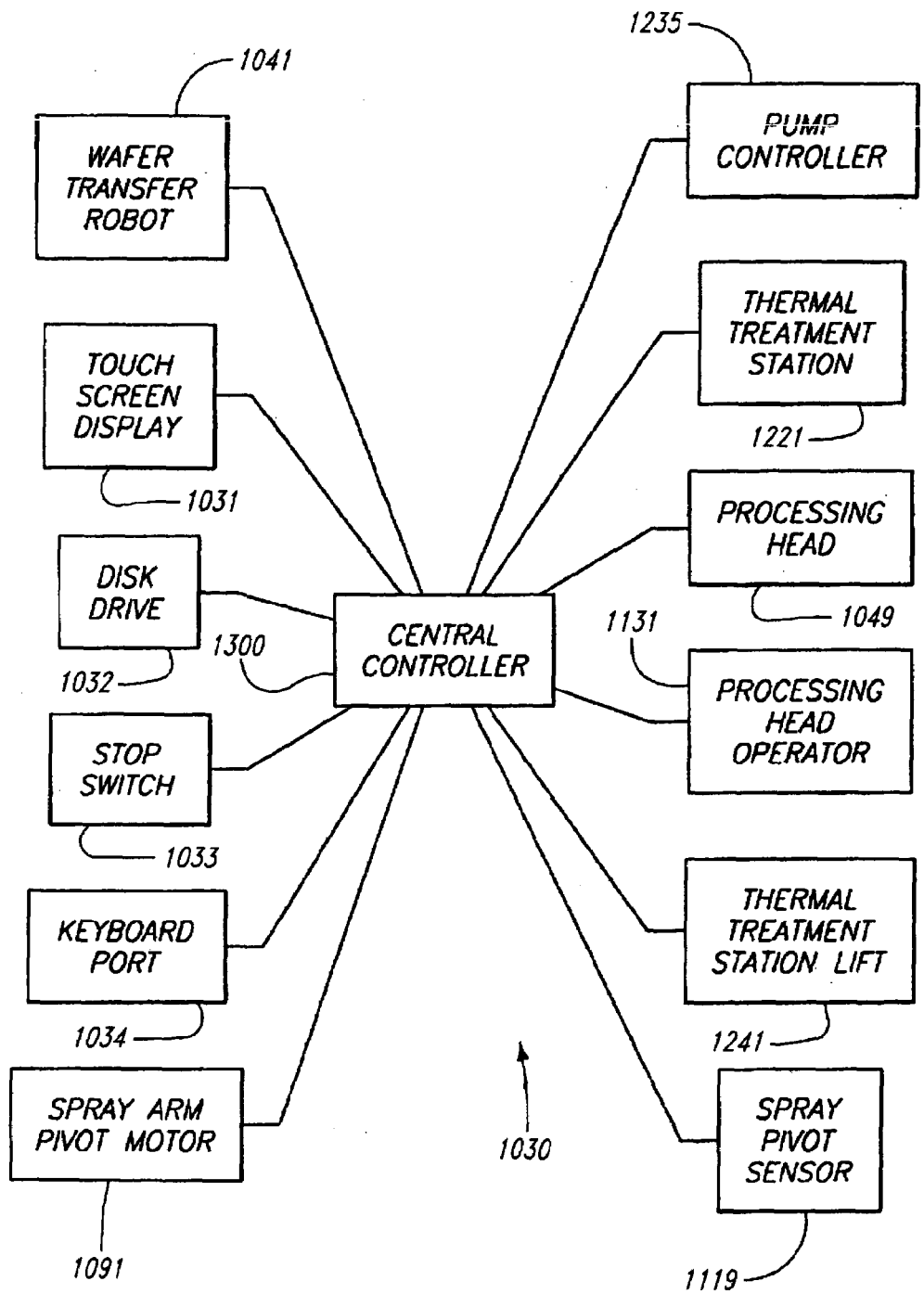
FIG. 37 is a schematic block diagram showing control system components.

FIG. 27 also shows frontal portions of the control side 1012 of processor 1010. Primary portions of a control subsystem 1030 is mounted within control side 1012. Illustrated components include a display 1031 which is a touch screen cathode ray tube, known in the art. A data disk drive 1032 is mounted below the display. A keyboard connection port 1034 allows a keyboard to be connected for purposes of programming the controller. An emergency stop button 1033 is mounted for easy access to allow the operator to stop operation of the machine for any reason. The control subsystem 1030 includes a computer or other central controller 1300 such as typically used in a variety of offices and industrial control situations. The control system computer 1300 interfaces through connection wiring and in some cases related electronic subcircuits to both monitor system operation and provide operational control signals. FIG. 37 shows the relationships in a schematic diagram. The specific control scheme used can vary significantly according to well-known digital control options available to provide the operational capabilities described below in greater detail.

Figure 28:
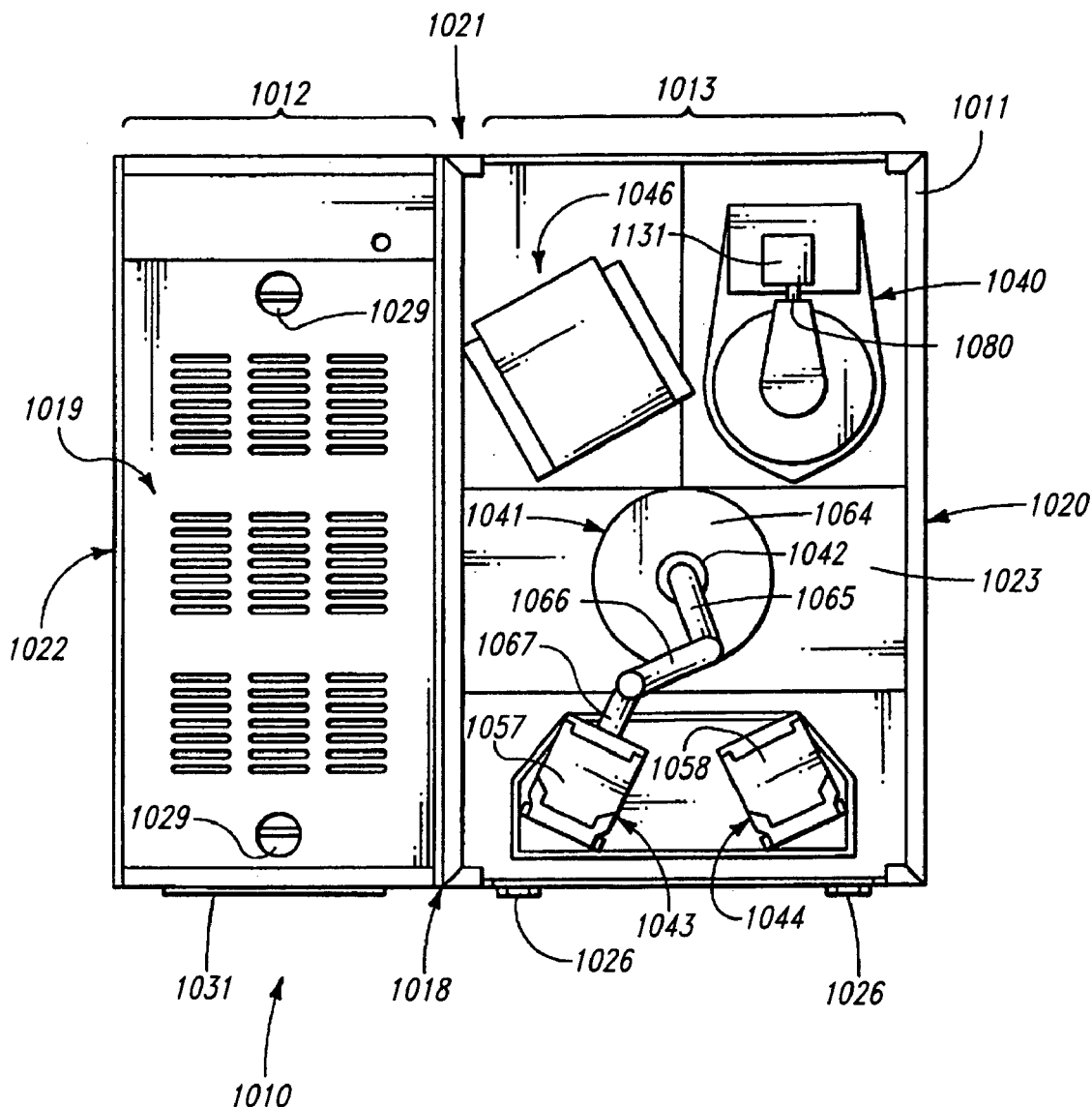
FIG. 28 is a top view showing the system of FIG. 27. Portions have been removed to better show features of the invention.

FIG. 28 shows the top of processor 1010. The processing compartment 1015 is shown with the top cover 1027 removed for purposes of illustration. The processing compartment top cover 1027 also includes an exhaust port 1048 (FIG. 27) through which gases emanating from the processing compartment can be withdrawn, such as to a facilities exhaust line (not shown).

Wafer Transfer

FIG. 28 includes a processing compartment deck 1023. Deck 1023 is supported by the framework and in part supports various components which are mounted in or adjacent to the processing compartment. As shown, deck 1023 mounts a robotic wafer transfer station 1041. Wafer transfer station 1041 has a base 1064 which is mounted upon deck 1023. The wafer transfer mechanism also includes a first arm 1065 which is pivotally connected to base 1064 at a proximate end of the first arm. Arm 1065 is vertically adjustable relative to the base using an extension cylinder 1042. A second arm 1066 has a proximate end which is pivotally connected to the distal end of first arm 1065. The distal end of second arm 1066 carries a wafer engagement tool 1067. The wafer engagement tool is preferably mounted to allow pivotal action of the engagement tool relative to the distal end of second arm 1066. The wafer engagement tool is advantageously a vacuum assisted end effector which is inserted beneath a wafer and applies a vacuum to the wafer backside to hold the wafer in position upon the palm or upper face of the engagement tool. The application of vacuum to the wafer is controlled between applied and released conditions to facilitate holding and release of the wafer.

Wafer Input and Output Stations

Also mounted upon deck 1023 are a wafer input station 1043 and a wafer output station 1044. Stations 1043 and 1044 inventory wafers being processed. Input station 1043 holds an input wafer carrier 1057 which contains a group of wafers which have been placed into the processing compartment for treatment. Output station 1044 holds an output wafer carrier 1058 which holds wafers which have been treated. FIG. 28 also shows a spray coating process station 1040 and a thermal treatment station 1046.

Introduction to Process

The processing of wafers through processor 1010 can be generally understood from FIG. 28 which will now be described. Wafers are fed to the system by opening processing compartment access door 1024 and inserting input wafer cassette 1057 loaded with wafers to be processed. The loading is typically done by manual insertion. As shown, the wafer cassette is oriented with the wafers in horizontal position. Wafers are individually removed from the input station wafer cassette 1057 by the robotic wafer transfer mechanism 1041. The wafers are transferred to the spray coating station 1040. In the spray coating station the wafers are spray coated according to the processes more fully explained below.

Wafer transfer 1041 then removes the wafers from the spray coating station 1040 and moves them to the thermal treatment station 1046. In the thermal treatment station the wafers are most preferably heated to a desired heat treatment temperature and then cooled to a desired cold treatment temperature. In the preferred thermal treatment station 1046, the heat treatment and cold treatment are carried out in distinct thermal treatment chambers. The wafer transfer mechanism 1041 moves the individual wafers between the heating and cooling chambers within station 1046.

After thermal treatment, the wafers are removed from thermal station 1046 by wafer transfer 1041. The spray coated and thermally treated wafers are then moved to the output wafer cassette 1058. When the batch of wafers have been processed, the output cassette is removed via access door 1024 and the processor 1010 is ready to process another batch of wafers.

Spray Coating Station

Figure 29:
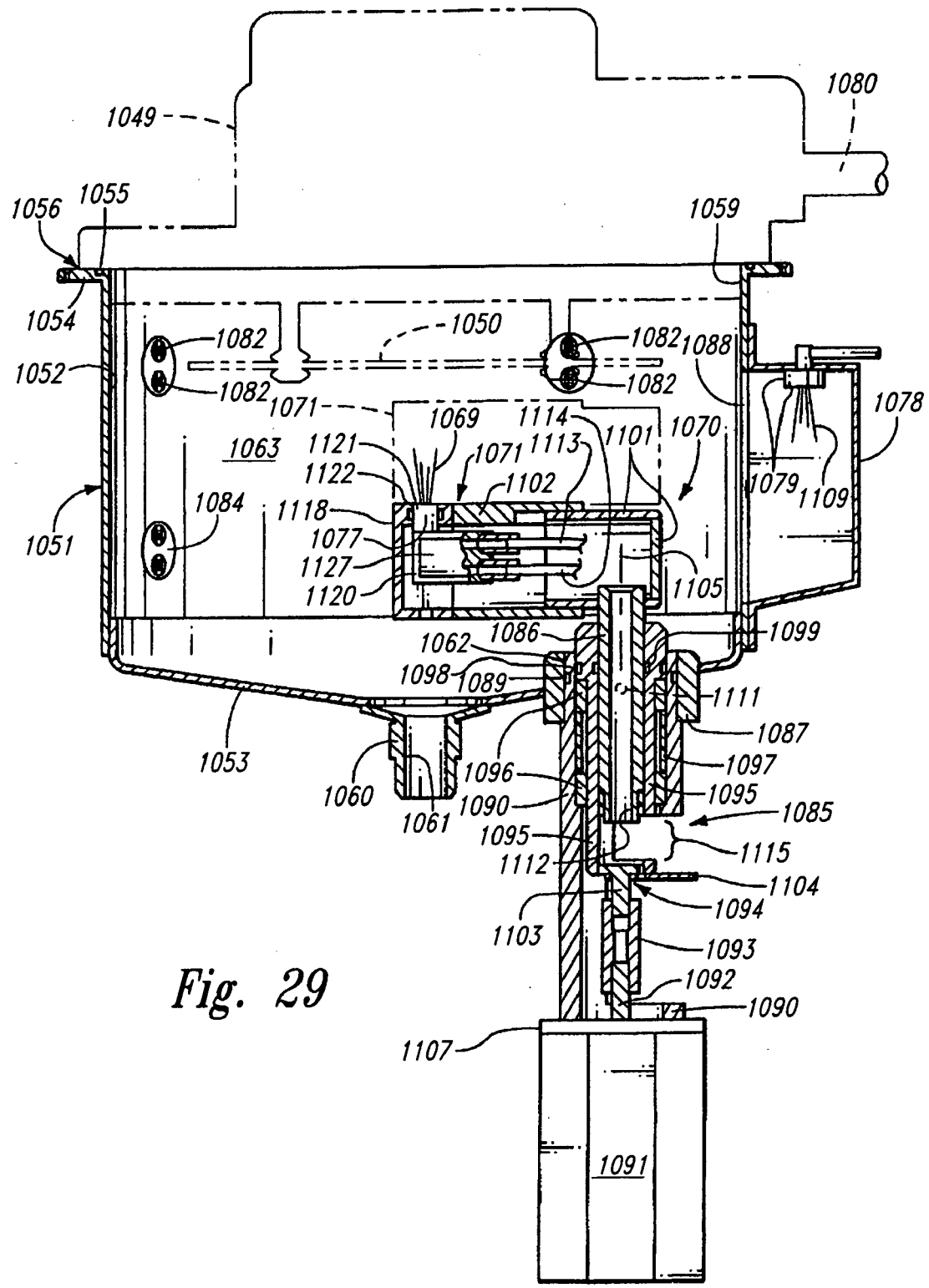
FIG. 29 is a side sectional view showing portions of a spray processing vessel bowl used in the system of FIG. 27. A spray processing vessel head is shown in phantom lines.

FIG. 29 shows portions of the spray coating station 1040 in greater detail. The spray coating station includes a processing head assembly 1049 which supports and rotates a wafer 1050 being processed. The processing head is described in greater detail below, particularly in connection with FIG. 30. The processing head is constructed to mate with a spray processing vessel bowl 1051 to form a spray coating spray processing vessel 1056. In the closed arrangement shown in FIG. 29, the processing head and processing bowl define a substantially enclosed processing chamber 1063.

Processing head 1049 is movable upwardly from the closed position shown in FIG. 29 to allow access through a processing bowl top opening 1059 through which wafer 1050 and portions of the processing head are lowered. Processing head 1049 is most preferably supported by a processing head shaft 1080. Processing head shaft 1080 is operated by a processing head operator 1081 to both raise and lower the processing head. Processing head operator 1081 is most preferably capable of both vertical motion and pivotal motion which causes shaft 1080 to turn the processing head in a reciprocal manner between face-up and face-down positions. When the processing head is turned into a face-up position (not shown), the wafer 1050 is positioned into the processing head with the wafer face-up. This is in comparison to the face-down position shown in FIG. 29. The back side of wafer 1050 is adjacent to the processing head.

Spray Coating Station—Processing Vessel Bowl

FIG. 29 shows that the preferred processing vessel bowl portion 1051 has a sidewall 1052. Sidewall 1052 is preferably cylindrical. As shown, the upper edge of the sidewall is provided with a top opening flange 1054 which surrounds and defines top opening 1059. Flange 1054 is provided with a seal groove 1055 which receives a suitable seal, such as an O-ring seal, therein for sealing between the processing head 1049 and the processing vessel base or bowl 1051.

Sidewall 1052 is advantageously provided with a plurality of chamber cleaning nozzles 1082 and 1084. Nozzles 1082 and 1084 are preferably arranged in two levels, such as the upper level nozzles 1082 and the lower level nozzles 1084. The nozzles are positioned at suitable locations to allow solvent washing of the processing vessel Interior surfaces. In the preferred construction there are two upper nozzles which are advantageously positioned at an angular spacing of 90°, at positions 0° and 90°. The two lower nozzles 1084 are at 180° and 270° positions such that the nozzles are equiangularly spaced about the centerline. The position of nozzle 1084 has been shifted in FIG. 29 for purposes of illustration. The chamber cleaning nozzles advantageously each have two nozzle openings to provide two jets which provide enhanced jet dispersion and greater spray washing effectiveness.

FIG. 29 also shows bowl 1051 includes a frustoconical bottom bowl piece 1053 which essentially defines the bottom wall of the processing vessel. The bottom wall also includes a drain having a drain fitting 1060 and drain opening 1061. The bottom wall of the spray processing vessel also includes a spray assembly opening 1062. Spray assembly opening 1062 receives portions of a spray assembly 1070 therethrough. Spray assembly opening 1062 is advantageously provided with a reinforcing boss 1087 which defines the opening and is securely affixed to the bottom wall 1053, such as by welding. Spray assembly 1070 produces a coating spray jet 1069 of coating material and carrier gas which is directed onto the downwardly oriented face of wafer 1050.

FIG. 29 also shows a processing bowl side compartment 1078 which extends partially along one exterior side of the processing bowl 1051. Side compartment 1078 serves as a storage and nozzle cleaning compartment adjacent to the processing chamber 1063. Compartment 1078 connects with processing chamber 1063 via a storage compartment connection opening 1088. A spray arm wash-down nozzle 1079 is mounted near the top of the storage compartment. When a spraying operation or series of operations have been completed, the spray arm is pivoted into the storage compartment 1078. The wash-down nozzle 1079 is supplied with solvent to form a wash-down jet 1109 which sprays solvent upon the spray-head 1071 to, in particular, wash the coating spray nozzle 1077. This prevents buildup of coating material at the nozzle 1077 which may otherwise cause pluggage or adversely affect the coating application jet 1069.

Spray Coating Station—Sprayer Assembly

FIG. 29 shows the sprayer assembly in sectional view to indicate the preferred construction. Sprayer 1070 includes a spray-head 1071 which is movable within the processing chamber 1063 to effect motion of coating spray nozzle 1077. In the preferred construction shown, the spray swings about a pivot axis 1105. This in combination with rotational movement of the wafer 1050 allows all areas of the downwardly facing surface of wafer 1050 to be coated.

The elevational position of the spray head 1071 is preferably adjustable. FIG. 29 shows spray-head 1071 in the axially downward position. In this downward or removed position the spray-head is spaced relatively further from the wafer. A phantom line box illustrates spray-head 1071 in an alternative upward or close position when it has been moved upwardly into closer proximity to the wafer 1050. The elevational or proximity position of the spray head relative to the surface being coated is adjustable within a range of differing proximity positions lying between a closest position and a remotest position. This allows the operator to optimize coating performance according to the requirements associated with a particular coating being used and other associated coating application parameters. As shown, the adjustment is accomplished using a manual adjustment mechanism which is described below.

Spray-head 1071 is mounted upon a spray-head shaft 1086. Spray-head shaft 1086 forms part of a spray head actuator 1085. Spray-head actuator 1085 includes an outer support tube 1090 which mounted upon the reinforcing boss 1087, such as by threadably receiving the tube within the boss. A seal 1089 is advantageously included near the upper end to seal between the boss and support tube. A pivot motor 1091 is mounted upon the lower end of support tube 1090, preferably using a motor mounting flange 1107 which is connected to the support tube, such as by welding. The pivot motor is fastened to flange 1107 by fasteners (not shown).

Pivot motor 1091 has an output shaft 1092 which is connected by a coupling 1093 to a pivot tube assembly 1094. The pivot tube assembly also advantageously includes an angular position indicator arm 1104 which is detected by a pivot position sensor 1119 (FIG. 37) to indicate the pivot position for control of the pivot arm movement. Angular position indicator arm 1104 is connected to a connection piece 1103. Connection piece 1103 is partially received in the upper end of the motor coupling 1093. Connection piece 1103 is preferably connected to the an outer pivot tube 1095.

The pivot tube assembly includes outer pivot tube 1095. Outer pivot tube 1095 pivots within support tube 1090. Outer pivot tube 1095 is advantageously supported by bearings, such as the two bushing-type bearings 1096. An annular spacer 1097 extends between and spaces bushings 1096. An outer seal 1098 seals between pivot tube 1095 and the inner diameter of support tube 1090. An inner seal 1099 seals between the spray-head support shaft 1086 and the inner diameter of pivot tube 1086.

Tubes 1095 and shaft 1086 pivot together in response to torque applied by the output shaft 1092 of motor 1091. The elevational position of shaft 1086 is adjustable relative to outer pivot tube 1095. Adjustment is accomplished by loosening a set screw 1111 which is threadably received in a hole in outer pivot tube 1095. Shaft 1086 is then moved to the desired elevation or proximity position and secured by tightening set screw 1111.

Pivot shaft 1086 is made tubular to form a conduit passageway 1112 therethrough. The conduit passageway allows a coating conduit 1113 and carrier gas conduit 1114 to extend from the spray head nozzle block 1120 down passageway 1112 for connection to related equipment described below. Conduits 1113 and 1114 extend through a lower conduit feed opening 1115. The angular position of the spray assembly is detected by an angular position sensor 1119 (FIG. 37) which optically or otherwise senses the position of arm 1104.

Spray-head 1071 includes a first spray arm part 1101 which is secured to the upper end of pivot shaft 1086. A second spray arm part 1102 is connected to first part 1101 to form a tubular arm which extends outward from shaft 1086. Shaft 1086 and spray arm 1071 pivots about pivot axis 1105.

Spray-head 1071 also includes a nozzle assembly mounting head 1118 which is detachably connected to the distal end of second arm part 1102 using fasteners (not shown). The nozzle head 1118 mounts a nozzle block assembly 1120. Nozzle block 1120 has a nozzle extension 1121 which fits within a mounting aperture 1122 formed in mounting head 1118. Nozzle extension 1121 contains the nozzle 1077 through which coating and any carrier gas are emitted.

Nozzle block 1120 is provided with fittings 1123 and 1124 which connect with the coating and carrier gas conduits 1113 and 1114.

Nozzle block 1120 is preferably a nozzle which provides good atomization of the coating liquid using a carrier gas. The preferred nozzle block has internal features which cause ultrasonic vibrations to be generated as the carrier gas passes through the nozzle block. The ultrasonic vibrations assist in providing good atomization of the coating with particle sizes in the range of 0.1–10 microns, more preferably on the order of approximately 1 micron in diameter. A suitable nozzle type is Sonicair brand atomizing nozzle available front Ivek Corp. of North Springfield, Vt.

Nozzle block 1120 is preferably provided with nozzle block heaters 1127 which are preferably electrical resistance heaters. The nozzle block heaters are preferably attached to both opposing sides of the nozzle block to heat the nozzle block and achieve an approximate desired temperature range. This serves in providing consistent viscosity control since the nozzle will be heated to an elevated temperature which stays approximately the same during operation. Suitable temperatures are in the approximate range of 20–150° C., more preferably 30–100° C., even more preferably 40–80° C. Temperature can be controlled by varying the current passing through the nozzle block heaters.

Figure 35:
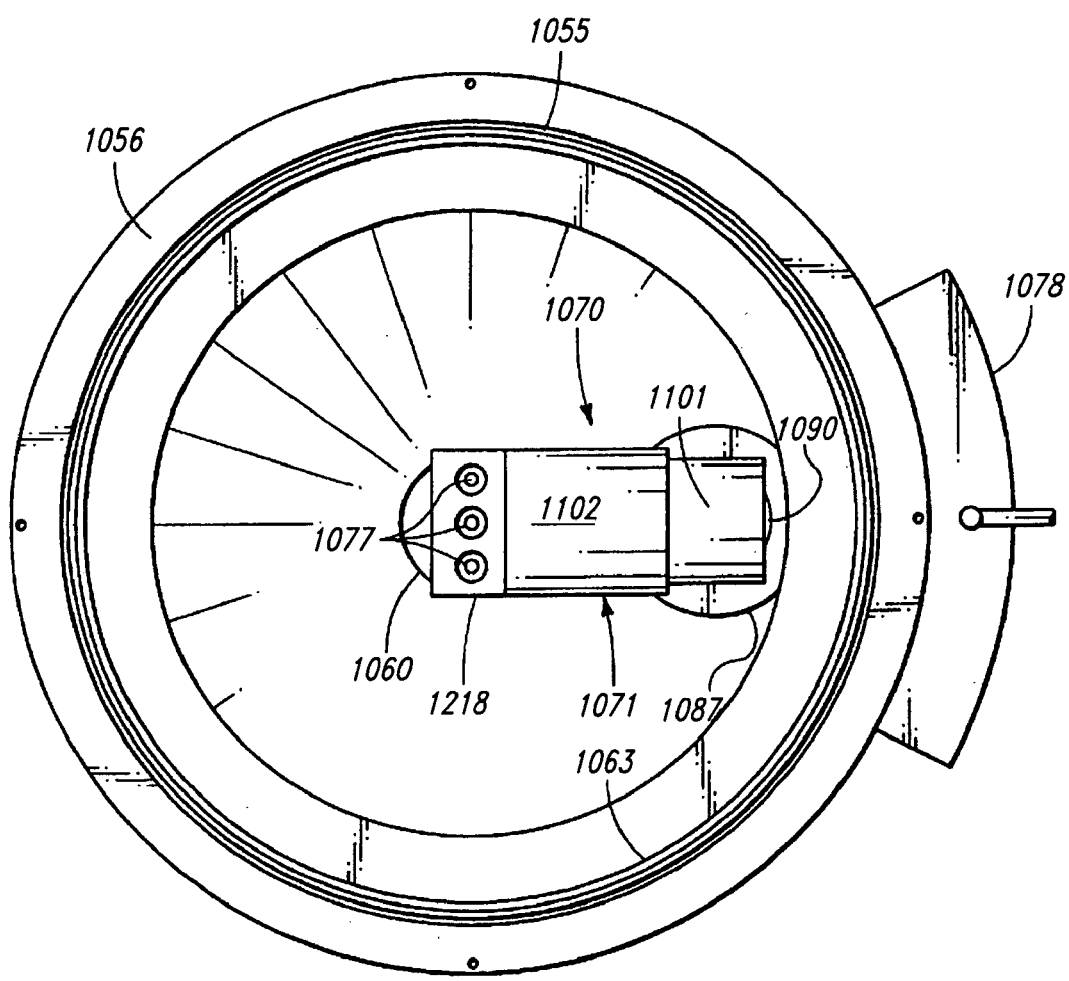
FIG. 35 is a top view of an alternative spray-head having multiple nozzles.

FIG. 35 shows an alternative form of spray assembly according to the invention. In this view the spray arm head piece 1118 has been substituted by an alternative three nozzle head piece 1218. Head piece 1218 mounts three nozzle blocks similar to nozzle block 1120. Each nozzle block has an emitting nozzle 1077 and associated heaters. This arrangement provides a more diffuse spray pattern. Otherwise the construction is similar with minor modifications associated with the increased number of nozzles.

Spray Coating Station—Sprayer Fluid Supply

Figure 36:
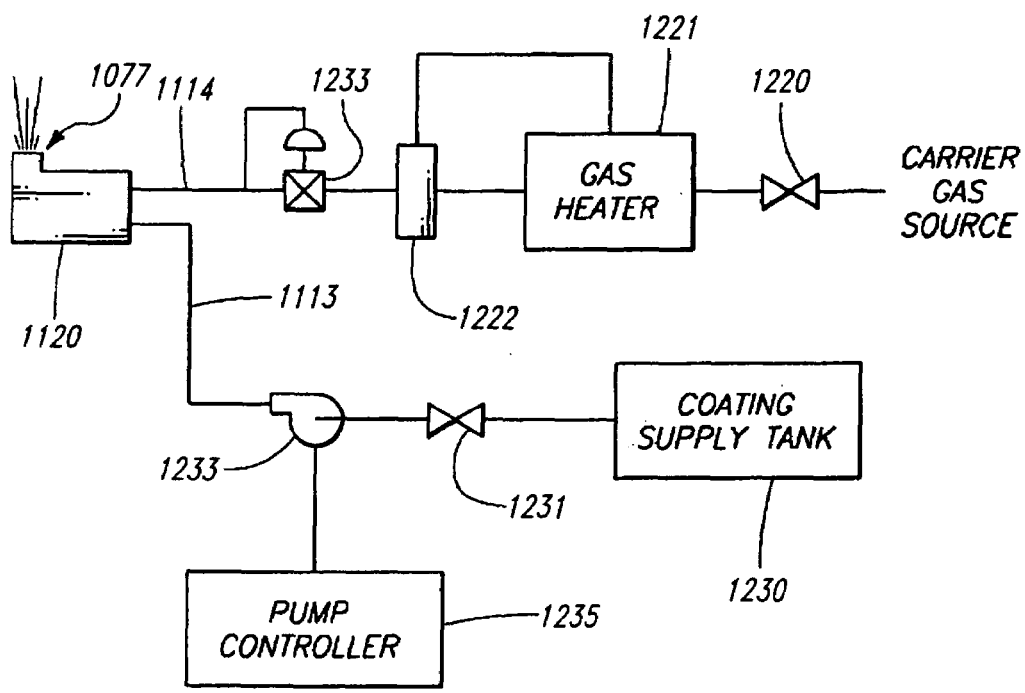
FIG. 36 is a schematic diagram showing fluid components associated with the spray coating station.

FIG. 36 shows a preferred system for supplying coating fluid and carrier gas to the nozzle block 1120. Air, nitrogen or other suitable carrier gas is supplied from a facilities source via a cutoff valve 1220. The gas then goes through a gas heater 1221. A thermostatic control sensor 1222 measures the temperature of the downstream gas passing through heater 1221. Heater 1221 is thus controlled to achieve a desired gas temperature. Alternatively sensor 1222 can supply a signal to the central controller 1300 (FIG. 37) and gas heater 1221 can be used to controllably heat the carrier gas to a desired temperature. A pressure regulator 1223 is downstream from heater 1221 and is used to regulate the pressure of carrier gas being fed to nozzle block 1120.

FIG. 36 also shows a coating fluid supply system. Coating is held in a coating reservoir 1230. A control valve 1231 can be included between the reservoir and pump 1233. Pump 1233 is preferably a precision controlled metering pump used with the preferred Sonicair brand nozzle described above and available from the same indicated source. The pump is controlled using a matching pump controller 1235 which controls the pump and its related electrical operating motor to provide the desired flow rate. Coating is supplied to the nozzle block 1120 via coating conduit 1113. Typical operating pressures are in the range of 5–100 pounds per square inch gauge pressure (psi), more preferably 10–30 psi.

Spray Coating Station—Processing Head

Figure 30:
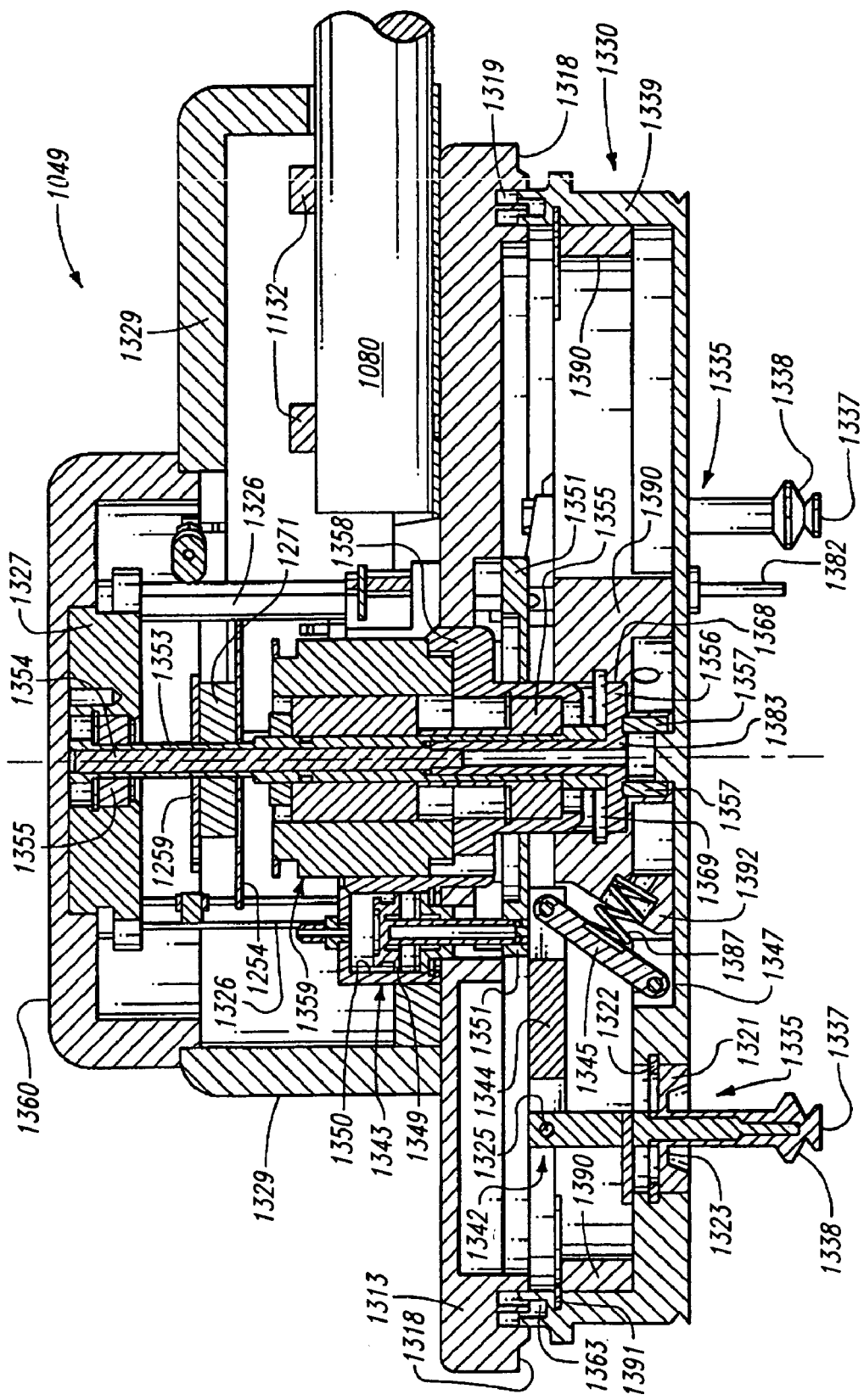
FIG. 30 is a side sectional view of the spray processing vessel head shown in phantom in FIG. 29. The section line is taken along a cutting plane which changes at the centerline of the rotating assembly to better show internal components.
Figure 31:
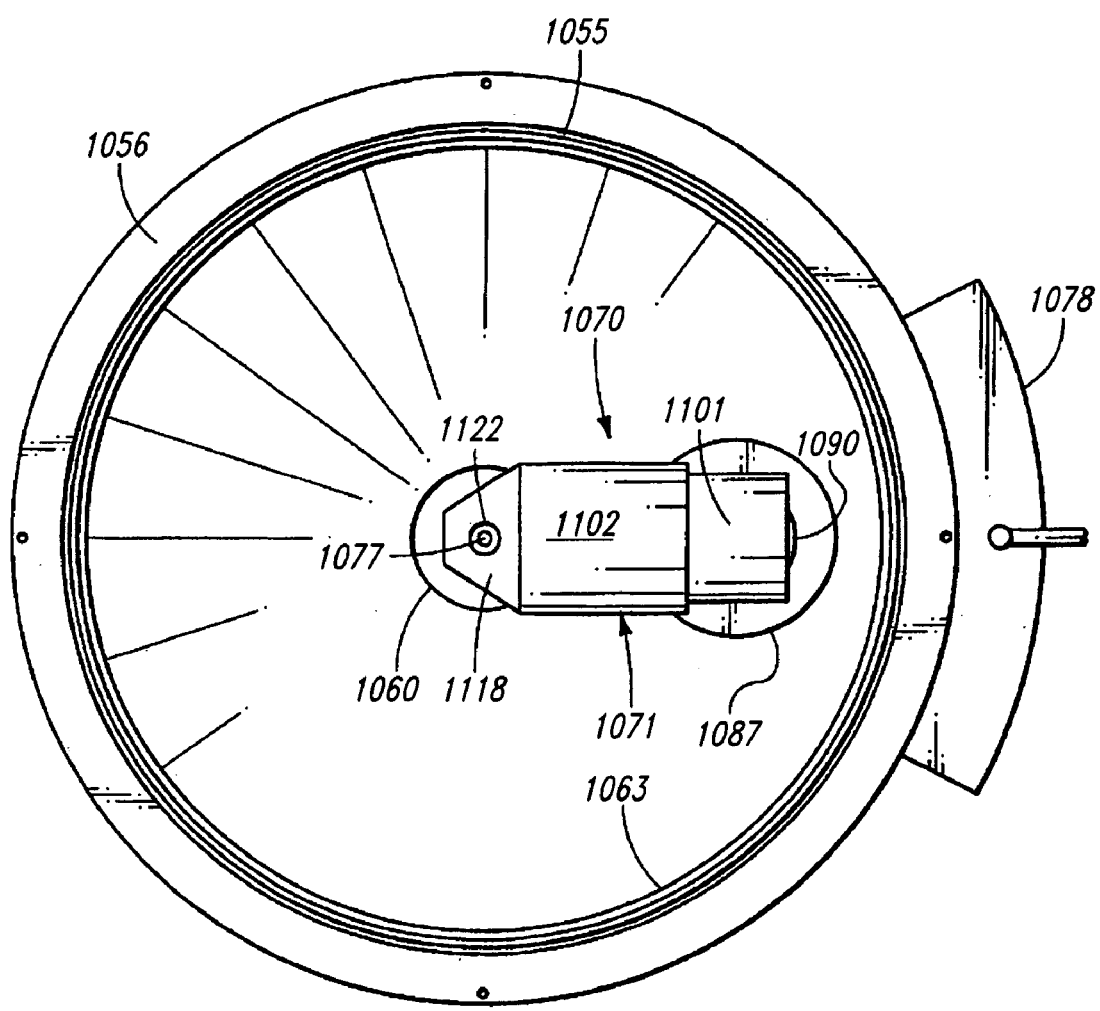
FIG. 31 is a top view of the spray processing vessel bowl shown in FIG. 29.

FIG. 30 shows the preferred construction for processing head 1049. Head 1049 is constructed similar to wafer processing head(s) shown and described in U.S. Pat. No. 5,235,995, issued Aug. 17, 1993 which is hereby incorporated by reference. Also pertinent are alternative processor head constructions shown and described in allowed U.S.

patent application Ser. No. 07/855,767 filed Mar. 18, 1992, U.S. Pat. No. 5,431,421, issued Jul. 11, 1995, which is hereby incorporated by reference. For purposes of convenience and facilitating the understanding of this invention without specific reference to such earlier patent, additional description is set out herein.

It should also be noted as a preliminary matter that the cutting plane used in FIG. 30 changes orientation at the centerline of the rotor to better illustrate additional features of the invention.

Processing head 1049 includes a shroud 1313 which forms a main structural part of the head and is connected shaft 1080. Shaft 1080 is mounted to shroud 1313 using mounting rings 1132 and fasteners (not shown). Shaft 1080 is pivotable by a head operator 1131 (see FIG. 28). Head operator 1131 lifts shaft 1080 and attached head 1049 up and down.

Operator 1131 also pivots shaft 1080. Pivoting shaft 1080 causes the attached head 1049 to flip between face-up and face-town positions.

Shroud 1313 is generally disk-shaped. The outer edge of shroud 1313 forms a rim 1318. The face of shroud 1313 has annular recesses 1319 which receive portions of a wafer support piece 1330 in proximity thereto. Wafer support piece 1330 is mounted for rotation relative to shroud 1313. Shroud 1313 is also provided with a central opening through which portions of a motor support 1358 are received.

Head 1049 also has a housing 1329 attached to shroud 1313 in which the motor and other parts are enclosed. A top cap 1360 is connected to the housing to further enclose the internal mechanical workings of head 1049. The shroud, housing and cap are advantageously made of polyvinylidene fluoride or other suitable materials.

The processor head includes spacers or columns 1326 which extend from lower motor mount 1358 upwardly to support the upper mount 1327. Spacers 1326 have interior bores which receive fasteners (not shown) which extend through apertures formed through mount 1327.

Processor head 1049 also includes a wafer holder or support 1330. Wafer support 1330 is movably mounted to remaining parts of the head assembly to provide rotation or other appropriate relative motion between the wafer being processed and the spray assembly 1071. The wafer support includes a disk-shaped wafer support plate 1339 having an exposed downwardly directed front face and a upwardly directed back face removed from the wafer 1050 being processed. The wafer support plate 1339 is advantageously constructed of polypropylene or other suitable material with an upturned flange 1362 about the periphery thereof. Flange 1362 can advantageously be provided with upwardly facing parallel extensions and associated grooves 1363 to help restrict gas flow between flange 1362 and shroud 1319.

The wafer support 1330 also includes a wafer support reinforcing wheel 1390 which is secured within the wafer support piece 1339 using a mounting ring 1391. The reinforcing wheel 1390 has a hub 1392 to which is connected the output of motor 1359. Such connection is described more fully below.

Wafer support 1330 mounts a plurality of wafer support fingers 1334, such as the four shown, or more. The wafer support fingers 1334 have distal ends 1337 which are formed to provide gripping notches 1338 in which the peripheral edge of wafer 1050 is held. The distal ends of support fingers 1334 are spatially contracted toward one another to hold wafer 1050, or expanded outwardly to release the wafer.

FIG. 30 shows that wafer support fingers 1334 are flexibly mounted by finger bushings 1335 to allow deflection thereof and the relative expansion and contraction needed for controlled gripping and release of wafer 1050. Finger bushings 1335 are preferably integrally formed with fingers 1334. The finger bushings have an enlarged diameter exposed surface flange 1321 which faces downwardly toward wafer 1050. The finger bushings are held in position by a retaining ring 1322 mounted to engage the back or upper surface of wafer support plate 1339. The exposed, lower face also in part defines an annular web or diaphragm 1323 which provides the flexibility needed to allow fingers 1334 to pivotally deflect between expanded and contracted positions. The finger bushings 1335 are made of a flexible material, such as TEFLON or other material suitable for service in the chemical environment which exists within processing chamber 1063.

The wafer support fingers 1334 also have upper or proximate ends 1341 which are provided with connection receptacles 1325. The connection receptacles receive end pieces 1342 therein to form a mechanical coupling. End pieces 1342 are displaced laterally by finger connection rods 1344 to tilt the end pieces and attached wafer support fingers. The tilting action causes the relative expansion and contraction of the distal ends of the support fingers in the triad arrangement.

Actuation of the support fingers is advantageously accomplished using finger actuators 1343. The finger actuators 1343 each include a connecting rod 1344 which is pivotally connected at a first or outer end to an end piece 1342. The inner or second ends of connecting rods 1344 are pivotally connected to a remote end of a positioning link 1345. The opposite or mounted ends of positioning links 1345 are pivotally connected to the wafer support plate 1339 using positioning link brackets 1347. The positioning links 1345 are oriented at oblique angles extending inwardly from the pivotal connections with the brackets 1347 toward the remote ends and the pivotal connections with connecting rods 1344. The positioning links 1345 can be provided with biasing springs 1387 which urge links 1345 upwardly and the associated wafer fingers 1334 into contracted positions tending to grip the wafer.

The wafer support fingers are moved into expanded positions to release the wafer by displacing the pivotal joints between connecting rods 1344 and positioning links 1345 downwardly and inwardly. This causes the connecting rods to move inwardly in a radial direction to displace the proximate ends of the wafer fingers inwardly and the opposite distal ends outwardly to release the wafer. The connecting rods are displaced downwardly and inwardly by an annular contact ring 1351. Contact ring 1351 is operated by a pair of small pneumatic pistons 1349. Pistons 1349 are slidable within cylindrical piston cylinders 1350 formed in motor support 1358. Pressurized fluid is supplied to the upper sides of pistons 1349 to force them downwardly and cause contact between annular contact ring 1351 and connecting rods 1344.

The wafer support piece 1339 is also advantageously provided with a set of four standoffs 1382 which serve to support wafer 1050 during loading of the processing head. Wafer 1050 is loaded with the head in a face-up position with the distal end of the standoffs available to be contacted by the backside of wafer 1050.

The wafer support drive assembly includes a motor 1359 which is mounted upon motor support 1358. Motor 1359 is preferably a brushless DC motor. Motor 1359 has a hollow motor shaft 1353 supported by a set of ball bearings 1355. The hollow motor shaft 1353 receives a detachable shaft 1354 therethrough. Detachable shaft 1354 is threadably connected to a shaft head 1383. Shaft head 1383 includes an enlarged flange 1356. The shaft head is connected to the motor shaft to rotate therewith using a pin (not shown) or other suitable means. The flanged head is received within a shaft head receptacle 1368 formed in the back surface of hub 1392. Spaced, axially oriented, anti-rotation pins 1357 are engaged between the lower face of the flanged shaft head 1356 and corresponding holes formed in receptacle 1368. A snap-ring retainer 1369 holds the flanged head 1356 axially within receptacle 1368.

The angular positions of fingers 1334 about the rotating assembly rotational axis X-X are preferably controlled to assume desired positions when the rotatable wafer support 1330 stops. This indexing of the stationary positions of fingers 1334 is needed when the processing head is opened to provide proper engagement of the wafer by the robotic transfer unit engagement head.

A preferred indexing means 1250 used to position the wafer support, motor and other rotatable parts forming the rotating assembly of the processing head drive. Rotor positioning or indexing mechanism 1250 includes a multi-sided cammed rotor plate 1259 mounted to rotate with motor shaft 1353 using coupling 1271. The cam plate 1259 has a plurality of sides equal in number to the number of fingers 1334. Each side of rotor plate 1259 has a curved edge configuration. The curved configurations of each of the three side segments are sloped relative to a circle defined by axis X-X. The curves slope from high points at the adjoining ends of the side segments toward central low points. The central low points serve as a detent when engaged by an edge engagement roller (not shown) which is controllably forced inward. When motor 1359 is inoperative and the motor shaft is freely rotatable, the inward force of the roller causes rotor plate 1259 to pivot to bring the rotating assembly into an angular position which centers the roller within a low point of the cammed rotor plate.

A motion monitoring assembly is also advantageously provided within processing head 1049 for measuring the speed and direction of rotation of the wafer plate 330 about the rotational axis X-X. The motion monitoring assembly includes a rotor indicating element, such as rotor indicator disk 1254. Indicator disk 1254 is provided with a series of peripheral notches which intermittently pass and interrupt one or more optical beams and associated sensors (not shown).

Wafer Thermal Treatment Station

Figure 32:
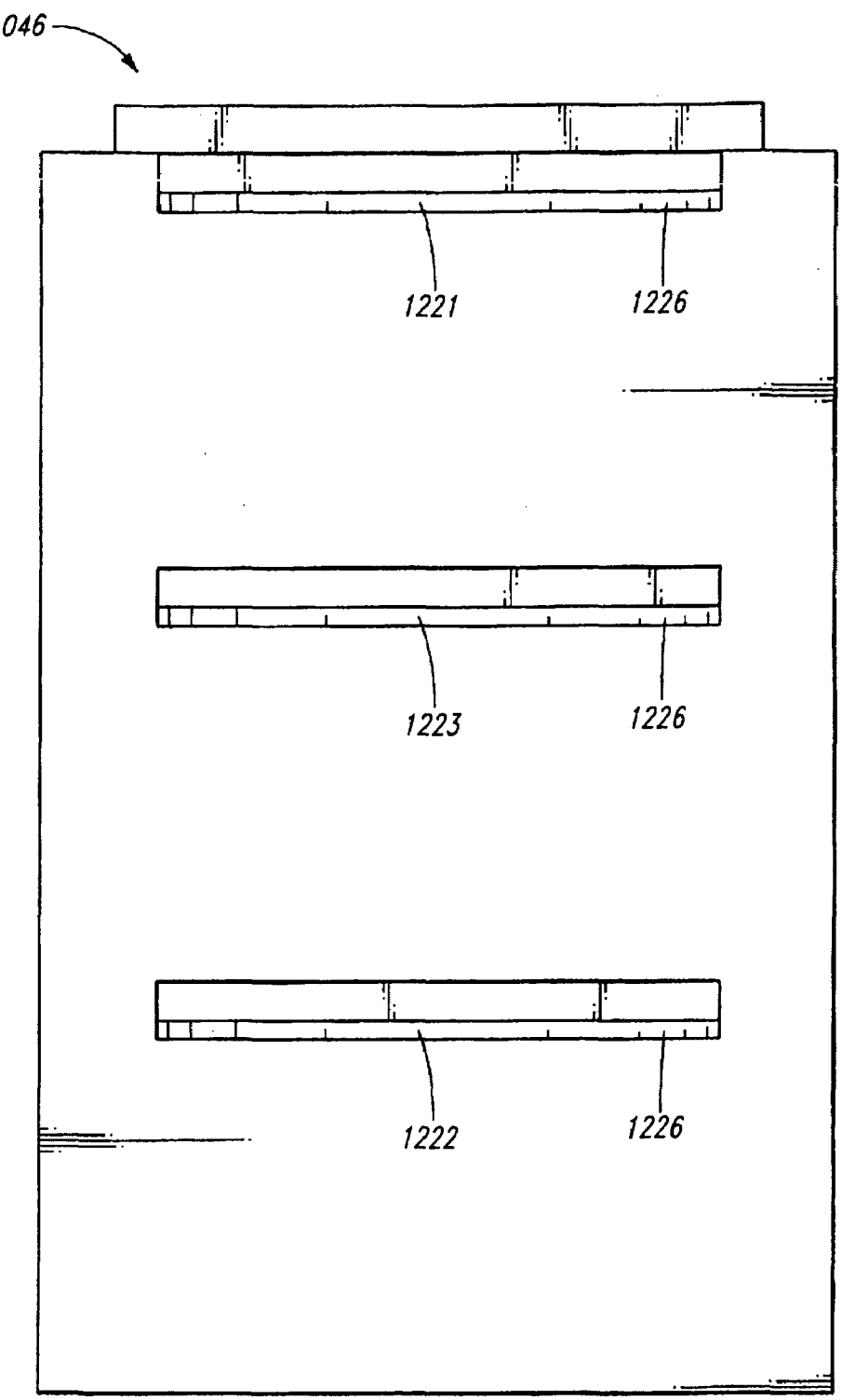
FIG. 32 is a front elevational view of a thermal treatment station used in the system of FIG. 27.
Figure 33:
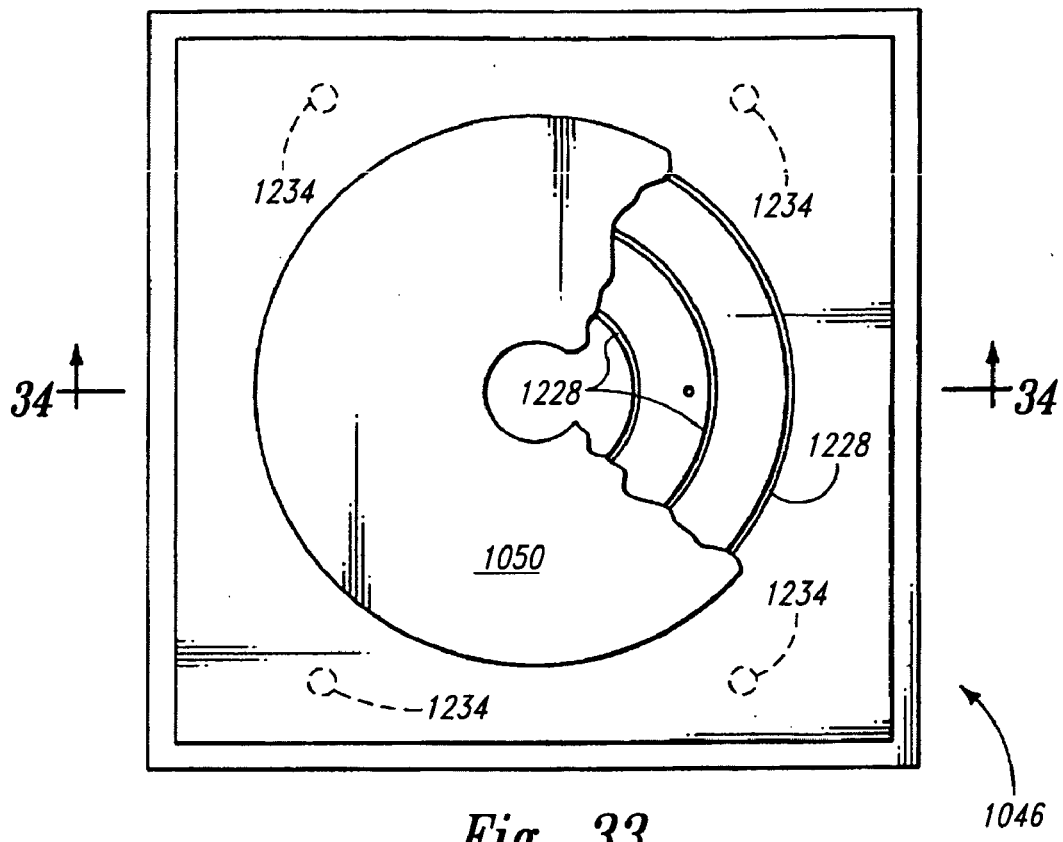
FIG. 33 is a top view of a one thermal treatment unit used in the thermal treatment station shown in FIG. 32.
Figure 34:
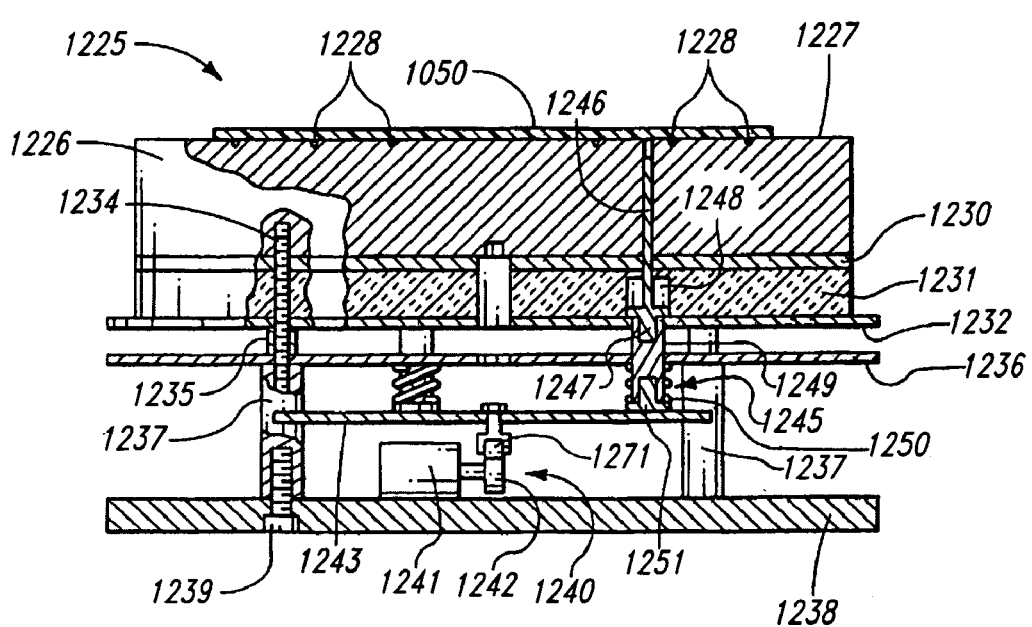
FIG. 34 is a sectional view along section line 34—34 of FIG. 33.

FIGS. 32–34 show a preferred form of thermal treatment station 1046. Thermal treatment station 1046 includes three bays or receiving chambers 1221–3. Receiving bays 1221–3 are designed to each receive a single wafer which has been coated in the spray coating station 1040. The top and bottom receiving bays 1221–2 are associated with thermal treatment units in the form of wafer heaters 1225. The middle receiving bay 1223 is provided with a thermal treatment unit in the form of a wafer cooler. The wafer heaters and cooler are constructed similarly. The preferred construction of both will now be described with specific reference to a wafer heater 1225. The difference between the heaters and cooler will be noted in the description.

FIG. 34 shows a preferred wafer heater 1225. A wafer 1050 is positioned upon the upper surface of a platen 1226. Platen 1226 is preferably constructed with features that improve heat transfer between wafer 1050 and the platen. More specifically, the upper or contact surface 1227 of the platen is formed to fit against the back surface of wafer 1050. As shown, wafer 1050 and the contact surface 1227 have flat complementary contacting surfaces. The platen is preferably made from a metal of good thermal conductivity, such as aluminum. The contact surface of the platen is also preferably provided with a network or array of vacuum aperture grooves 1228. As shown, vacuum apertures 1228 are constructed as three concentric grooves which are controllably connected to a vacuum supply and supplied with vacuum pressure when the wafer is to be held in position upon platen 1226. The vacuum pressure applied over the back side of wafer 1050 pulls the wafer into better contact with the platen thus improving heat transfer. Vacuum is supplied to grooves 1228 via vacuum conduits (not shown) formed in the platen.

The wafer heater is also preferably provided with a thermal source element 1230 which is mounted to contact the back surface of platen 1226. In the wafer heater 1225 the thermal source element 1230 is a serpentine electrical resistance heater. In the wafer cooler used for bay 1223, the thermal source element is an array of cooling passages (not shown) through which are circulated a cooling fluid. Alternatively, a thermoelectric cooler or other suitable cooling apparatus formed in the shape of a relatively thin layer.

Thermal treatment unit 1225 also has an insulatory back piece 1231 which extends over the back of the platen and interposed heater or cooler 1230. Insulation piece 1231 is preferably formed of a suitable ceramic material having relatively good thermal insulating properties. A variety of suitable materials are available.

The platen 1226, thermal source element 1230, and insulating piece 1231 are backed with a support plate 1232. A fastener 1234 is advantageously used to assembly these pieces. Fastener 1234 is provided with male threads along it length and is received within mounting apertures formed in all four of the pieces. The mounting aperture in platen 1226 is threaded. A spacer 1235 is positioned adjacent the back support plate 1232 and serves to space between plate 1235 and a radiant shield plate 1236 which reduces radiant heat transfer. The lower end of fastener 1234 is received in a she-bolt 1237 having internal female threads. The lower end of she-bolt 1237 is fastened to the unit frame piece 1238 using fastener 1239. Thermal unit 1235 preferably uses four assembly mountings as just described.

Thermal treatment unit 1225 also has a lifting mechanism 1240 for lifting wafer 1050 from the surface of the platen. Lifting mechanism 1240 includes a lifting actuator. The lifting actuator preferably includes a stepper motor 1241 which has an output shaft which mounts a circular or other suitable cam 1242. Cam 1242 is eccentric upon the output shaft to controllably raise and lower a cam follower 1271. Cam follower 1271 is advantageously a rotatable bearing with associated outer race which contacts cam 1271. Cam follower 1271 is connected to an actuator plate 1243 which moves up and down with controlled angular movement of the motor 1241. Three lifting rod assemblies 1245 are held in the platen assembly in a tripod arrangement. The lifting rod assemblies are contacted by the actuator plate and are moved upwardly and downwardly in response to operation of actuator 1241.

Lifting rod assemblies 1245 include a contact rod 1246. Contact rod 1246 is provided with an enlarged head 1247 which is mounted for linear travel in a lifting rod receiving pocket 1248. The contact rod also connects with a connector 1249 which is slidably received through apertures formed through the back piece 1232 and heat shield 1236. A lift biasing spring 1252 is compressed between the underside of shield 1236 and a connector contact head 1251. Spring 1252 biases the contact rod upwardly to lift wafer 1050. Actuator 1240 overpowers the biasing springs to retract the contact rods downwardly. The rods can be fully or partially retracted to achieve contact or a desired proximity of the wafer to the platen 1227.

Control System

FIG. 37 shows a schematic presentation of the preferred control system. In such there is a central controller 1300 which is connected to various control system components which are either activated or provide sensory input information. Many alternative control system configurations are possible. As shown, the wafer transfer 1041, touch screen display 1031, disk drive 1032, stop switch 1033, keyboard port 1034, spray arm motor 1091, pump controller 1235, thermal treatment station operator 1221, processing head 1049, head operator 1131, thermal treatment station lift 1240, and spray pivot sensor 1119 are shown connected to the central controller.

METHODS AND OPERATION

The invention further includes novel methods for processing microelectronic or semiconductor articles to provide a coating thereon. The preferred methods are directed to processing methods which can provide a coating which conforms to surface irregularities which are necessarily a part of chemically etched or otherwise irregularly formed surface topologies.

In one form of the invention, the novel methods preferably include loading one or more wafers or other semiconductor articles into a processing enclosure. This is advantageously accomplished by opening the access door 1024 and loading an input wafer cassette 1057 into the input station position 1043. The methods further advantageously include closing the access door and thereby substantially enclosing the processing compartment 1015.

The preferred methods also advantageously can include transferring a wafer from the input station. This transferring is accomplished by inserting a wafer engagement tool, such as tool 1067, into juxtaposition with wafer 1050 and applying a vacuum force to effect holding of the wafer upon the engagement tool. The transferring also preferably includes moving the wafer from the input station by moving the wafer transfer apparatus 1041.

The novel methods also preferably include positioning a wafer or other article within a spray processing vessel. This is done in the processing system 1010 by loading the semiconductor article being coated into the spray coating station 1040 and closing the processing vessel parts. Loading is preferably effected by lifting or raising the processing head 1049. Loading further advantageously includes pivoting the wafer holding processing head into a face-up position to receive the wafer thereon. Loading also can include expanding the wafer engagement fingers into open positions to receive the wafer 1050 therebetween, and then closing the fingers into engaging positions which hold the wafer. The loading phase further preferably includes pivoting processing head 1049 into a face-down position adjacent to the processing vessel bowl 1051. The processing vessel is then effectively closed by lowering or otherwise bringing the processing head into complementary relationship with the vessel bowl. Assembling the processing head and bowl together in conjoined relationship produces a substantially enclosed processing chamber 1063 in which the wafer is coated.

In preferred forms of the invention the novel methods further may include rotating or otherwise moving the wafer. This is accomplished in processor 1010 by rotating the processing head motor and attached wafer support piece 1136. The rotating step is preferably accomplished at rotational speeds in the range of 1–1000 revolutions per minute, more preferably 10–300 revolutions per minute, even more preferably 50–200 revolutions per minute.

The methods further include spraying the wafer or other semiconductor or microelectronic article which has been positioned within the processing vessel. Spraying is accomplished while moving the spray head assembly 1071. The moving of the spray head causes the nozzle or nozzles 1077 to move relative to the article being coated. The spray head assembly is preferably pivoted to cause the relative movement between the nozzle 1077 and the wafer surface. The rotational speed and relative movement of the nozzles are coordinated to achieve a uniform conformal layer of coating material.

In preferred methods according to this invention, the spray arm is advantageously started in a radial position outboard of the piece being coated. The spray can be started from the nozzle in an outboard position to reduce or eliminate any transitory startup effects before the coating spray contacts the wafer surface. Thereafter the spray arm is pivoted so that nozzle or nozzles 1077 are swept to or through the rotational axis of the wafer. This movement of the spray nozzles is coordinated so that the coating application rate density is uniform over the area being coated. In the preferred methods the radial velocity of the nozzles relative to the wafer rotational centerline is increased as the nozzle position moves toward the center of rotation. Conversely, as the nozzle moves outwardly during any return spraying process, the radial velocity decreases. The nozzle path velocity is ideally a function which is inversely proportional to the radial position of the nozzle relative to the rotational centerline of the wafer. Even more preferably, the nozzle path velocity is a function which is inversely proportional to the square of the radial position of the nozzle.

The coordinated application step also considers the application rate which is precisely controlled to effect metering of the spray coating liquid. This metering is performed in system 1010 by the coordinated operation of spray pump 1233, pump controller 1235, and associated carrier gas flow rate. In the coating of semiconductor wafers, liquid coating pump rates in the approximate range of 1–1000 microliters per second are potentially useful, more preferably 5–300 microliters per second, even more preferably 10–100 microliters per second. The coating flow rate to the nozzles is most preferably kept at a constant or nearly constant rate during the spraying operation. This has been found advantageous in providing stable operation.

The methods according to this invention also preferably use carrier gas flows which provide significant coating particle velocities. Increased coating particle velocities aid in impacting the particles against the surface of the wafer or other article being coated to provide better conformal coating application.

It may be preferable in some coating applications to utilize carrier gases which participate in or are specifically inert to the chemistry involved. For example, in the application of polyimide coatings it has been found desirable to utilize nitrogen instead of air. The processing chamber is preferably purged with nitrogen and the carrier gas used is also nitrogen. This reduces chemical effects upon the polyimide which are associated with moisture which is present in air supplies even when treated to reduce or remove moisture. In other situations the carrier gases used may enhance or retard coating setup rates and may be desirable with the particular coating being applied.

In some forms of the invention, novel methods include heating the carrier gas which is used in the spraying. This heating is effected in the preferred embodiment using heater 1221. The spraying also preferably includes regulating the carrier gas pressure. Pressures in the range of approximately 0–25 pounds per square inch gauge are believed appropriate, more preferably carrier gas pressures are regulated to be in the approximate range of 5–15 pounds per square inch gauge. The volume of carrier gas can vary from none to relatively high flow rates depending upon the coating being applied. The figures given above are for nozzles having an approximate orifice diameter in the range 1/8–1/16 inch.

The spraying also preferably includes generating a sonic vibratory resonance within the spray block to cause atomizing to be performed to achieve the approximate coating particle sized indicated above. The generating of vibratory resonance is preferably effected by passing the carrier gas through a suitable nozzle structure, such as the ultrasonic nozzle explained above.

Spraying according to the novel methods of this invention also advantageously includes controlling the viscosity of the coating liquid being applied. This controlling is advantageously effected by heating the coating to achieve greater stability with regard to viscosity fluctuations. The heating is best done by heating the nozzle block 1120 using the heaters 1127. The controlled heating of the carrier gas is also a relevant parameter in achieving control of the coating viscosity.

The preferred methods may also advantageously include providing a purge of gas along the back side of wafer 1050. This purging of the atmosphere along the wafer back side helps to prevent coating overspray from settling and adhering to the back side of the wafer. Such a purging function is accomplished with a gas purge port (not shown) which supplies purge gas to the back side of support piece 1339 and an aperture which is formed through support piece 1339 at a desired location.

The methods of this invention further include removing or unloading the coated wafer or other semiconductor article from the processing chamber. This is advantageously accomplished by opening the processing vessel. Opening the processing vessel includes lifting or otherwise removing the processing head 1049 from the processing bowl 1051. It further preferably includes pivoting the processing head to turn the wafer into a coated-side-up or face-up position.

Unloading also preferably includes engaging the wafer with the wafer engagement tool in the same or very similar manner described above with regard to transferring the wafer from the input station.

The coated wafer is then preferably transferred to a thermal treatment station, such as thermal treatment station 1046. This is done using the wafer transfer 1041. The process of transferring the wafer also includes loading or installing the wafer into a thermal treatment receiver, such as either of the heating treatment chambers 1221 or 1222. During loading of the thermal treatment chambers, the wafer contact members 1246 are extended. Thus the extending step should be performed before installing the wafer into the thermal treatment chamber. The wafer transfer functions by gently lowering the wafer onto the contact members. Thereafter the engagement tool functions by retracting from the thermal treatment chamber. The thermal treatment unit then functions by lowering the lifting mechanism 1240. The lowering or moving into proximity can result in a desired proximity spacing, such as 0.5–1 millimeter. In other coating applications it may be preferred to perform the positioning by contacting the wafer against the platen 1226 by fully retracting the contact members 1246. The wafer is then subjected to vacuum by applying vacuum pressures via channels 1228 which causes a forcing of the wafer against the platen.

The methods further preferably include transferring heat relative to the wafer. In the most preferred methods the heat transferring includes both heating and cooling. The heating step is preferably accomplished first. The heating is effected by activating the heater 1225 to heat the platen and allow heat to flow from the platen to the wafer. The heating is preferably performed for sufficient time to render the coating mechanically stable upon the surface of the wafer. The time needed to accomplish this will vary depending on the coating and wafer being coated. In many situations, the heat treatment time will be in the range of 1–10 minutes, more preferably 1–3 minutes. Thereafter the vacuum pressure is reduced thereby releasing the force applied by the vacuum. The wafer is then readied for removal by lifting or otherwise extending the wafer using the wafer lifting mechanism.

After the heating step, the wafer is then most preferably transferred from a heating chamber 1221 or 1222, to the cooling chamber 1223. The loading process is the same or similar to that described above in connection with the heating chamber. The cooling treatment process is also very similar to that described above for the heating process. The cooling treatment in general requires about one-half the time required for the heat treatment curing of the coating. Thus the need for only one cooling unit for two heating units.

After the coated wafer has been coated, and then heated, cooled or both, it is again transferred by wafer transfer 1041. The wafer transfer moves the wafer to the output station 1044. At the output station, the wafer transfer performs by inserting the wafer into the output station carrier 1058 in an available space therein. When all wafers of a batch have been completed, the output wafers are removed by opening the access door and manually removing the carrier.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An apparatus for processing a single wafer, such as a semiconductor wafer, a magnetic disk, or an optical disk, comprising:

a framework;

a processing bowl mounted to the framework, the processing bowl comprising an inner portion having an interior adapted to receive a pool of a processing chemical, an outer portion, and a fluid-receiving space between the inner portion and the outer portion;

a chemical supply adapted to supply the processing chemical to the processing bowl;

a processor head mounted for movement between at least one loading position and at least one processing position, the processor head in its loading position being adapted to position a wafer outside the interior of the inner portion, the processor head carrying a rotatable wafer support adapted to support a wafer within the interior of the inner portion when the processor head is in the processing position, wherein a portion of the head extends radially outward over and along an upper edge of the bowl;
a second processing chamber; and
a wafer transfer adapted to move wafers to and from the processing bowl, and to and from the second processing chamber.

2. An apparatus according to claim 1 wherein the wafer support extends downwardly to a height below an upper edge of the processing bowl when the processor head is in the processing position.

3. An apparatus according to claim 1 wherein the wafer support is positioned to support wafers at a height below an upper edge of the processing bowl.

4. An apparatus according to claim 1 further comprising a drain in fluid communication with the fluid-receiving space of the processing bowl.

5. An apparatus according to claim 1 wherein the processor head is adapted to move vertically downwardly toward the pool of the processing chemical in moving from its loading position to its processing position.

6. An apparatus according to claim 5 wherein the processor head is adapted to move vertically upwardly away from the pool of the processing chemical in moving from its processing position to its loading position.

7. An apparatus according to claim 1 wherein the wafer support is configured to rotate at a first rotational speed of 50–250 rpm and a second rotational speed is selected to spin dry a surface of the wafer.

8. An apparatus according to claim 7 wherein the second rotational speed is at least 1000 rpm.

9. An apparatus according to claim 1 wherein the processor head comprises an annular gas-receiving recess having a height above a height of a front surface of any wafer carried by the wafer support when the processor head is in the processing position.

10. An apparatus according to claim 1 wherein the wafer support comprises a wafer support plate having a downwardly directed front face and an upwardly directed back face.

11. An apparatus according to claim 10 wherein the wafer support further comprises a plurality of fingers adapted to engage a peripheral edge of a wafer.

12. The wafer processor of claim 11 wherein the fingers peripherally support the wafer.

13. An apparatus according to claim 1 wherein the processing bowl is adapted to retain an acidic processing chemical.

14. An apparatus according to claim 1 wherein at least a portion of the processing bowl is formed of an acid-resistant plastic.

15. An apparatus according to claim 14 wherein the inner portion of the processing bowl is formed of the acid-resistant plastic.

16. An apparatus according to claim 15 further comprising a drain in fluid communication with the fluid-receiving space.

17. An apparatus according to claim 1 wherein the second processing chamber is adapted to heat a wafer placed therein.

18. An apparatus according to claim 17 wherein the second processing chamber comprises a heat source and a platform positioned to support wafers within the second processing chamber.

19. An apparatus according to claim 18 wherein a height of the platform within the second processing chamber is adjustable.

20. An apparatus according to claim 19 wherein the platform supports wafer support stands positioned to supportively contact a back side of a wafer.

21. An apparatus according to claim 20 wherein the wafer support stands are positioned within a wafer protection vessel which is supported upon the platform.

22. An apparatus for processing a single wafer, such as a semiconductor wafer, a magnetic disk, or an optical disk, comprising:
a framework;
a processing bowl mounted to the framework, the processing bowl comprising an upper edge, an inner portion adapted to receive a pool of a processing chemical, an outer portion, and a fluid-receiving space between the inner portion and the outer portion;
a chemical supply adapted to supply the processing chemical to the processing bowl;
a processor head mounted for movement between at least one loading position and at least one processing position, the processor head in its loading position being adapted to position wafers above the processing bowl, the processor head carrying a rotatable wafer support adapted to position a wafer below the upper edge of the processing bowl when the processor head is in the processing position, wherein the wafer support is configured to overlay a single wafer and support a periphery of the single wafer with a process side of the wafer facing downward;
a second processing chamber; and
a wafer transfer adapted to move wafers to and from the processing bowl, and to and from the second processing chamber.

23. An apparatus according to claim 22 further comprising a drain in fluid communication with the fluid-receiving space of the processing bowl.

24. An apparatus according to claim 22 wherein the processing bowl includes a fluid line in fluid communication with the fluid-receiving space of the processing bowl.

25. An apparatus according to claim 22 wherein the processor head is adapted to move vertically downwardly toward the pool of the processing chemical in moving from its loading position to its processing position.

26. An apparatus according to claim 25 wherein the processor head is adapted to move vertically upwardly away from the pool of the processing chemical in moving from its processing position to its loading position.

27. An apparatus according to claim 22 wherein the processor head carries a motor operatively connected to the wafer support and adapted to rotate the wafer support.

28. An apparatus according to claim 27 wherein the motor is adapted to rotate the wafer support at a first rotational speed during processing of a wafer by the processing chemical and at a higher second rotational speed thereafter.

29. An apparatus according to claim 28 wherein the first rotational speed is 50–250 rpm and the second rotational speed is selected to spin dry a surface of the wafer.

30. An apparatus according to claim 28 wherein the first rotational speed is 50–250 rpm and the second rotational speed is at least 1000 rpm.

31. An apparatus according to claim 22 wherein the processor head comprises an annular gas-receiving recess having a height above a height of a front surface of any wafer carried by the wafer support when the processor head is in the processing position.

32. An apparatus according to claim 22 wherein the wafer support comprises a wafer support plate having a downwardly directed front face and an upwardly directed back face.

33. An apparatus according to claim 22 wherein the wafer support further comprises a plurality of fingers adapted to engage a peripheral edge of a wafer.

34. The wafer processor of claim 33 wherein the fingers peripherally support the wafer.

35. An apparatus according to claim 22 wherein the processing bowl is adapted to retain an acidic processing chemical.

36. An apparatus according to claim 22 wherein at least a portion of the processing bowl is formed of an acid-resistant plastic.

37. An apparatus according to claim 36 wherein the inner portion of the processing bowl is formed of the acid-resistant plastic.

38. An apparatus according to claim 37 further comprising a drain in fluid communication with the fluid-receiving space.

39. An apparatus according to claim 22 wherein the second processing chamber is adapted to heat a wafer placed therein.

40. An apparatus according to claim 39 wherein the second processing chamber comprises a heat source and a platform positioned to support wafers within the second processing chamber.

41. An apparatus according to claim 40 wherein a height of the platform within the second processing chamber is adjustable.

42. An apparatus according to claim 41 wherein the platform supports wafer support stands positioned to supportively contact a back side of a wafer.

43. An apparatus according to claim 42 wherein the wafer support stands are positioned within a wafer protection vessel which is supported upon the platform.

44. An apparatus according to claim 40 wherein the heat source comprises an infrared lamp.

45. An apparatus for processing a single wafer, such as a semiconductor wafer, a magnetic disk, or an optical disk, comprising:
a framework;
a processing bowl mounted to the framework and including an upper edge;
a chemical supply adapted to supply a processing chemical to the processing bowl;
a processor head mounted for movement between at least one loading position and at least one processing position, the processor head in its loading position being adapted to position a wafer higher than the upper edge of the processing bowl for loading or unloading a wafer from the processor head, the processor head carrying a rotatable wafer support and a motor, the wafer support being adapted to support a wafer below the upper edge of the processing bowl when the processor head is in its processing position, the motor being positioned above the wafer support and adapted to rotate the wafer support and any wafer held therein, wherein the wafer support is configured to overlay a single wafer and support a periphery of the single wafer with a process side of the wafer facing downward;
a second processing chamber; and
a wafer transfer adapted to move wafers to and from the processing bowl, and to and from the second processing chamber.

46. An apparatus according to claim 45 wherein the processing bowl is adapted to receive a pool of the processing chemical.

47. An apparatus according to claim 46 wherein the wafer support extends downwardly into an interior of the processing bowl when the processor head is in the processing position.

48. An apparatus according to claim 46 wherein the processor head is adapted to move vertically downwardly toward the pool of the processing chemical in moving from its loading position to its processing position.

49. An apparatus according to claim 48 wherein the processor head is adapted to move vertically upwardly away from the pool of the processing chemical in moving from its processing position to its loading position.

50. An apparatus according to claim 45 wherein the motor is adapted to rotate the wafer support at a first rotational speed during processing of a wafer by the processing chemical and at a higher second rotational speed thereafter.

51. An apparatus according to claim 45 wherein the processor head comprises an annular gas-receiving recess having a height above a height of a front surface of any wafer carried by the wafer support when the processor head is in the processing position.

52. An apparatus according to claim 45 wherein the processing bowl comprises an outer portion and an inner portion, the inner portion being adapted to receive a pool of the processing chemical therein.

53. An apparatus according to claim 52 further comprising a drain in fluid communication with a space between the inner and outer portions.

54. An apparatus for processing wafers, such as semiconductor wafers, magnetic disks, and optical disks, comprising:
a framework;
a processing bowl mounted to the framework;
a chemical supply adapted to supply a processing chemical to the processing bowl;
a processor head mounted for movement between at least one loading position and at least one processing position, the processor head in its loading position being adapted to load or unload a wafer from the processor head, the processor head comprising a rotatable wafer support and an annular gas-receiving recess, the wafer support being adapted to position a wafer for processing with the processing chemical when the processor head is in the processing position, the gas-receiving recess extending higher than a front surface of any wafer carried by the wafer support when the processor head is in the processing positions, wherein the wafer support is configured to overlay a single wafer and support a periphery of the single wafer with a process side of the wafer facing downward;
a second processing chamber; and
a wafer transfer adapted to move wafers to and from the processing bowl, and to and from the second processing chamber.

55. An apparatus according to claim 54 further comprising a motor carried by the processor head, the motor being operatively connected to the wafer support and adapted to rotate the wafer support.

56. An apparatus according to claim 55 wherein the motor is adapted to rotate the wafer support at a first rotational speed during processing of a wafer by the processing chemical and at a higher second rotational speed thereafter.

57. An apparatus according to claim 54 wherein the wafer support extends downwardly to a height below an upper edge of the processing bowl when the processor head is in its processing position.

58. An apparatus according to claim 54 wherein the wafer support is positioned to support wafers at a height below an upper edge of the processing bowl.

59. An apparatus according to claim 54 wherein the processing bowl includes a drain and a fluid line, the drain being adapted to direct overflow of the processing chemical into the fluid line.

60. An apparatus according to claim 59 wherein the processing bowl comprises an inner portion and an outer portion, the drain being in fluid communication with a space between the inner and outer portions.

61. An apparatus according to claim 59 wherein the fluid line directs fluid from the drain to a disposal line.

62. An apparatus according to claim 54 wherein the processor head is adapted to move vertically downwardly toward the processing bowl in moving from its loading position to its processing position.

63. An apparatus according to claim 62 wherein the processor head is adapted to move vertically upwardly away from the processing bowl in moving from its processing position to its loading position.

64. An apparatus according to claim 54 wherein at least a portion of the processing bowl is formed of an acid-resistant plastic.

65. An apparatus according to claim 64 wherein the processing bowl comprises an inner portion and an outer portion, the inner portion being formed of the acid-resistant plastic.

66. An apparatus according to claim 65 wherein the inner portion is adapted to receive a pool of the processing chemical therein.

67. An apparatus according to claim 65 further comprising a drain in fluid communication with a space between the inner portion and the outer portion.

68. An apparatus according to claim 54 wherein the second processing chamber is adapted to heat wafers placed therein.

69. An apparatus according to claim 68 wherein the second processing chamber comprises a heat source and a platform positioned to support wafers within the second processing chamber.

70. An apparatus according to claim 69 wherein a height of the platform within the second processing chamber is adjustable.

71. An apparatus according to claim 70 wherein the platform supports wafer support stands positioned to supportively contact a back side of a wafer.

72. An apparatus according to claim 71 wherein the wafer support stands are positioned within a wafer protection vessel which is supported upon the platform.

73. An apparatus for processing wafers, such as semiconductor wafers, magnetic disks, and optical disks, comprising:
a framework;
a processing bowl mounted to the framework, the processing bowl comprising an upper edge, an inner portion adapted to receive a pool of a processing chemical, an outer portion, a fluid-receiving space between the inner portion and the outer portion, and a drain in fluid communication with the fluid-receiving space;
a processor head comprising a wafer support adapted to support a wafer about the periphery of the wafer, the processor head extending outwardly of the periphery of any wafer held in the wafer support, the processor head being moveable between at least one loading position and at least one processing position, the processor head in its loading position being adapted to position the wafer support higher than the upper edge of the processing bowl for loading or unloading a wafer, the wafer support being adapted to position a wafer below the upper edge of the processing bowl when the processor head is in its processing position, wherein a portion of the processor head extends radially outward over and along the upper edge of the bowl; and
a motor carried by the processor head and operatively coupled to the wafer support to rotate the wafer support.

74. An apparatus according to claim 73 wherein the processing bowl is adapted to retain an acidic processing chemical.

75. An apparatus according to claim 74 wherein the inner portion of the processing bowl is formed of an acid-resistant plastic.

76. An apparatus according to claim 73 wherein the wafer support extends downwardly to a height below an upper edge of the processing bowl when the processor head is in the processing position.

77. An apparatus according to claim 73 wherein the wafer support is positioned to support wafers at a height below an upper edge of the processing bowl.

78. An apparatus according to claim 73 further comprising a fluid line adapted to direct fluid from the drain to a disposal line.

79. An apparatus according to claim 73 wherein the processor head is adapted to move vertically downwardly toward the pool of the processing chemical in moving from its loading position to its processing position.

80. An apparatus according to claim 79 wherein the processor head is adapted to move vertically upwardly away from the pool of the processing chemical in moving from its processing position to its loading position.

81. An apparatus according to claim 73 wherein the second processing chamber is adapted to heat a wafer placed therein.

82. An apparatus for processing a single wafer, such as a semiconductor wafer, a magnetic disk, or an optical disk, comprising:
a framework;
a processing bowl mounted to the framework, the processing bowl comprising an inner portion adapted to receive a pool of a processing chemical, an outer portion, and a fluid-receiving space between the inner portion and the outer portion;
a chemical supply adapted to supply the processing chemical to the processing bowl;
a processor head mounted for movement between at least one loading position and at least one processing position, the processor head in its loading position being adapted to position wafers above the processing bowl, the processor head carrying a rotatable wafer support adapted to position a wafer below an upper inlet of the fluid-receiving space when the processor head is in the processing position, wherein the wafer support is configured to overlay a single wafer and support a periphery of the single wafer with a process side of the wafer facing downward;
a second processing chamber; and
a wafer transfer adapted to move wafers to and from the processing bowl, and to and from the second processing chamber.

83. An apparatus according to claim 82 further comprising a drain in fluid communication with the fluid-receiving space of the processing bowl.

84. An apparatus according to claim 82 wherein the processing bowl includes a fluid line in fluid communication with the fluid-receiving space of the processing bowl.

85. An apparatus according to claim 84 further comprising a fluid line adapted to direct fluid from the drain to a disposal line.

86. An apparatus according to claim 82 wherein the processor head is adapted to move vertically downwardly toward the pool of the processing chemical in moving from its loading position to its processing position.

87. An apparatus according to claim 86 wherein the processor head is adapted to move vertically upwardly away from the pool of the processing chemical in moving from its processing position to its loading position.

88. An apparatus according to claim 82 wherein the processor head carries a motor operatively connected to the wafer support and adapted to rotate the wafer support.

89. An apparatus according to claim 88 wherein the motor is adapted to rotate the wafer support at a first rotational speed during processing of a wafer by the processing chemical and at a higher second rotational speed thereafter.

90. An apparatus according to claim 82 wherein the processor head comprises an annular gas-receiving recess having a height above a height of a front surface of any wafer carried by the wafer support when the processor head is in the processing position.

91. An apparatus according to claim 82 wherein the wafer support comprises a wafer support plate having a downwardly directed front face and an upwardly directed back face.

92. An apparatus according to claim 91 wherein the wafer support further comprises a plurality of fingers adapted to engage a peripheral edge of a wafer.

93. The wafer processor of claim 92 wherein the fingers peripherally support the wafer.

94. An apparatus according to claim 82 wherein the processing bowl is adapted to retain an acidic processing chemical.

95. An apparatus according to claim 82 wherein at least a portion of the processing bowl is formed of an acid-resistant plastic.

96. An apparatus according to claim 95 wherein the inner portion of the processing bowl is formed of the acid-resistant plastic.

97. An apparatus according to claim 96 further comprising a drain in fluid communication with the fluid-receiving space.

98. An apparatus according to claim 82 wherein the second processing chamber is adapted to heat a wafer placed therein.

99. An apparatus according to claim 98 wherein the second processing chamber comprises a heat source and a platform positioned to support wafers within the second processing chamber.

100. An apparatus according to claim 99 wherein a height of the platform within the second processing chamber is adjustable.

101. An apparatus according to claim 100 wherein the platform supports wafer support stands positioned to supportively contact a back side of a wafer.

102. An apparatus according to claim 101 wherein the wafer support stands are positioned within a wafer protection vessel which is supported upon the platform.

103. An apparatus according to claim 99 wherein the heat source comprises an infrared lamp.

104. A method of treating a wafer, comprising:
positioning a processor head in a loading position, the processor head comprising a wafer support;
peripherally supporting a single wafer with the wafer support;
lowering the processor head into a processing position wherein the wafer is positioned in an interior of a processing bowl, the processing bowl comprising an inner portion, an outer portion, and a fluid-receiving space between the inner portion and the outer portion, and wherein the wafer support is configured to overlay a single wafer and support a periphery of the single wafer with a process side of the wafer facing downward;
supplying a processing chemical from a chemical supply to the interior of the processing bowl;
lifting the processor head to position the wafer outside the interior of the processing bowl;
engaging the wafer with a wafer transfer and transferring the wafer from the processing head to a second processing chamber.

105. An apparatus for treating a wafer, comprising:
a processor head comprising a wafer support;
a processing bowl comprising an inner portion, an outer portion, and a fluid-receiving space between the inner portion and the outer portion;
means for positioning a processor head in a loading position;
means for peripherally supporting a single wafer with the wafer support;
means for lowering the processor head into a processing position wherein the wafer is positioned in an interior of a processing bowl and a portion of the processing head extends radially outward over and along an upper edge of the processing bowl;
means for supplying a processing chemical from a chemical supply to the interior of the processing bowl;
means for lifting the processor head to position the wafer outside the interior of the processing bowl;
means for engaging the wafer with a wafer transfer; and
means for transferring the wafer from the processing head to a second processing chamber.

106. The wafer processor of claim 45, further comprising:
a spray processing vessel defined at least in part by the processing bowl;
a spray-head mounted within the spray processing vessel for directing a spray of coating upon a single wafer being held face down by the wafer holder, the spray-head being moveable relative to the spray processing vessel and relative to the wafer holder to allow the spray-head to be directed to different areas of the wafer;
a gas conduit for delivering a carrier gas to the spray-head;
a coating conduit for delivering a coating material to the spray-head;
a coating metering pump for delivering a precise quantity of the coating material to the spray head; and
a coating viscosity control for controlling viscosity of the coating material applied by the spray-head.

107. The wafer processor of claim 45 wherein the processor head further comprises a wafer plate that overlays the wafer and a circular shroud over the motor.

108. The wafer processor of claim 45, further comprising:
gripping fingers arranged to engage the periphery of the wafer; and
actuator means to pivotally move the gripping fingers to engage/disengage the periphery of the wafer.

109. The wafer processor of claim 108 further comprising flexible support diaphragms sealingly engaged with corresponding gripping fingers.

* * * * *

UNITED STATES PATENT AND TRADEMARK OFFICE
CERTIFICATE OF CORRECTION

| | | |
|---|---|---|
| PATENT NO. | : 7,138,016 B2 | Page 1 of 1 |
| APPLICATION NO. | : 09/893315 | |
| DATED | : November 21, 2006 | |
| INVENTOR(S) | : Reardon et al. | |

It is certified that error appears in the above-identified patent and that said Letters Patent is hereby corrected as shown below:

Column 23
Line 8, "seating" should be --sealing--;

Signed and Sealed this

Twentieth Day of March, 2007

JON W. DUDAS
*Director of the United States Patent and Trademark Office*